United States Patent
Kimura et al.

(10) Patent No.: US 8,803,781 B2
(45) Date of Patent: Aug. 12, 2014

(54) SEMICONDUCTOR DEVICE AND DISPLAY DEVICE

(75) Inventors: Hajime Kimura, Kanagawa (JP); Atsushi Umezaki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1092 days.

(21) Appl. No.: 12/055,055

(22) Filed: Mar. 25, 2008

(65) Prior Publication Data

US 2008/0284710 A1 Nov. 20, 2008

(30) Foreign Application Priority Data

May 18, 2007 (JP) .................. 2007-133517

(51) Int. Cl.
*G09G 3/36* (2006.01)
*H01L 27/12* (2006.01)
*G02F 1/1345* (2006.01)
*H01L 29/66* (2006.01)

(52) U.S. Cl.
CPC .... *G02F 1/13454* (2013.01); *G09G 2300/0408* (2013.01); *H01L 27/12* (2013.01); *H01L 29/66772* (2013.01); *H01L 27/1214* (2013.01); *G09G 2330/021* (2013.01); *G09G 3/3648* (2013.01)
USPC ............................ 345/100; 345/98; 345/92

(58) Field of Classification Search
CPC ..... G09G 3/36; G09G 3/3644; G09G 3/3674; G09G 3/3685; G09G 3/3696; G09G 2310/0243; G09G 2310/0267; G09G 2310/0281; G09G 2310/0286; G09G 3/038; G09G 2330/00; G09G 5/00; G11C 19/00
USPC ...................... 345/76–77, 80, 87, 92, 100, 98
See application file for complete search history.

(56) References Cited

U.S. PATENT DOCUMENTS

| | | | |
|---|---|---|---|
| 5,206,749 A | 4/1993 | Zavracky et al. |
| 5,258,325 A | 11/1993 | Spitzer et al. |
| 5,317,236 A | 5/1994 | Zavracky et al. |
| 5,374,564 A | 12/1994 | Bruel |
| 5,530,266 A | 6/1996 | Yonehara et al. |
| 5,642,129 A | 6/1997 | Zavracky et al. |
| 5,654,811 A | 8/1997 | Spitzer et al. |
| 5,705,424 A | 1/1998 | Zavracky et al. |
| 5,781,164 A | 7/1998 | Jacobsen et al. |
| 5,827,755 A | 10/1998 | Yonehara et al. |
| 6,127,702 A | 10/2000 | Yamazaki et al. |

(Continued)

FOREIGN PATENT DOCUMENTS

| | | | |
|---|---|---|---|
| EP | 0530972 A2 | 3/1993 |
| EP | 1 020 839 A2 | 7/2000 |

(Continued)

*Primary Examiner* — Kenneth Bukowski
(74) *Attorney, Agent, or Firm* — Fish & Richardson P.C.

(57) ABSTRACT

A single-crystal semiconductor layer is separated from a single-crystal semiconductor substrate and is fixed to an insulating substrate to form a TFT over the insulating substrate. Then, a driver circuit is formed using the TFT. The TFT has excellent current characteristics because an active layer is almost in a single-crystal state. Accordingly, a small thin display device with low power consumption can be manufactured. Further, a controller and a shift register which is included in a source driver are operated at the same power supply voltage. Thus, power consumption can be reduced.

24 Claims, 45 Drawing Sheets

(56) References Cited

U.S. PATENT DOCUMENTS

| | | | |
|---|---|---|---|
| 6,140,667 A * | 10/2000 | Yamazaki et al. | 257/59 |
| 6,271,101 B1 | 8/2001 | Fukunaga | |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,392,628 B1 | 5/2002 | Yamazaki et al. | |
| 6,602,761 B2 | 8/2003 | Fukunaga | |
| 6,686,623 B2 | 2/2004 | Yamazaki | |
| 6,714,183 B2 | 3/2004 | Yamazaki et al. | |
| 6,765,552 B2 | 7/2004 | Yamazaki et al. | |
| 6,777,716 B1 | 8/2004 | Yamazaki et al. | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 6,879,313 B1 * | 4/2005 | Kubota et al. | 345/100 |
| 7,038,283 B2 | 5/2006 | Yanai et al. | |
| 7,119,365 B2 | 10/2006 | Takafuji et al. | |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 7,399,662 B2 | 7/2008 | Yanai et al. | |
| 7,619,250 B2 | 11/2009 | Takafuji et al. | |
| 7,863,611 B2 | 1/2011 | Abe | |
| 7,884,367 B2 | 2/2011 | Takafuji et al. | |
| 7,928,938 B2 | 4/2011 | Osame et al. | |
| 7,982,215 B2 | 7/2011 | Inoue | |
| 8,023,042 B2 | 9/2011 | Yamazaki et al. | |
| 8,030,195 B2 | 10/2011 | Inoue | |
| 8,203,146 B2 | 6/2012 | Abe | |
| 2002/0036636 A1 | 3/2002 | Yanagi et al. | |
| 2002/0054006 A1 * | 5/2002 | Tsuyuki et al. | 345/87 |
| 2003/0092213 A1 * | 5/2003 | Yamazaki et al. | 438/48 |
| 2004/0004595 A1 * | 1/2004 | Isami et al. | 345/89 |
| 2004/0080500 A1 | 4/2004 | Koyama | |
| 2004/0104424 A1 | 6/2004 | Yamazaki | |
| 2004/0108998 A1 * | 6/2004 | Imamura | 345/204 |
| 2004/0206956 A1 | 10/2004 | Yanai et al. | |
| 2005/0009252 A1 | 1/2005 | Yamazaki et al. | |
| 2005/0206603 A1 * | 9/2005 | Kawachi et al. | 345/98 |
| 2006/0066800 A1 * | 3/2006 | Furukoshi | 349/151 |
| 2007/0108510 A1 | 5/2007 | Fukunaga | |
| 2007/0152934 A1 * | 7/2007 | Maeda | 345/92 |
| 2007/0173000 A1 | 7/2007 | Yamazaki | |
| 2007/0184632 A1 | 8/2007 | Yamazaki et al. | |
| 2007/0291022 A1 | 12/2007 | Yamazaki et al. | |
| 2011/0187762 A1 | 8/2011 | Osame et al. | |
| 2012/0001244 A1 | 1/2012 | Yamazaki et al. | |

FOREIGN PATENT DOCUMENTS

| | | |
|---|---|---|
| EP | 1933293 A1 | 6/2008 |
| JP | 05273591 A | 10/1993 |
| JP | 2000-259111 | 9/2000 |
| JP | 2000-299469 A | 10/2000 |
| JP | 2003-017703 A | 1/2003 |
| JP | 2003045892 A | 2/2003 |
| JP | 2003282885 A | 10/2003 |
| JP | 2006-165532 A | 6/2006 |
| JP | 2006-323370 A | 11/2006 |
| WO | WO2007/040194 A1 | 4/2007 |

* cited by examiner semiconductor layer
gate layer
wiring layer
transparent electrode layer

SEMICONDUCTOR DEVICE AND DISPLAY DEVICE

BACKGROUND OF THE INVENTION

1. Field of the Invention

The present invention relates to an object, a method, or a method for producing an object. In particular, the present invention relates to a display device or a semiconductor device. Specifically, the present invention relates to a display device in which a single-crystal semiconductor is fixed to an insulating substrate.

2. Description of the Related Art

In recent years, a display device in which not only a pixel but also a driver circuit is formed over a glass substrate has been developed. As a pixel, a liquid crystal element, an organic EL element, or the like is used. At this time, a circuit is formed over a glass substrate by using a thin film transistor (TFT) formed of low temperature polysilicon. However, the TFT has worse current characteristics and higher threshold voltage than those of a transistor formed of a single crystal. Therefore, operations are performed with power supply voltage or signal amplitude increased. In order to increase the amplitude, a level shifter circuit or the like is used (for example, see Reference 1: Japanese Published Patent Application No. 2000-259111).

SUMMARY OF THE INVENTION

However, there has been a problem in that a circuit formed using a TFT of low temperature polysilicon has extremely high power consumption because power supply voltage is high or signal amplitude is large. In addition, in order to operate the circuit formed using the TFT of low temperature polysilicon, it has been necessary to increase the power supply voltage. Therefore, it has been necessary to supply power supply voltage dedicated for the circuit formed using the TFT of low temperature polysilicon Since the size of a module of a power supply circuit which supplies the dedicated power supply voltage is large, the power supply circuit has impeded reduction in size and weight of a display device. Further, the power supply circuit has had low power use efficiency. Therefore, wasted power has been increased, so that power consumption has been increased.

In view of the foregoing problems, it is an object of the present invention to provide a semiconductor device and a display device with low power consumption. It is another object of the present invention to provide a semiconductor device and a display device which are small. It is another object of the present invention to provide a semiconductor device and a display device which are thin.

Thus, a single-crystal semiconductor layer is extracted from a single-crystal semiconductor substrate and is fixed to an insulating substrate to form a TFT over the insulating substrate. Alternatively, a single-crystal semiconductor substrate is attached to an insulating substrate and a single-crystal semiconductor layer which is part of the single-crystal semiconductor substrate is fixed to the insulating substrate by separating the single-crystal semiconductor substrate to form a TFT over the insulating substrate Then, a driver circuit is formed using the TFT. The TFT has excellent current characteristics because an active layer is almost in a single-crystal state. Accordingly, a small thin display device with low power consumption can be manufactured.

As a single-crystal semiconductor, a single-crystal silicon is typically employed. Alternatively, a single-crystal semiconductor layer formed of silicon, germanium, or a compound semiconductor such as gallium arsenide or indium phosphide which can be separated from a single-crystal semiconductor substrate by a separation method of hydrogen ion implantation can be used. In addition, as an insulating substrate, a glass substrate is typically used. Alternatively, any of various insulating substrates or substrates having an insulating surface, such as plastic substrates and stainless steel substrates, can be used.

In accordance with one aspect of the present invention, a controller and a shift register including a thin film transistor are included. The thin film transistor includes a single-crystal semiconductor layer fixed to an insulating substrate by attaching a single-crystal semiconductor substrate to the insulating substrate and then separating the single-crystal semiconductor substrate. Power supply voltage is supplied to the controller and the shift register. The level of the power supply voltage is equal to or lower than 3 V.

In accordance with another aspect, of the present invention, a controller and a shift register including a thin film transistor are included. The trim film transistor includes a single-crystal semiconductor layer fixed to an insulating substrate by attaching a single-crystal semiconductor substrate to the insulating substrate and then separating the single-crystal semiconductor substrate. Power supply voltage is supplied to the controller and the shift register. A signal is output from the controller and is input to the shift register.

In accordance with another aspect of the present invention, a source driver and a controller are included. The source driver includes a level shifter and a shift register including a thin film transistor. The thin film transistor includes a single-crystal semiconductor layer fixed to an insulating substrate by attaching a single-crystal semiconductor substrate to the insulating substrate and then separating the single-crystal semiconductor substrate. The level shifter includes an active load. Power supply voltage is supplied to the controller and the shift register.

In accordance with another aspect of the present invention, the insulating substrate is a glass substrate in any of the above-described structures.

In accordance with another aspect of the present invention, the single-crystal semiconductor substrate is a silicon substrate and the single-crystal semiconductor layer is a silicon layer in any of the above-described structures.

In accordance with another aspect of the present invention, a display element is included in any of the above-described structures.

In accordance with another aspect of the present invention, a liquid crystal element is included in any of the above-described structures.

In accordance with another aspect of the present invention, a light-emitting element is included in any of the above-described structures.

In accordance with another aspect of the present invention, an operation switch is included in any of the above-described structures.

Note that various types of switches can be used as a switch. An electrical switch, a mechanical switch, and the like are given as examples. That is, any element can be used as long as it can control a current flow, without limiting to a certain element. For example, a transistor (e.g., a bipolar transistor or a MOS transistor), a diode (e.g., a PN diode, a PIN diode, a Schottky diode, an MIM (metal insulator metal) diode, an MIS (metal insulator semiconductor) diode, or a diode-connected transistor), a thyristor, or the like can be used as a switch. Alternatively, a logic circuit combining such elements can be used as a switch.

An example of a mechanical switch is a switch formed using MEMS (micro electro mechanical system) technology, such as a digital micromirror device (DMD) Such a switch includes an electrode which can be moved mechanically, and operates by controlling connection and non-connection based on movement of the electrode.

In the case of using a transistor as a switch, polarity (a conductivity type) of the transistor is not particularly limited because it operates just as a switch. However, a transistor of polarity with smaller off-current is preferably used when off-current is to be suppressed. Examples of a transistor with smaller off-current are a transistor provided with an LDD region, a transistor with a multi-gate structure, and the like. In addition, it is preferable that an N-channel transistor be used when a potential of a source terminal is closer to a potential of a low-potential-side power supply (e.g., $V_{ss}$, GND, or 0 V), while a P-channel transistor be used when the potential of the source terminal is closer to a potential of a high-potential-side power supply (e.g., $V_{dd}$). This is because the absolute value of gate-source voltage can be increased when the potential of the source terminal is closer to a potential of a low-potential-side power supply in an N-channel transistor and when the potential of the source terminal is closer to a potential of a high-potential-side power supply in a P-channel transistor. This is also because the transistor does not often perform a source follower operation, so that reduction in output voltage does not often occur.

Note that a CMOS switch may be employed as a switch by using both N-channel and P-channel transistors. When a CMOS switch is employed, the switch can more precisely operate as a switch because current can flow when either the P-channel transistor or the N-channel transistor is turned on. For example, voltage can be appropriately output regardless of whether voltage of an input signal to the switch is high or low. In addition, since a voltage amplitude value of a signal for turning on or off the switch can be made small, power consumption can be reduced.

Note that when a transistor is used as a switch, the switch includes an input terminal (one of a source terminal and a drain terminal), an output terminal (the other of the source terminal and the drain terminal), and a terminal for controlling conduction (a gate terminal). On the other hand, when a diode is used as a switch, the switch does not have a terminal for controlling conduction in some cases. Therefore, when a diode is used as a switch, the number of wirings for controlling terminals can be further reduced compared to the case of using a transistor as a switch.

Note that when it is explicitly described that "A and B are connected", the case where A and B are electrically connected, the case where A and B are functionally connected, and the case where A and B are directly connected are included therein. Here, each of A and B corresponds to an object (e.g., a device, an element, a circuit, a wiring, an electrode, a terminal, a conductive film, or a layer). Accordingly, another element may be interposed between elements having a connection relation shown in drawings and texts, without limiting to a predetermined connection relation, for example, the connection relation shown in the drawings and the texts.

For example, in the case where A and B are electrically connected, one or more elements which enable electric connection between A and B (e.g., a switch, a transistor, a capacitor, an inductor, a resistor, and/or a diode) may be provided between A and B. In addition, in the case where A and B are functionally connected, one or more circuits which enable functional connection between A and B (e.g., a logic circuit such as an inverter, a NAND circuit, or a NOR circuit a signal converter circuit such as a DA converter circuit, an AD converter circuit, or a gamma correction circuit, a potential level converter circuit such as a power supply circuit (e.g., a dc-dc converter, a step-up dc-dc converter or a step-down dc-dc converter) or a level shifter circuit for changing a potential level of a signal, a voltage source, a current source, a switching circuit, or an amplifier circuit such as a circuit which can increase signal amplitude, the amount of current, or the like (e.g., an operational amplifier, a differential amplifier circuit, a source follower circuit, or a buffer circuit), a signal generating circuit, a memory circuit, and/or a control circuit) may be provided between A and B. Alternatively, in the case where A and B are directly connected, A and B may be connected without interposing another element or another circuit therebetween.

Note that when it is explicitly described that "A and B are directly connected", the case where A and B are directly connected (i.e., the case where A and B are connected without interposing another element or another circuit therebetween) is included therein.

Note that when it is explicitly described that "A and B are electrically connected", the case where A and B are electrically connected (i.e., the case where A and B are connected by interposing another element or another circuit therebetween), the case where A and B are functionally connected (i.e., the case where A and B are functionally connected by interposing another circuit therebetween), and the case where A and B are directly connected (i.e., the case where A and B are connected without interposing another element or another circuit therebetween) are included therein. That is, when it is explicitly described that "A and B are electrically connected", the description is the same as the case where it is explicitly only described that "A and B are connected".

Note that a display element, a display device which is a device having a display element, a light-emitting element, and a light-emitting device which is a device having a light-emitting element can use various modes and can include various elements. As a display element or a light-emitting element, an EL element (e.g., an EL element including organic and inorganic materials, an organic EL element, or an inorganic EL element), an electron emitter, a liquid crystal element, electronic ink, an electrophoresis element, a grating light valve (GLV), a plasma display panel (PDP), a digital micromirror device (DMD), a piezoelectric ceramic display, or a carbon nanotube can be used, for example. Such an element is an element, whose contrast, luminance, reflectivity, transmittivity, or the like is changed by an electromagnetic action. Note that display devices using EL elements include an EL display; display devices using electron emitters include a field emission display (FED), an SED-type flat panel display (SED: surface-conduction electron-emitter display), and the like, display devices using liquid crystal elements include a liquid crystal display (e.g., a transmissive liquid crystal display, a transflective liquid crystal display, a reflective liquid crystal display, a direct-view liquid crystal display, or a projection liquid crystal display); and display devices using electronic ink or electrophoresis elements include electronic paper.

Note that an EL element is an element having an anode, a cathode, and an EL layer interposed between the anode and the cathode. Note that as an EL layer, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer formed of an organic material, a layer formed of an inorganic material, a layer formed of an organic material and an inorganic material, a layer including a high-molecular material, a layer including a low molecular material, a layer including a low-molecular material and a high-molecular material, or the like can be used. Note that the present invention is not limited to this, and various EL elements can be used as an EL element.

Note that an election emitter is an element in which electrons are extracted by high electric field concentration on a pointed cathode. For example, as an electron emitter, a Spindt type, a carbon nanotube (CNT) type, a metal-insulator-metal (MIM) type in which a metal, an insulator, and a metal are stacked, a metal-insulator-semiconductor (MIS) type in which a metal, an insulator, and a semiconductor are stacked, a MOS type, a silicon type, a thin film diode type, a diamond type, a surface conduction emitter SCD type, a thin film type in which a metal, an insulator, a semiconductor and a metal are stacked, a HEED type, an EL type, a porous silicon type, a surface-conduction (SED) type, or the like can be used. However, the present invention is not limited to this, and various elements can be used as an electron emitter.

Note that a liquid crystal element is an element which controls transmission or non-transmission of light by optical modulation action of a liquid crystal and includes a pair of electrodes and a liquid crystal. Note that optical modulation action of a liquid crystal is controlled by an electric filed applied to the liquid crystal (including a horizontal electric field, a vertical electric field, and an oblique electric field). Note that the following can be used for a liquid crystal element: a nematic liquid crystal, a cholesteric liquid crystal, a smectic liquid crystal, a discotic liquid crystal, a thermotropic liquid crystal, a lyotropic liquid crystal, a low-molecular liquid crystal, a high-molecular liquid crystal, a ferroelectric liquid crystal, an anti-ferroelectric liquid crystal, a main-chain liquid crystal, a side-chain high-molecular liquid crystal, a plasma addressed liquid crystal (PALC), a banana-shaped liquid crystal, and the like. In addition, the following can be used as a diving method of a liquid crystal a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optical compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and the like. Note that the present invention is not limited to this, and various liquid crystal elements and driving methods can be used as a liquid crystal element and a driving method thereof.

Note that electronic paper corresponds to a device which displays an image by molecules which utilize optical anisotropy, dye molecular orientation, or the like; a device which displays an image by particles which utilize electrophoresis, particle movement, particle rotation, phase change, or the like; a device which displays an image by moving one end of a film; a device which displays an image by using coloring properties or phase change of molecules; a device which displays an image by using optical absorption by molecules; and a device which displays an image by using self-light emission by bonding electrons and holes. For example, the following can be used for a display method of electronic paper: microcapsule electrophoresis, horizontal electrophoresis, vertical electrophoresis, a spherical twisting ball, a magnetic twisting ball, a columnar twisting ball, a charged toner, electro liquid powder, magnetic electrophoresis, a magnetic thermosensitive type, an electrowetting type, a light-scattering (transparent-opaque change) type, a cholesteric liquid crystal and a photoconductive layer, a cholesteric liquid crystal device, a bistable nematic liquid crystal, a ferroelectric liquid crystal, a liquid crystal dispersed type with a dichroic dye, a movable film, coloring and decoloring properties of a leuco dye, a photochromic material, an electrochromic material, an electrodeposition material, flexible organic EL, and the like. Note that the present invention is not limited to this, and various electronic paper and display methods can be used as electronic paper and a display method thereof. Here, when microcapsule electrophoresis is used, defects of electrophoresis, which are aggregation and precipitation of phoresis particles, can be solved. Electro liquid powder has advantages such as high-speed response, high reflectivity, wide viewing angle, low power consumption, and memory properties.

Note that a plasma display panel has a structure in which a substrate having a surface provided with an electrode and a substrate having a surface provided with an electrode and a minute groove in which a phosphor layer is formed face each other at a narrow interval and a rare gas is sealed therein. Note that display can be performed by applying voltage between the electrodes to generate an ultraviolet ray so that a phosphor emits light. Note that the plasma display panel may be a DC-type PDP or an AC-type PDP. As a driving method of the plasma display panel, AWS (address while sustain) driving, ADS (address display separated) driving in which a subframe is divided into a reset period, an address period, and a sustain period, CLEAR (high-contrast, low energy address and reduction of false contour sequence) driving, ALIS (alternate lighting of surfaces) method, TERES (technology of reciprocal sustainer) driving, or the like can be used. Note that the present invention is not limited to this, and various driving methods can be used as a driving method of a plasma display panel.

Note that electroluminescence, a cold cathode fluorescent lamp, a hot cathode fluorescent lamp, an LED, a laser light source, a mercury lamp, or the like can be used as a light source of a display device in which a light source is necessary, such as a liquid crystal display (a transmissive liquid crystal display, a transflective liquid crystal display, a reflective liquid crystal display, a direct-view liquid crystal display, or a projection liquid crystal display), a display device using a grating light valve (GLV), or a display device using a digital micromirror device (DMD). Note that the present invention is not limited to this, and various light sources can be used as a light source.

Note mat various types of transistors can be used as a transistor, without limiting to a certain type. For example, a thin film transistor (TFT) including a non-single crystal semiconductor film typified by amorphous silicon, polycrystalline silicon, microcrystalline (also referred to as semi-amorphous) silicon, or the like can be used. In the case of using the TFT, there are various advantages. For example, since the TFT can be formed at temperature lower than that of the case of using single-crystal silicon, manufacturing cost can be reduced or a manufacturing apparatus can be made larger. Since the manufacturing apparatus is made larger, the TFT can be formed using a large substrate. Therefore, many display devices can be formed at the same time at low cost. In addition, a substrate having low heat resistance can be used because of low manufacturing temperature. Therefore, the transistor can be formed using a light-transmitting substrate. Accordingly, transmission of light in a display element can be controlled by using the transistor formed using the light-transmitting substrate. Alternatively, part of a film which forms the transistor can transmit light because the film thickness of the transistor is thin. Therefore, the aperture ratio can be improved.

Note that when a catalyst (e.g., nickel) is used in the case of forming polycrystalline silicon, crystallinity can be further improved and a transistor having excellent electric characteristics can be formed. Accordingly, a gate driver circuit (e.g., a scan line driver circuit), a source driver circuit (e.g., a signal line driver circuit), and/or a signal processing circuit (e.g., a signal generation circuit, a gamma correction circuit, or a DA converter circuit) can be formed over the same substrate as a pixel portion.

Note that when a catalyst (e.g., nickel) is used in the case of forming microcrystalline silicon, crystallinity can be further improved and a transistor having excellent electric characteristics can be formed. At this time, crystallinity can be improved by just performing heat treatment without performing laser irradiation. Accordingly, a gate driver circuit (e.g., a scan line driver circuit) and part of a source driver circuit (e.g., an analog switch) can be formed over the same substrate In addition, in the case of not performing laser irradiation for crystallization, crystallinity unevenness of silicon can be suppressed. Therefore, a high-quality image can be displayed.

Note that polycrystalline silicon and microcrystalline silicon can be formed without using a catalyst (e.g., nickel).

Note that it is preferable that crystallinity of silicon be improved to polycrystal, microcrystal, or the like in the whole panel; however, the present invention is not limited to this. Crystallinity of silicon may be improved only in part of the panel. Selective increase in crystallinity can be achieved by selective laser irradiation or the like. For example, only a peripheral driver circuit region excluding pixels may be irradiated with laser light. Alternatively, only a region of a gate driver circuit, a source driver circuit, or the like may be irradiated with laser light. Further alternatively, only-part of a source driver circuit (e.g., an analog switch) may be irradiated with laser light Accordingly, crystallinity of silicon can be improved only in a region in which a circuit needs to be operated at high speed. Since a pixel region is not particular needed to be operated at high speed, even if crystallinity is not improved, the pixel circuit can be operated without problems. Since a region, crystallinity of which is improved, is small, manufacturing steps can be decreased, throughput can be increased, and manufacturing cost can be reduced. Since the number of necessary manufacturing apparatus is small, manufacturing cost can be reduced.

A transistor can be formed by using a semiconductor substrate, an SOI substrate, or the like. Thus, a transistor with few variations in characteristics, sizes, shapes, or the like, with high current supply capacity, and with a small size can be formed. When such a transistor is used, power consumption of a circuit can be reduced or a circuit can be highly integrated.

A transistor including a compound semiconductor or an oxide semiconductor such as ZnO, a-InGaZnO, SiGe, GaAs, indium zinc oxide (IZO), indium tin oxide (ITO), or SnO, a thin film transistor obtained by thinning such a compound semiconductor or a oxide semiconductor, or the like can be used. Thus, manufacturing temperature can be lowered and for example, such a transistor can be formed at room temperature Accordingly, the transistor can be formed directly on a substrate having low heat resistance, such as a plastic substrate or a film substrate. Note that such a compound semiconductor or an oxide semiconductor can be used for not only a channel portion of the transistor but also other applications. For example, such a compound semiconductor or an oxide semiconductor can be used as a resistor, a pixel electrode, or a light-transmitting electrode. Further, since such an element can be formed at the same time as the transistor, cost can be reduced.

A transistor formed by using an inkjet method or a printing method, or the like can be used. Accordingly, a transistor can be formed at room temperature, can be formed at a low vacuum, or can be formed using a large substrate. In addition, since the transistor can be formed without using a mask (a reticle), a layout of the transistor can be easily changed. Further, since it is not necessary to use a resist, material cost is reduced and the number of steps can be reduced. Furthermore, since a film is formed only in a necessary portion, a material is not wasted compared with a manufacturing method in which etching is performed after the film is formed over the entire surface, so that cost can be reduced.

A transistor including an organic semiconductor or a carbon nanotube, or the like can be used. Accordingly, such a transistor can be formed using a substrate which can be bent. Therefore, a device using a transistor including an organic semiconductor or a carbon nanotube, or the like can resist a shock.

Further, transistors with various structures can be used. For example, a MOS transistor, a junction transistor, a bipolar transistor, or the like can be used as a transistor. When a MOS transistor is used, the size of the transistor can be reduced. Thus, a large number of transistors can be mounted. When a bipolar transistor is used, large current can flow Thus, a circuit can be operated at high speed.

Note that a MOS transistor, a bipolar transistor, and the like may be formed over one substrate. Thus, reduction in power consumption, reduction in size, high speed operation, and the like can be realized.

Furthermore, various transistors can be used.

Note that a transistor can be formed using various types of substrates without limiting to a certain type. For example, a single-crystal semiconductor substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate. Alternatively, a skin (e.g., epidermis or corium) or hypodermal tissue of an animal such as a human being can be used as a substrate. Further alternatively, the transistor may be formed using one substrate, and then, the transistor may be transferred to another substrate. A single-crystal semiconductor substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to which the transistor is transferred. Alternatively, a skin (e.g., epidermis or corium) or hypodermal tissue of an animal such as a human being can be used as a substrate to which the transistor is transferred. Further alternatively; the transistor may be formed using one substrate and the substrate may be thinned by polishing. A single-crystal semiconductor substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate to be polished. Alternatively, a skin (e.g., epidermis or corium) or hypodermal tissue of an animal such as a human being can be used as a substrate to be polished. When such a substrate is used, a transistor with excellent properties or a transistor with low power consumption can be formed, a device with high durability, high heat resistance can be provided, or reduction in weight or thickness can be achieved.

Note that a structure of a transistor can be various modes without limiting to a certain structure. For example, a multi-gate structure having two or more gate electrodes may be used. When the multi-gate structure is used, a structure where a plurality of transistors are connected in series is provided because channel regions are connected in series. With the multi-gate structure, off-current can be reduced or the withstand voltage of the transistor can be increased to improve reliability Alternatively, with the multi-gate structure, drain-source current does not fluctuate very much even if drain-source voltage fluctuates when the transistor operates in a saturation region, so that a flat slope of voltage-current characteristics can be obtained. When the flat slope of the voltage-current characteristics is utilized, an ideal current source circuit or an active load having an extremely high resistance value can be realized. Accordingly, a differential circuit or a current mirror circuit having excellent properties can be realized. As another example, a structure where gate electrodes are formed above and below a channel may be used. When the structure where gate electrodes are formed above and below the channel is used, a channel region is increased, so that the amount of current flowing therethrough can be increased or a depletion layer can be easily formed to decrease subthreshold swing. When the gate electrodes are formed above and below the channel, a structure where a plurality of transistors are connected in parallel is provided.

Alternatively, a structure where a gate electrode is formed above a channel region, a structure where a gate electrode is formed below a channel region, a staggered structure, an inversely staggered structure, a structure where a channel region is divided into a plurality of regions, or a structure where channel regions are connected in parallel or in series can be used. Further alternatively, a source electrode or a drain electrode may overlap with a channel region (or part of it). When the structure where the source electrode or the drain electrode may overlap with the channel region (or part of it) is used, the case can be prevented in which electric charges are accumulated in part of the channel region, winch would result in an unstable operation. Further alternatively, an LDD region may be provided. When the LDD region is provided, off-current can be reduced or the withstand voltage of the transistor can be increased to improve reliability. Further, when the LDD region is provided, drain-source current does not fluctuate very much even if drain-source voltage fluctuates when the transistor operates in the saturation region, so that a flat slope of voltage-current characteristics can be obtained.

Note that various types of transistors can be used as a transistor and the transistor can be formed using various types of substrates. Accordingly, all the circuits that are necessary to realize a predetermined function may be formed using the same substrate. For example, all the circuits that are necessary to realize the predetermined function may be formed using a glass substrate, a plastic substrate, a single-crystal semiconductor substrate, an SOI substrate, or any other substrate. When all the circuits that are necessary to realize the predetermined function are formed using the same substrate, cost can be reduced by reduction in the number of component parts or reliability can be improved by reduction in the number of connections to circuit components. Alternatively, part of the circuits which are necessary to realize the predetermined function may be formed using one substrate and another part of the circuits which are necessary to realize the predetermined function may be formed using another substrate. That is, not all the circuits that are necessary to realize the predetermined function are required to be formed using the same substrate. For example, part of the circuits which are necessary to realize the predetermined function may be formed by transistors using a glass substrate and another part of the circuits which are necessary to realize the predetermined function may be formed using a single-crystal semiconductor substrate, so that an IC chip formed by a transistor using the single-crystal semiconductor substrate may be connected to the glass substrate by COG (chip on glass) and the IC chip may be provided over the glass substrate Alternatively, the IC chip may be connected to the glass substrate by TAB (tape automated bonding) or a printed wiring board. When part of the circuits are formed using the same substrate in this manner, cost can be reduced by reduction in the number of component parts or reliability can be improved by reduction in the number of connections to circuit components. Further alternatively, when circuits with high driving voltage and high driving frequency, which consume large power, are formed using a single-crystal semiconductor substrate instead of forming such circuits using the same substrate and an IC chip formed by the circuit is used, increase in power consumption can be prevented.

Note that one pixel corresponds to one element whose brightness can be controlled. Therefore, for example, one pixel corresponds to one color element and brightness is expressed with the one color element. Accordingly, in the case of a color display device having color elements of R (red), G (green), and B (blue), a minimum unit of an image is formed of three pixels of an R pixel, a G pixel, and a B pixel. Note mat the color elements are not limited to three colors, and color elements of more than three colors may be used or a color other than RGB may be used. For example, RGBW (W corresponds to white) may be used by adding white. Alternatively, one or more colors of yellow, cyan, magenta emerald green, vermilion, and the like may be added to RGB. Further alternatively, a color similar to at least one of R, G, and B may be added to RGB. For example, R, G, B1, and B2 may be used. Although both B1 and B2 are blue, they have slightly different frequency. Similarly, R1, R2, G, and B may be used. When such color elements are used, display which is closer to the real object can be performed and power consumption can be reduced. As another example, in the case of controlling brightness of one color element by using a plurality of regions, one region may correspond to one pixel. Therefore, for example, in the case of performing area ratio gray scale display or the case of including a subpixel, a plurality of regions which control brightness are provided in each color element and gray scales are expressed with the whole regions. In this case, one region which controls brightness may correspond to one pixel. Thus, in that case, one color element includes a plurality of pixels. Alternatively, even when the plurality of regions which control brightness are provided in one color element, these regions may be collected as one pixel. Thus, in that case, one color element includes one pixel. In that case, one color element includes one pixel. Further alternatively, in the case where brightness is controlled in a plurality of regions in each color element, regions which contribute to display have different area dimensions depending on pixels in some cases. Further alternatively, in the plurality of regions which control brightness in each color element, signals supplied to each of the plurality of regions may be slightly varied to widen a viewing angle. That is, potentials of pixel electrodes included in the plurality of regions provided in each color element may be different from each other. Accordingly, voltage applied to liquid crystal molecules are varied depending on the pixel electrodes Therefore, the viewing angle can be widened.

Note that explicit description "one pixel (for three colors)" corresponds to the case where three pixels of R, G and B are considered as one pixel. Meanwhile, explicit description "one pixel (for one color)" corresponds to the case where the plurality of regions are provided in each color element and collectively considered as one pixel.

Note that pixels are provided (arranged) in matrix in some cases. Here, description that pixels are provided (arranged) in matrix includes the case where die pixels are arranged in a straight line and the case where the pixels are arranged in a jagged line, in a longitudinal direction or a lateral direction. Thus, for example, in the case of performing full color display with three color elements (e.g., RGB), the following cases are included therein: the case where the pixels are arranged in stripes and the case where dots of the three color elements are arranged in a delta pattern. In addition, the case is also included therein in which dots of the three color elements are provided in Bayer arrangement. Note that the color elements are not limited to three colors, and color elements of more man three colors may be used. For example, RGBW (W corresponds to white), RGB plus one or more of yellow, cyan, and magenta, or the like may be used. Further, the sizes of display regions may be different between respective dots of color elements. Thus, power consumption can be reduced or the life of a display element can be prolonged.

Note that an active matrix method in which an active element is included in a pixel or a passive matrix method in which an active element is not included in a pixel can be used.

In an active matrix method, as an active element (a non-linear element), not only a transistor but also various active elements (non-linear elements) can be used. For example, an MIM (metal insulator metal), a TFD (thin film diode), or the like can also be used. Since such an element has few number of manufacturing steps, manufacturing cost can be reduced or yield can be improved. Further, since the size of the element is small, the aperture ratio can be improved, so that power consumption can be reduced or high luminance can be achieved.

Note that as a method other than an active matrix method, a passive matrix method in which an active element (a non-linear element) is not used can also be used. Since an active element (a non-linear element) is not used, manufacturing steps is few, so that manufacturing cost can be reduced or the yield can be improved. Further, since an active element (a non-linear element) is not used, the aperture ratio can be improved, so that power consumption can be reduced or high luminance can be achieved.

Note that a transistor is an element having at least three terminals of a gate, a dram, and a source. The transistor has a channel region between a drain region and a source region, and current can flow through the drain region, the channel region, and the source region. Here, since the source and the drain of the transistor change depending on the structure, the operating condition, and the like of the transistor, it is difficult to define which is a source or a drain. Therefore, in this document, a region functioning as a source and a drain may not be called the source or the drain. In such a case, one of the source and the drain may be referred to as a first terminal and the other thereof may be referred to as a second terminal, for example. Alternatively, one of the source and the drain may be referred to as a first electrode and the other thereof may be referred to as a second electrode. Further alternatively, one of the source and the drain may be referred to as a source region and the other thereof may be called a drain region.

Note mat a transistor may be an element having at least three terminals of a base, an emitter, and a collector. In this case, one of the emitter and the collector may be similarly referred to as a first terminal and the other terminal may be referred to as a second terminal.

Note that a gate corresponds to all or part of a gate electrode and a gate wiring (also referred to as a gate line, a gate signal line, a scan line, a scan signal line, or the like). A gate electrode corresponds to a conductive film which overlaps with a semiconductor which forms a channel region with a gate insulating film interposed therebetween. Note that part of the gate electrode overlaps with an LDD (lightly doped drain) region or the source region (or the drain region) with the gate insulating film interposed therebetween m some cases. A gate wiring corresponds to a wiring for connecting a gate electrode of each transistor to each other, a wiring for connecting a gate electrode of each pixel to each other, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be referred to as either a gate electrode or a gate wiring. That is, there is a region where a gate electrode and a gate wiring cannot be clearly distinguished from each other. For example, in the case where a channel region overlaps with part of an extended gate wiring, the overlapped portion (region, conductive film, wiring, or the like) functions as both agate wiring and agate electrode. Accordingly, such a portion (a region, a conductive film, a wiring, or the like) may be referred to as either a gate electrode or a gate wiring.

Note that a portion (a region, a conductive film, a wiring, or the like) which is formed using the same material as a gate electrode, forms the same island as the gate electrode, and is connected to the gate electrode may also be referred to as a gate electrode Similarly, a portion (a region, a conductive film, a wiring, or the like) which is formed using the same material as a gate wiring, forms the same island as the gate wiring, and is connected to the gate wiring may also be referred to as a gate wiring. In a strict detect, such a portion (a region, a conductive film, a wiring, or the like) does not overlap with a channel region or does not have a function of connecting the gale electrode to another gate electrode in some cases. However, there is a portion (a region, a conductive film, a wiring, or the like) which is formed using the same material as a gate electrode or a gate wiring, forms the same island as the gate electrode or the gate wiring, and is connected to the gate electrode or the gate wiring because of specifications or the like in manufacturing. Thus, such a portion (a region, a conductive film, a wiring, or the like) may also be referred to as either a gate electrode or a gate wiring.

Note that in a multi-gate transistor, for example, a gate electrode is often connected to another gate electrode by using a conductive film winch is formed using the same material as the gate electrode. Since such a portion (a region, a conductive film, a wiring, or the like) is a portion (a region, a conductive film, a wiring, or the like) for connecting the gate electrode to another gate electrode, it may be referred to as a gate wiring, and it may also be referred to as a gate electrode because a multi-gate transistor can be considered as one transistor. That is, a portion (a region, a conductive film, a wiring, or the like) which is formed using the same material as a gate electrode or a gate wiring, forms the same island as the gate electrode or the gate wiring, and is connected to the gate electrode or the gate wiring may be referred to as either a gate electrode or a gate wiring. In addition, for example, part of a conductive film which connects the gate electrode and the gate wiring and is formed using a material which is different from that of the gate electrode or the gate wiring may also be referred to as either a gate electrode or a gate wiring.

Note that a gate terminal corresponds to part of a portion (a region, a conductive film, a wiring, or the like) of a gate electrode or a portion (a region, a conductive film, a wiring, or the like) which is electrically connected to the gate electrode.

Note that when a wiring is referred to as a gate wiring, a gate line, a gate signal line, a scan line, a scan signal line, there is the case in which a gate of a transistor is not connected to a wiring. In this case, the gate wiring, the gate line, the gate signal line, the scan line, or the scan signal line corresponds to a wiring formed in the same layer as the gate of the transistor, a wiring formed using the same material of the gate of the transistor, or a wiring formed at the same time as the gate of the transistor in some cases. As examples, there are a wiring for a storage capacitor, a power supply line, a reference potential supply line, and the like.

Note that a source corresponds to all or part of a source region, a source electrode, and a source wiring (also referred to as a source line, a source signal line, a data line, a data signal line, or the like). A source region corresponds to a semiconductor region including a large amount of p-type impurities (e.g., boron or gallium) or n-type impurities (e.g., phosphorus or arsenic). Therefore, a region including a small amount of p-type impurities or n-type impurities, namely, an LDD (lightly doped drain) region is not included in the source region. A source electrode is part of a conductive layer which is formed using a material different from that of a source region and is electrically connected to the source region. However, there is the case where a source electrode and a source region are collectively referred to as a source electrode. A source wiring is a wiring for connecting a source electrode of each transistor to each other, a wiring for connecting a source electrode of each pixel to each other, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be referred to as either a source electrode or a source wiring. That is, there is a region where a source electrode and a source wiring cannot be clearly distinguished from each other. For example, in the case where a source region overlaps with part of an extended source wiring, the overlapped portion (region, conductive film, wiring, or the like) functions as both a source wiring and a source electrode. Accordingly, such a portion (a region, a conductive film, a wiring, or the like) may be referred to as either a source electrode or a source wiring.

Note that a portion (a region, a conductive film, a wiring, or the like) which is formed using the same material as a source electrode, forms the same island as the source electrode, and is connected to the source electrode, or a portion (a region, a conductive film, a wiring, or the like) which connects a source electrode and another source electrode may also be referred to as a source electrode. Further, a portion which overlaps with a source region may be referred to as a source electrode. Similarly, a portion (a region, a conductive film, a wiring, or the like) which is formed using the same material as a source wiring, forms the same island as the source wiring, and is connected to the source wiring may also be referred to as a source wiring. In a strict sense, such a portion (a region, a conductive film, a wiring, or the like) does not have a function of connecting the source electrode to another source electrode in some cases. However, there is a portion (a region, a conductive film, a wiring, or the like) which is formed using the same material as a source electrode or a source wiring, forms the same island as the source electrode or the source wiring, and is connected to the source electrode or the source wiring because of specifications or the like in manufacturing. Thus, such a portion (a region, a conductive film, a wiring, or the like) may also be referred to as either a source electrode or a source wiring.

For example, part of a conductive film which connects a source electrode and a source wiring and is formed using a material which is different from that of the source electrode or the source wiring may be referred to as either a source electrode or a source wiring.

Note that a source terminal corresponds to part of a source region, a source electrode, or a portion (a region, a conductive film, a wiring, or the like) which is electrically connected to the source electrode.

Note that when a wiring is referred to as a source wiring, a source line, a source signal line, a data line, a data signal line, there is the case in which a source (a drain) of a transistor is not connected to a wiring. In this case, the source wiring, the source line, the source signal line, the data line, or the data signal line corresponds to a wiring formed in the same layer as the source (the drain) of the transistor, a wiring formed using the same material of the source (the drain) of the transistor, or a wiring formed at the same time as the source (the drain) of the transistor in some cases. As examples, there are a wiring for a storage capacitor, a power supply line, a reference potential supply line, and the like.

Note that The same can be said for a drain.

Note that a semiconductor device corresponds to a device having a circuit including a semiconductor element (e.g., a transistor, a diode, or a thyristor). The semiconductor device may also include all devices that can function by utilizing semiconductor characteristics. In addition, the semiconductor device corresponds to a device having a semiconductor material.

Note that a display element corresponds to an optical modulation element, a liquid crystal element, a light-emitting element, an EL element (an organic EL element, an inorganic EL element, or an EL element including organic and inorganic materials), an electron emitter, an electrophoresis element, a discharging element, a light-reflective element, a light diffraction element a digital micromirror device (DMD), or the like. Note that the present invention is not limited to this.

Note that a display device corresponds to a device having a display element. The display device may include a plurality of pixels each having a display element. Note that that the display device may also include a peripheral driver circuit for driving the plurality of pixels. The peripheral driver circuit for driving the plurality of pixels may be formed over the same substrate as the plurality of pixels. The display device may also include a peripheral driver circuit provided over a substrate by wire bonding or bump bonding, namely, an IC chip connected by chip on glass (COG) or an IC chip connected by TAB or the like. Further, the display device may also include a flexible printed circuit (FPC) to which an IC chip, a resistor, a capacitor, an inductor, a transistor, or the like is attached. Note also that the display device includes a printed wiring board (PWB) which is connected through a flexible printed circuit (FPC) and to which an IC chip, a resistor, a capacitor, an inductor, a transistor, or the like is attached. The display device may also include an optical sheet such as a polarizing plate or a retardation plate. The display device may also include a lighting device, a housing, an audio input and output device, a light sensor, or the like. Here, a lighting device such as a backlight unit may include a light guide plate, a prism sheet, a diffusion sheet, a reflective sheet, a light source (e.g., an LED or a cold cathode fluorescent lamp), a cooling device (e.g., a water cooling device or an air cooling device), or the like.

Note that a lighting device corresponds to a device having a backlight unit, a light guide plate, a prism sheet, a diffusion sheet, a reflective sheet, or a light source (e.g., an LED, a cold cathode fluorescent lamp, or a hot cathode fluorescent lamp), a cooling device, or the like.

Note that a light-emitting device corresponds to a device having a light-emitting element and the like. In the case of including a light-emitting element as a display element, the light-emitting device is one of specific examples of a display device.

Note that a reflective device corresponds to a device having a light-reflective element, a light diffraction element, light-reflective electrode, or the like.

Note that a liquid crystal display device corresponds to a display device including a liquid crystal element. Liquid crystal display devices include a direct-view liquid crystal display, a projection liquid crystal display, a transmissive liquid crystal display, a reflective liquid crystal display, a transflective liquid crystal display, and the like.

Note that a driving device corresponds to a device having a semiconductor element, an electric circuit, or an electronic circuit. For example, a transistor which controls input of a signal from a source signal line to a pixel (also referred to as a selection transistor, a switching transistor, or the like), a transistor which supplies voltage or current to a pixel electrode, a transistor which supplies voltage or current to a light-emitting element, and the like are examples of the driving device. A circuit which supplies a signal to a gate signal line (also referred to as a gate driver, a gate line driver circuit, or the like), a circuit which supplies a signal to a source signal line (also referred to as a source driver, a source line driver circuit, or the like) are also examples of the driving device.

Note that a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

Note that when it is explicitly described that "B is formed on A" or "B is formed over A", it does not necessarily mean that B is formed in direct contact with A The description includes the case where A and B are not in direct contact with each other, i.e., the case where another object is interposed between A and B. Here, each of A and B corresponds to an object (e.g., a device, an element, a circuit, a wiring, an electrode, a terminal, a conductive film, or a layer).

Accordingly, for example, when it is explicitly described that "a layer B is formed on (or over) a layer A", it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Similarly, when it is explicitly described that "B is formed above A", it does not necessarily mean that B is formed in direct contact with A, and another object may be interposed therebetween. Thus, for example, when it is described that "a layer B is formed above a layer A", it includes both the case where the layer B is formed in direct contact with the layer A, and the case where another layer (e.g., a layer C or a layer D) is formed in direct contact with the layer A and the layer B is formed in direct contact with the layer C or D. Note that another layer (e.g., a layer C or a layer D) may be a single layer or a plurality of layers.

Note that when it is explicitly described that "B is formed in direct contact with A", it includes not the case where another object is interposed between A and B but the case where B is formed in direct contact with A.

Note that the same can be said when it is described that B is formed below or under A.

Note that when an object is explicitly described in a singular form, the object is preferably singular. Note that the present invention is not limited to this, and the object can be plural. Similarly, when an object is explicitly described in a plural form, the object is preferably plural. Note that the present invention is not limited to this, and the object can be singular.

A single-crystal semiconductor layer is extracted from a single-crystal semiconductor substrate and is fixed to an insulating substrate to form a TFT over the insulating substrate. Then, a driver circuit is formed using the TFT. Accordingly, a small thin display device with low power consumption can be manufactured.

DETAILED DESCRIPTION OF THE INVENTION

Embodiment Mode

Figure 1:
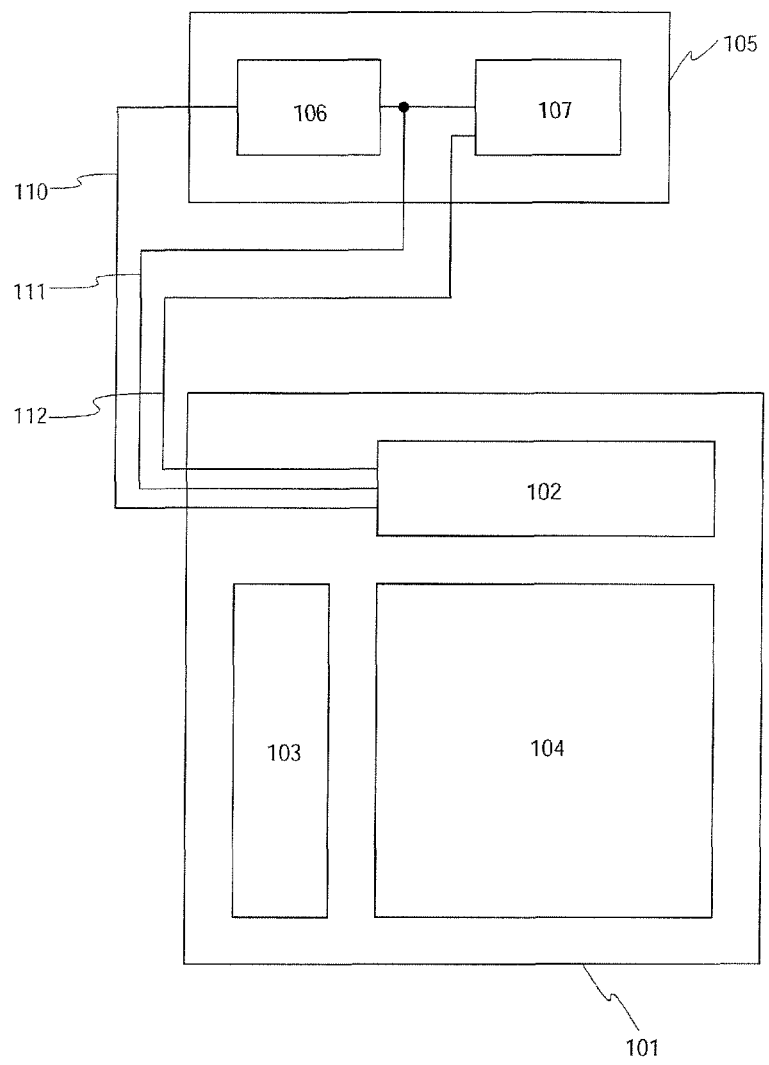
FIG. 1 illustrates a structure of a semiconductor device in accordance with an embodiment mode of the present invention.

Hereinafter, the present invention will be described by way of embodiment modes with reference to the drawings. Note that the present invention can be implemented in various different ways and it will be readily appreciated by those skilled in the art that various changes and modifications are possible without departing from the spirit and the scope of the present invention. Therefore, the present invention should not be construed as being limited to the description of the embodiment modes of the present invention. Note that in structures of the present invention described hereinafter, like portions or portions having similar functions are denoted by common reference numerals in different drawings, and detailed description thereof is omitted.

Embodiment Mode 1

As shown in FIG. 1, a glass substrate 101 is provided with a source driver 102 and a gate driver 103 as driver circuits which drive pixels, and pixel arrangement 104. Note that the present invention is not limited to this, and the glass substrate 101 can be provided with various circuits. All or part of these circuits are/is formed using a TFT which is formed over an insulating substrate by extracting a single-crystal semiconductor layer from a single-crystal semiconductor substrate and fixing the single-crystal semiconductor layer to the insulating substrate, or a TFT winch is formed over an insulating substrate by attaching a single-crystal semiconductor substrate to the insulating substrate and fixing a single-crystal semiconductor layer which is part of the single-crystal semiconductor substrate to the insulating substrate by separating the single-crystal semiconductor substrate. Note that a TFT which is formed over an insulating substrate by extracting a single-crystal semiconductor layer from a single-crystal semiconductor substrate and fixing the single-crystal semiconductor layer to the insulating substrate, or a TFT which is formed over an insulating substrate by attaching a single-crystal semiconductor substrate to the insulating substrate and fixing a single-crystal semiconductor layer which is part of the single-crystal semiconductor substrate to the insulating substrate by separating the single-crystal semiconductor substrate is hereinafter referred to as a single-crystal TFT. Note that a method for manufacturing a single-crystal TFT is described in another embodiment mode. Note that in this embodiment mode, a glass substrate is used as an insulating substrate.

At least all or part of the source driver 102 and the gate driver 103 are/is formed using a single-crystal TFT. A single-crystal TFT has extremely excellent current characteristics because an active layer (a channel region, an LDD region, a source region, a drain region, or the like) is almost in a single-crystal state. In addition, the absolute value of the threshold voltage is extremely small. That is, a single-crystal TFT has the same level of transistor characteristics as a transistor which is formed using a normal single-crystal semiconductor substrate or a transistor which is formed using an SOI substrate. Therefore, a single-crystal TFT can be operated at the same level of power supply voltage as an integrated circuit (IC) which is formed using a single-crystal semiconductor substrate or an SOI substrate. Accordingly, a single-crystal TFT can be operated with low power consumption.

FIG. 1 focuses on a signal supplied to the source driver 102, a power supply 107, and the like. At least first power supply voltage 111 and second power supply voltage 112 are supplied from the power supply 107 to the source driver 102. The first power supply voltage 111 is also supplied to a controller 106 which controls the source driver 102 and the gate driver 103. Normally, the second power supply voltage 112 has a higher potential than the first power supply voltage 111. In addition, although not shown, a ground potential is also supplied to the controller 106, the source driver 102, and the like.

The power supply 107 is formed using an inductor, a regulator, a power supply IC or the like.

The controller 106 is an integrated circuit (IC) which is formed using a single-crystal semiconductor substrate or an SOI substrate. Therefore, the controller 106 can be operated with low power consumption.

The power supply 107 and the controller 106 are provided in a position oilier than the glass substrate 101. For example, the power supply 107 and the controller 106 are provided over a substrate 105. Note that the present invention is not limited to this. For example, the power supply 107 and the controller 106 may be provided over different substrates. Alternatively, the power supply 107 and the controller 106 are provided over the glass substrate 101 by COG (chip on glass) in some cases. Further alternatively, part of the power supply 107 or the controller 106 may be provided over the glass substrate 101 by using a TFT.

A signal 110 is supplied from the controller 106 to the source driver 102. At this time, the magnitude of the amplitude of the signal 110 is the same between the controller 106 and the source driver 102. Here, description that the magnitude of the amplitude of the signal 110 is the same does not necessarily mean that the amplitude of the signal 110 is completely the same between the controller 106 and the source driver 102. For example, even when the amplitude of the signal 110 is distorted by noise caused by signal delay, wiring resistance, parasitic capacitance, crosstalk with another signal, or the like, it is assumed that the magnitude of the amplitude of the signal 110 is the same between the controller 106 and the source driver 102. The signal 110 is a timing signal, a clock signal, or the like. The ground potential and the first power supply voltage 111 are supplied to the controller 106. In the controller 106, a variety of processing is performed using the ground potential and the first power supply voltage 111. Therefore, low-level and high-level potentials of the signal 110 have almost the same level of a potential of the ground potential or the first power supply voltage 111.

Note that an example of the ground potential is 0 V. Examples of the first power supply voltage 111 are 3 V, 5 V. 1.8 V, and the like. The first power supply voltage 111 is preferably lower than or equal to 3 V, more preferably lower than or equal to 1.0 V. In a technological level at the time of application, the integrated circuit (IC) which is formed using the single-crystal semiconductor substrate or the SOI substrate is often operated at 3 V. Therefore, the IC can be utilized directly, so that a low-cost general-purpose material can be used. Note that since operating voltage of an IC has been lowered, the IC has been operated at lower voltage.

Figure 2:
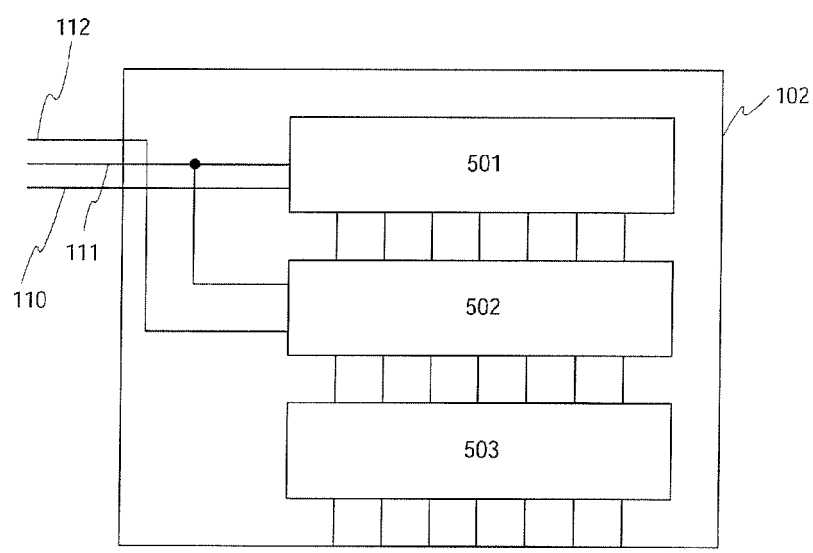
FIG. 2 illustrates a structure of a semiconductor device in accordance with an embodiment mode of the present invention.

FIG. 2 shows a structural example of the source driver 102. The first power supply voltage 111 and the signal 110 are input to a shift register 501. Note that although not shown, the ground potential is also supplied to the shift register 501. Therefore, the shift register 501 is operated using the ground potential and the first power supply voltage 111. As the signal 110, a start pulse signal, a clock signal, or the like is supplied from the controller 106.

Here, the shift register 501 is formed using a single-crystal TFT. Accordingly, even if supplied voltage and voltage of the signal are low, the shift register 501 can be operated adequately.

If the shift register is formed using a conventional low-temperature polysilicon TFT or a conventional high-temperature polysilicon TFT, even when the same power supply voltage as that supplied to the controller, i.e., the ground potential and the first power supply voltage 111 are supplied to the shift register, the shift register cannot be operated. This is because a conventional low-temperature polysilicon TFT or a conventional high-temperature polysilicon TFT has bad current characteristics such as high absolute value of the threshold voltage and low mobility. Thus, it is assumed that the magnitude of the power supply voltage which is supplied to the shift register be increased. Note that it is assumed that the amplitude of the signal 110 of the controller 106 be almost the same as that of the ground potential or the first power supply voltage 111. In that case, an inverter or the like included in the shift register cannot be turned on/off adequately and is always on, so that it is difficult to be operated adequately. In addition, when transistor characteristics vary, it is more difficult to be operated adequately. Therefore, it is necessary to level shift the amplitude of a signal (a start pulse signal, a clock signal, or the like) supplied to the shift register to almost the same amplitude of the increased power supply voltage. When a level shifter circuit for such an operation is to be formed over the glass substrate, a clock signal which is operated at high speed cannot be operated adequately. Even if it is operated, a waveform is distorted, so that operations of the circuit are adversely affected. Alternatively, when the level shifter circuit is provided using an integrated circuit outside the glass substrate, it is necessary to add components, so that cost is increased. Further, since power supply voltage of the shift register is high, power consumption is increased. Furthermore, in order to supply power supply voltage which is different from the power supply voltage supplied to the controller, an additional power supply circuit is necessary. Since the size of a power supply circuit is large, the power supply circuit adversely affects decrease in size and thickness of a device.

However, when the shift register 501 is formed using a single-crystal TFT, these problems can be solved. When the single-crystal TFT is used, it is not necessary to level shift the potential of the signal 110 output from the controller 106 either inside or outside the glass substrate 101. Therefore, a level shifter circuit for increasing the amplitude of a signal supplied to the shift register 501 can be eliminated. Therefore, the number of components can be reduced. In addition, the same power supply voltage can be supplied to the controller 106 and the shift register 501 to be operated, it is not necessary to increase the power supply voltage in the shift register 501. Therefore, power consumption can be reduced. In addition, it is not necessary to add a power supply circuit. Since the size of a power supply circuit is large, decrease in size and thickness can be realized by the size of the power supply circuit. Further, since the signal 110 which has the same potential as the power supply voltage supplied to the shift register 501 is supplied, the inverter or the like included in the shift register can be tamed on/off adequately, so that the shift register can be operated adequately. Furthermore, an output waveform is not distorted.

When the shift register 501 is formed over the glass substrate 101 by using a single-crystal TFT in this manner, the level shifter circuit for increasing the amplitude of a signal supplied to the shift register 501 can be eliminated.

Note that the pixel arrangement 104 is provided with various display elements, for example, a liquid crystal element, a light-emitting element (e.g., an EL element (an EL element containing organic and inorganic materials, an organic EL element, or an inorganic EL element) or an electron emitter), or an electrophoresis element, and the level of necessary voltage is determined in accordance with characteristics of each element. Therefore, in order to level shift a signal output from the shift register 501, a level shifter 502 is provided. At least the first power supply voltage 111 and the second power supply voltage 112 are supplied to the level shifter 502. A signal, the amplitude of voltage of which is increased by the level shiner 502, is supplied to a sampling circuit 503. In the sampling circuit 503, a video signal is sampled and the sampled video signal is supplied to the pixel arrangement 104.

Note that the level shifter 502 or the sampling circuit 503 is preferably formed using a single-crystal TFT. Note that the present invention is not limited to this.

Figure 3:
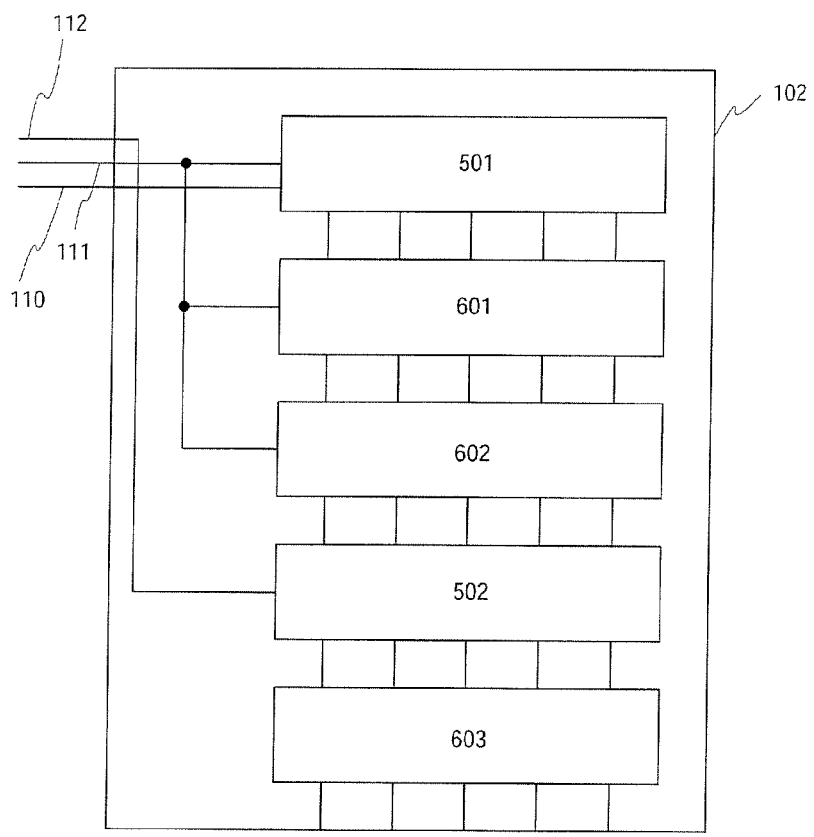
FIG. 3 illustrates a structure of a semiconductor device in accordance with an embodiment mode of the present invention.

Note, that the structure of the source driver 102 is not limited to the structure shown in FIG. 2, and various structures can be used. For example, FIG. 3 shows a structural example of the source driver 102 in the case where a digital video signal is supplied. A signal output from the shift register 501 is supplied to a first latch circuit 601 without being level shifted. In addition, a signal output from the first latch circuit 601 is supplied to a second latch circuit 602 without being level shifted. Each of the first latch circuit 601 and the second latch circuit 602 is formed using a single-crystal TFT. Therefore, at least the ground potential and the first power supply voltage 111 are supplied to the first latch circuit 601 and the second latch circuit 602. Therefore, similarly to the shift register, each of the first latch circuit 601 and the second latch circuit 602 is operated at low voltage. Note that although the digital video signal is supplied to the first latch circuit 601, low-level and high-level potentials of the signal have almost the same level of the potential of the ground potential or the first power supply voltage 111. Thus, each of the first latch circuit 601 and the second latch circuit 602 can be operated with low power consumption.

When each of the shift register 501, the first latch circuit 601, and the second latch circuit 602 is formed over the glass substrate 101 by using a single-crystal TFT in this manner, the level shifter circuit for increasing the amplitude of a signal supplied to the shift register 501 can be eliminated.

Note that in order to supply appropriate voltage to the pixel arrangement 104, the level shifter 502 is provided. In order to convert a digital signal into an analog signal, a DAC 603 is provided. Note that in the case where a digital signal is supplied to the pixel arrangement 104, the DAC 603 can be omitted. A video signal is supplied to the pixel arrangement 104.

Note that the level shifter 502 or the DAC 603 is preferably formed using a single-crystal TFT. Note that the present invention is not limited to this.

Figure 4:
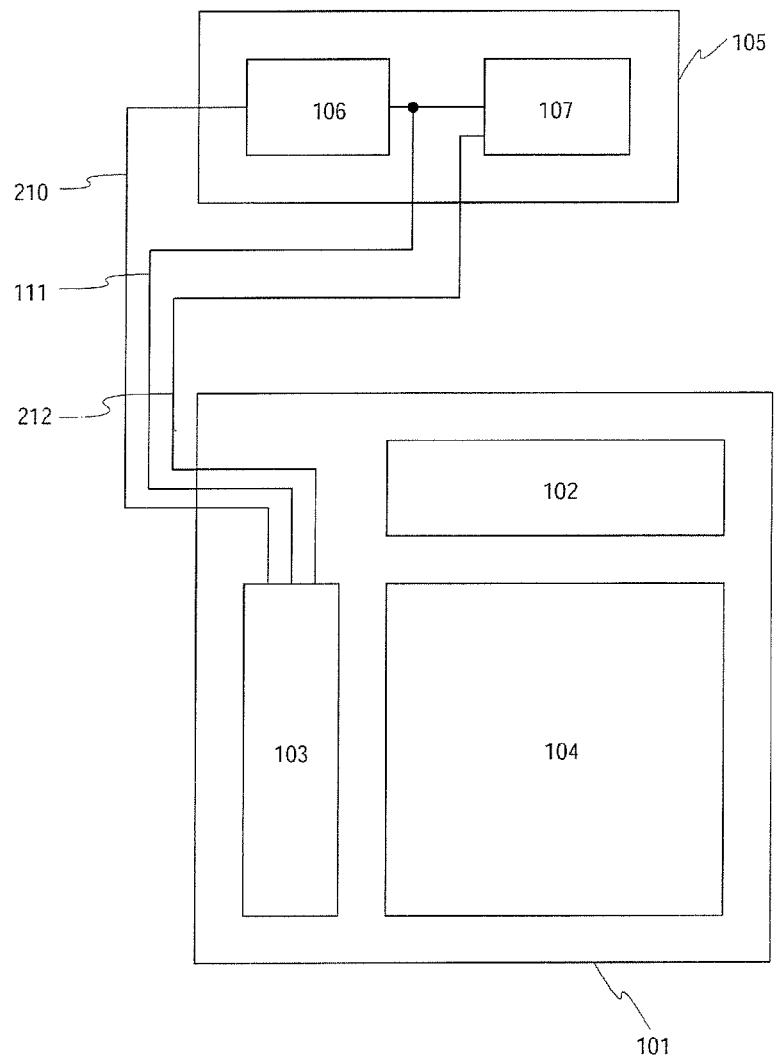
FIG. 4 illustrates a structure of a semiconductor device in accordance with an embodiment mode of the present invention.

In FIGS. 1 to 3, the source driver 102 is focused. Next, the gate driver is described. FIG. 4 focuses on a signal supplied to the gate driver 103, the power supply 107, and the like. At least the first power supply voltage 111 and third power supply voltage 212 are supplied from the power supply 107 to the gate driver 103. The first power supply voltage 111 is also supplied to a controller 106 which controls the source driver 102 and the gate driver 103. Note that although not shown, a ground potential is also supplied to the controller 106, the gate driver 103, and the like.

A signal 210 is supplied from the controller 106 to the gate driver 103. At this time, the magnitude of the amplitude of the signal 210 is the same between the controller 106 and the gate driver 103. Here, description that the magnitude of the amplitude of the signal 210 is the same does not necessarily mean that the amplitude of the signal 210 is completely the same between the controller 106 and the gate driver 103. For example, even when the amplitude of the signal 210 is distorted by noise caused by signal delay, wiring resistance, parasitic capacitance, crosstalk with another signal, or the like, it is assumed that the magnitude of the amplitude of the signal 210 is the same between the controller 106 and the gate driver 103. The signal 210 is timing signal, a clock signal, or the like. The ground potential and the first power supply voltage 111 are supplied to the controller 106. In the controller 106, a variety of processing is performed using the ground potential and the first power supply voltage 111. Therefore, low-level and high-level potentials of the signal 210 have almost the same level of a potential of the ground potential or the first power supply voltage 111.

Figure 5:
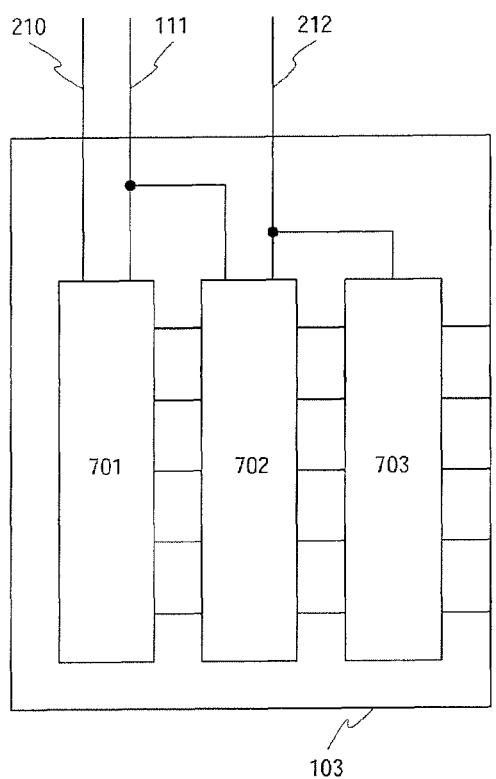
FIG. 5 illustrates a structure of a semiconductor device in accordance with an embodiment mode of the present invention.

FIG. 5 shows a structural example of the gate driver 103. The first power supply voltage 111 and the signal 210 are input to a shift register 701. Note that although not shown, the ground potential is also supplied to the shift register 701. Therefore, the shift register 701 is operated using the ground potential and the first power supply voltage 111. As the signal 210, a start pulse signal, a clock signal, or the like is supplied from the controller 106.

Here, the shift register 701 is formed using a single-crystal TFT. Accordingly, even if supplied voltage and voltage of the signal are low, the shift register 701 can be operated adequately. Therefore, similarly to the case of the source driver, there are various advantages.

When the shift register 701 is formed over the glass substrate 101 by using a single-crystal TFT in this manner, a level shifter circuit for increasing the amplitude of a signal supplied to the shift register 701 can be eliminated.

Note that in order to supply appropriate voltage to the pixel arrangement 104, a level shifter 702 is provided. In order to reduce distortion in a waveform, a buffer 703 is provided. A selection signal is supplied to the pixel arrangement 104.

Note that the level shifter 702 or the buffer 703 is preferably formed using a single-crystal TFT. Note that the present invention is not limited to this.

Figure 6A:
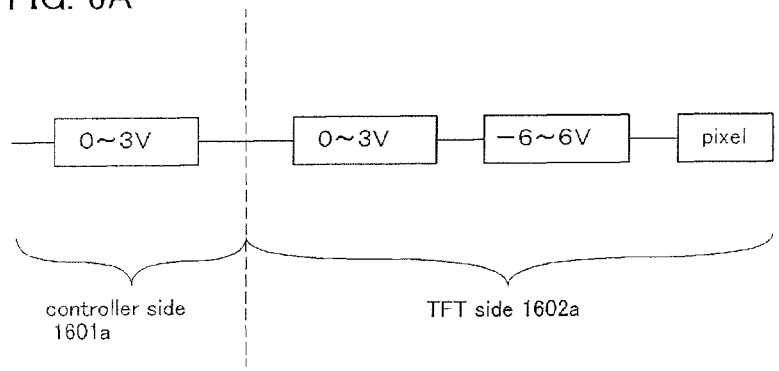
FIGS. 6A and 6B each illustrate operating voltage of a semiconductor device in accordance with an embodiment mode of the present invention.
Figure 6B:
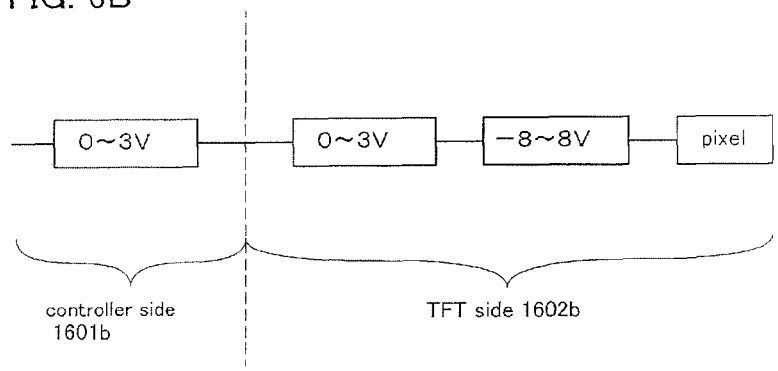

When a shift register, a latch circuit, or the like is formed over the glass substrate 101 by using a single-crystal TFT in this manner, a level shifter circuit for increasing the amplitude of a signal supplied to the shift register can be eliminated. FIGS. 6A and 6B shows change in voltage. FIG. 6A shows change in voltage of a source driver. In a controller side 1601a, a signal, a potential of which changes in a range of 0 to 3 V, a power supply potential of 0 V, and a power supply potential of 3 V are used In addition, in a TFT side 1602a formed over a glass substrate, a signal, a potential of which changes in a range of 0 to 3 V, a power supply potential of 0 V, and a power supply potential of 3 V are used in the shift register, the latch circuit, or the like. After that, in order to input voltage to a pixel, voltage is level shifted to voltage which is appropriate for the pixel, for example, −6 V to 6 V. Accordingly, almost all regions are operated at the same voltage as an IC, and only the pixel and a peripheral portion thereof can be operated at the appropriate voltage, so that power consumption can be reduced FIG. 6B shows change in voltage of a gate driver. In the gate driver of a TFT side 1602b, almost all regions are operated at the same voltage as the IC of a controller side 1601b, and only the pixel and the peripheral portion thereof can be operated at the appropriate voltage, so that power consumption can be reduced, similarly to the source driver.

Figure 7:
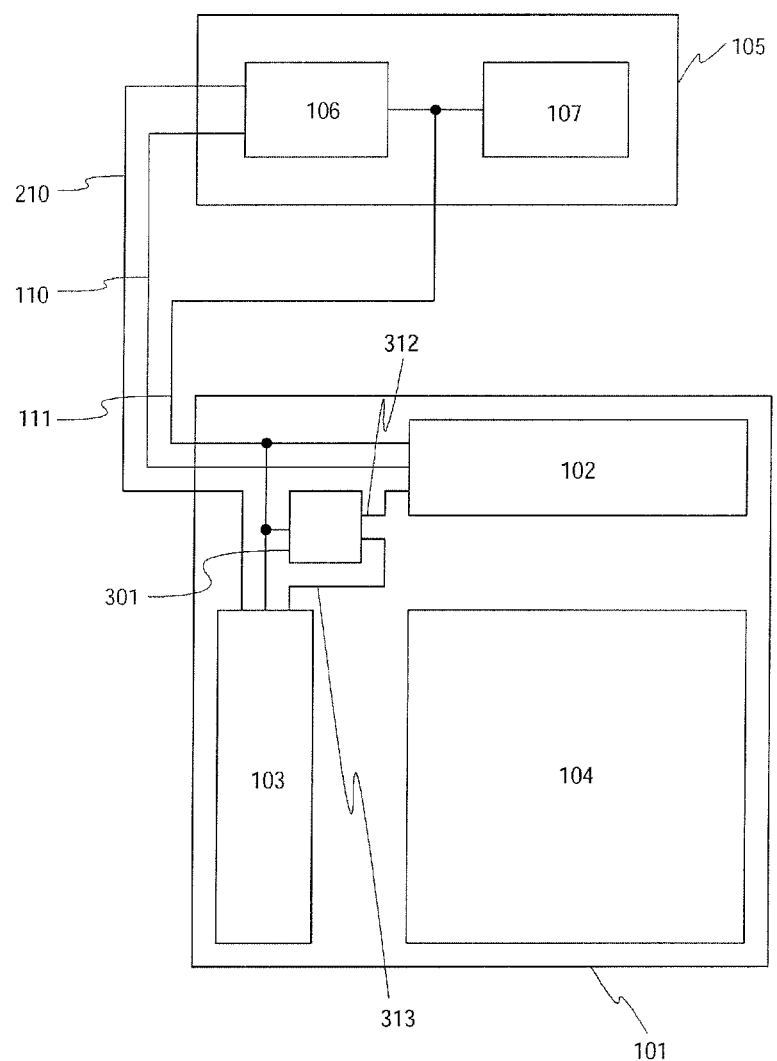
FIG. 7 illustrates a structure of a semiconductor device in accordance with an embodiment mode of the present invention.

Note that although the second power supply voltage 112 or the third power supply voltage 212 is supplied from the power supply 107 differently from the first power supply voltage 111 in FIG. 1 or FIG. 4, the present invention is not limited to this. As shown in FIG. 7, different voltage may be produced from the first power supply voltage 111 by using a dc-dc converter 301. In FIG. 7, the dc-dc converter 301 produces the second power supply voltage 312 or the third power supply voltage 313 by using the first power supply voltage 111, and the second power supply voltage 312 or the third power supply voltage 313 is supplied to the source driver 102 or the gate driver 103.

Note that the dc-dc converter 301 is preferably formed using a single-crystal TFT. Note that the present invention is not limited to this.

Figure 8:
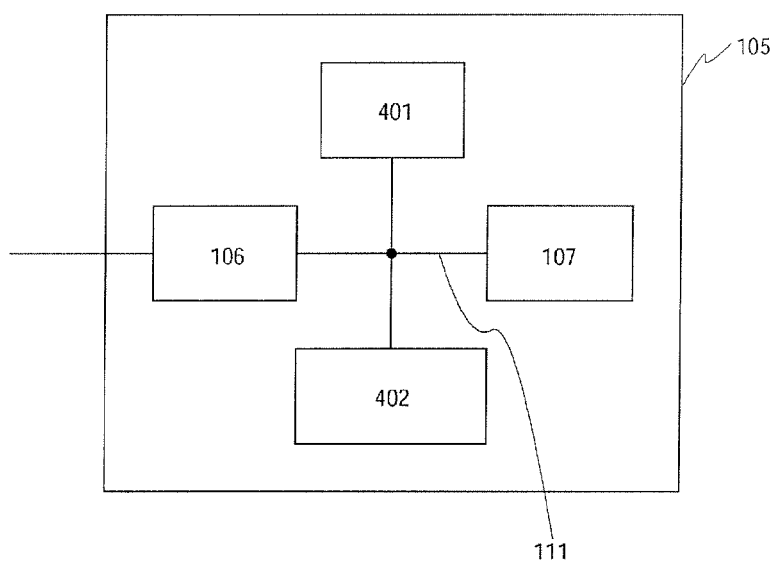
FIG. 8 illustrates a structure of a semiconductor device in accordance with an embodiment mode of the present invention.

Note that although the power supply 107 supplies power supply voltage to the controller 106 or the like in FIG. 1, FIG. 4, or FIG. 7, the present invention is not limited to this. The power supply 107 supplies power supply voltage to various circuits. For example, as shown in FIG. 8, the power supply 107 also supplies power supply voltage to a memory 401, a graphic processor 402, and the like. When the power supply 107 supplies the same power supply voltage to all of them, a device can be made small or lightened.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that tins embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 2

Figure 9A:
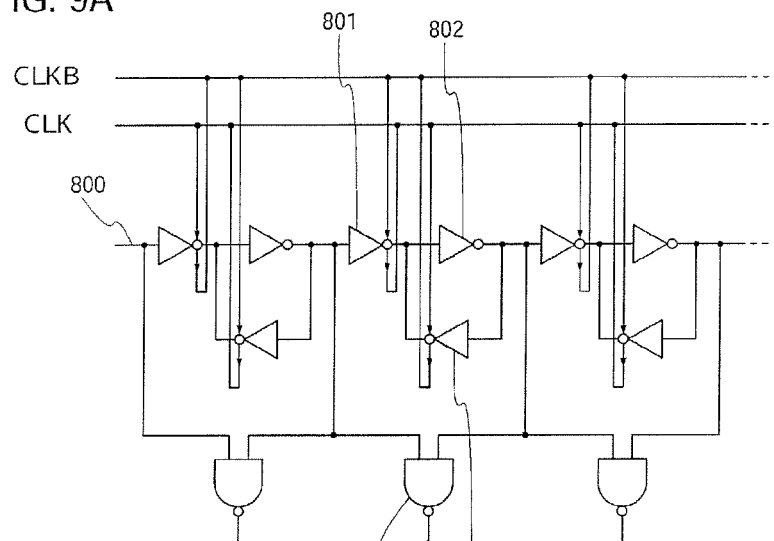
FIGS. 9A and 9B each illustrate a structure of a semiconductor device in accordance with an embodiment mode of the present invention.

In tins embodiment mode, a specific example of the structure described in Embodiment Mode 1 is described. FIG. 9A shows an example of a shift register. The shift register includes a clocked inverter 801, an inverter 802, a NAND circuit 803, and the like. A signal transmitted from the controller 106 is input to the shift register through a wiring 800. Then, the signal is output from a wiring 804 through the clocked inverter 801, the inverter 802, the NAND circuit 803, and the like. Note that a clock signal (CLK) and a clock inverted signal (CLKB) are input to the clocked inverter 801. Each of the first latch circuit 601 and the second latch circuit 602 in FIG. 3 also includes a clocked inverter, an inverter, and the like and has a circuit structure which is similar to that in FIG. 9A.

Figure 9B:
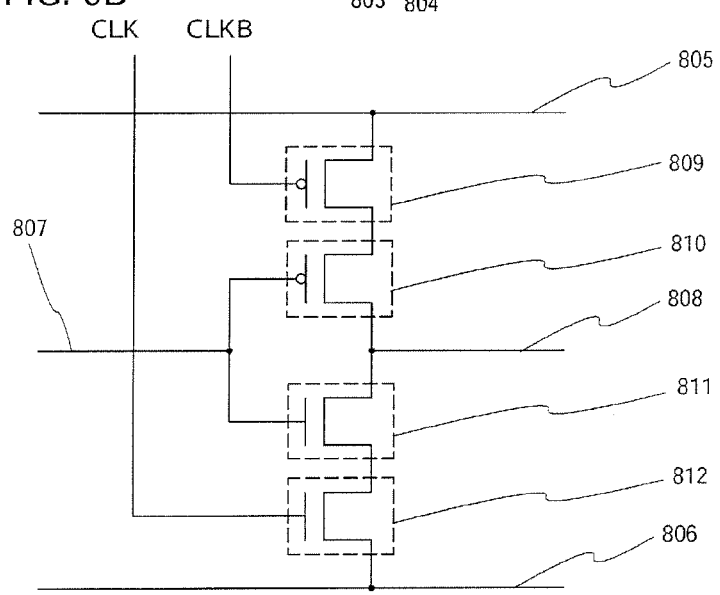

FIG. 9B shows an example of the clocked inverter 801 which is used in the shift register. The clocked inverter 801 includes a first P-channel transistor 809, a second P-channel transistor 810, a first N-channel transistor 811, and a second N-channel transistor 812. A high-potential side power supply line 805 is connected to the first P-channel transistor 809, and a low-potential side power supply line 806 is connected to the second N-channel transistor 812. A signal which is input from a wiring 807 connected to gate electrodes of the second P-channel transistor 810 and the first N-channel transistor 811 is output from a wiring 808 connected to source electrodes or drain electrodes of the second P-channel transistor 810 and the first N-channel transistor 811. Note that a clock signal is input to the second N-channel transistor 812, and a clock inverted signal is input to the first P-channel transistor 809.

Figure 10:
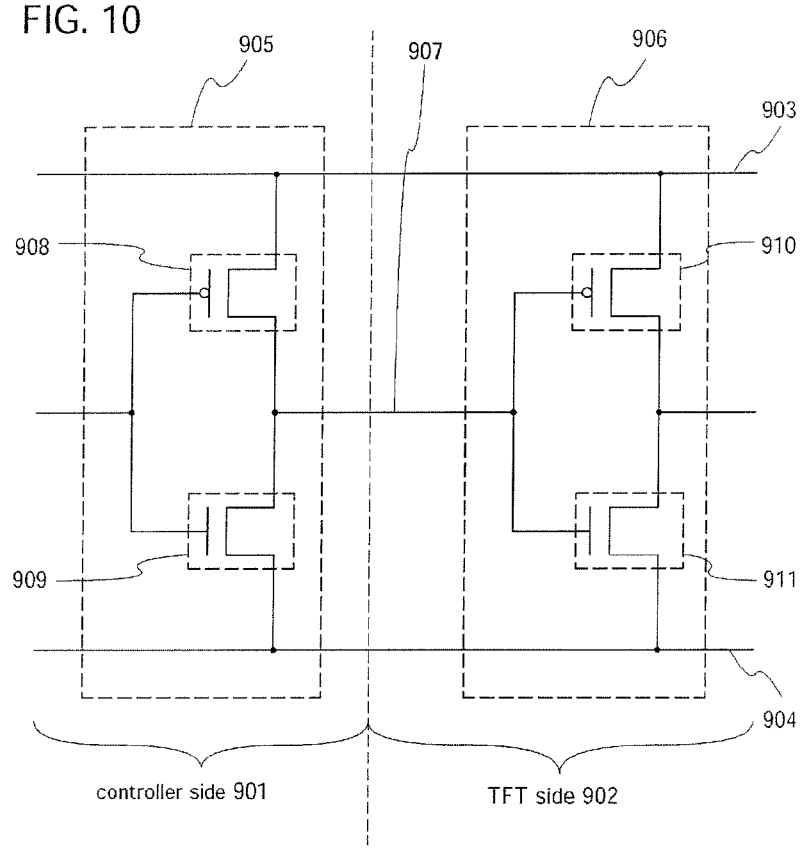
FIG. 10 illustrates a structure of a semiconductor device in accordance with an embodiment mode of the present invention.
Figure 11:
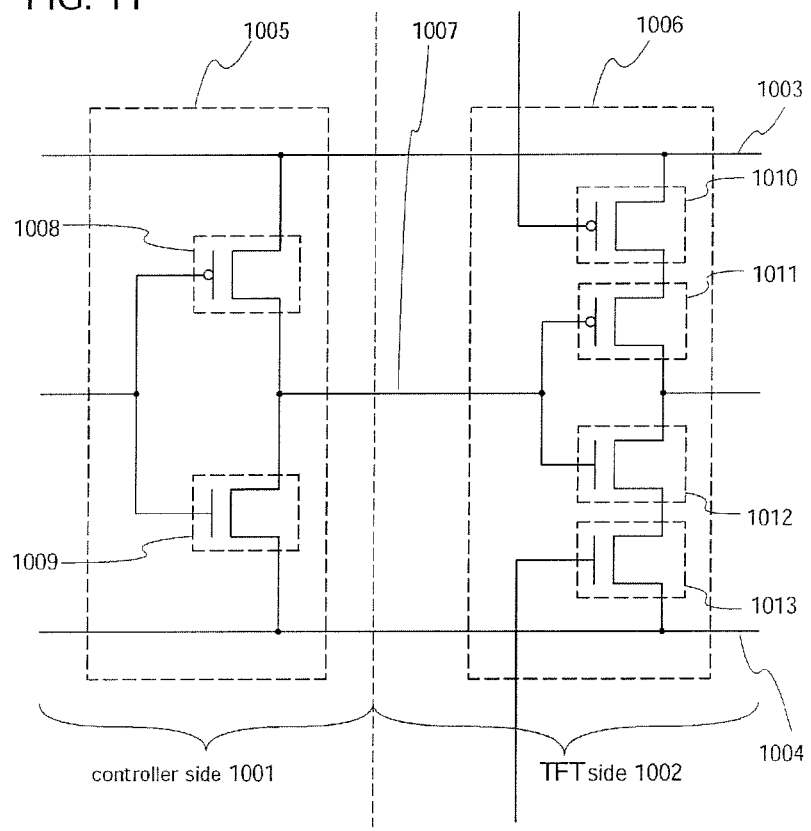
FIG. 11 illustrates a structure of a semiconductor device in accordance with an embodiment mode of the present invention.
Figure 12:
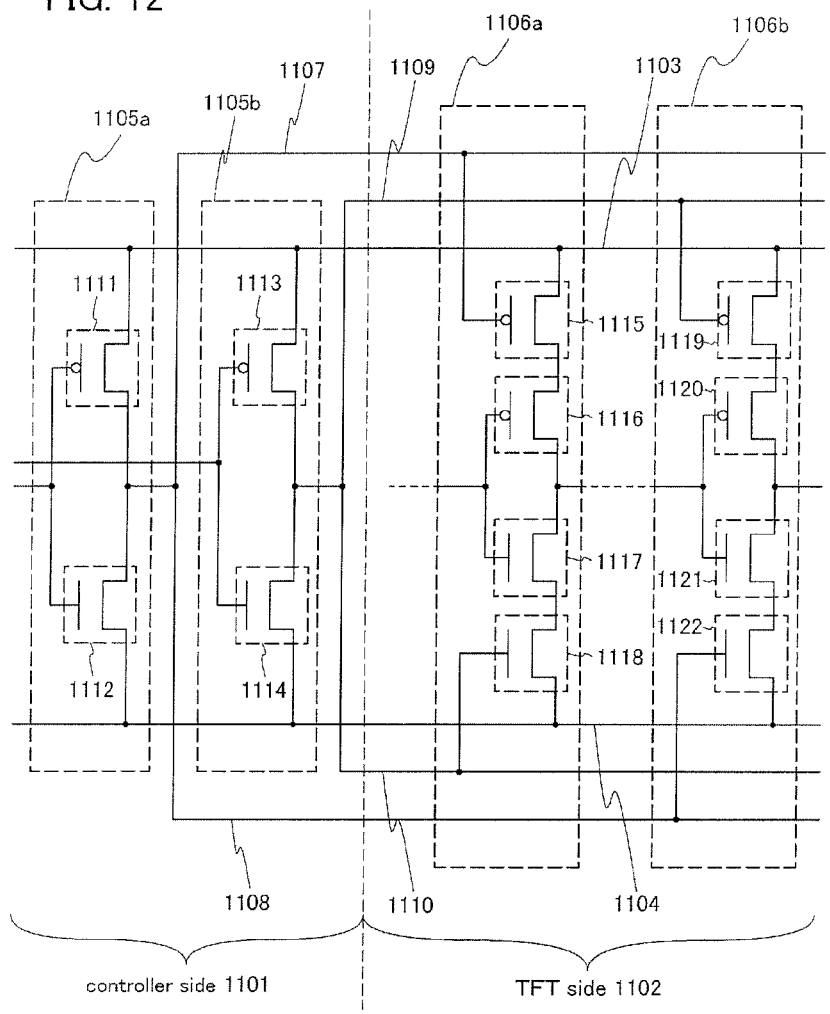
FIG. 12 illustrates a structure of a semiconductor device in accordance with an embodiment mode of the present invention.

A signal is input from the controller 106 formed using an IC to the shift register which is formed over a glass substrate by using a crystalline TFT, the clocked inverter, the inverter, the NAND circuit, or the like. FIGS. 10 to 12 each show this portion at a transistor level.

In FIG. 10, as a circuit of a controller side 901, an inverter 905 is provided, for example. The inverter 905 includes a first P-channel transistor 908 and a first N-channel transistor 909. As a circuit of a TFT side 902, an inverter 906 is provided, for example The inverter 906 includes a second P-channel transistor 910 and a second N-channel transistor 911. In addition, by a high-potential side power supply line 903 and a low-potential side power supply line 904, power supply voltage used in the inverter 905 is also supplied to the inverter 906 which is formed over a glass substrate by using a crystalline TFT. That is, the same power supply voltage is used in the controller side 901 and the TFT side 902. Therefore, the high-potential side power supply line 903 is connected to the first P-channel transistor 908 of the inverter 905 and the second P-channel transistor 910 of the inverter 906. Further, the low-potential side power supply line 904 is connected to the first N-channel transistor 909 of the inverter 905 and the second N-channel transistor 911 of the inverter 906. Thus, a level shifter is not necessary. The inverter 906 has excellent current characteristics because an active layer is almost in a single-crystal state. Further, the absolute value of the threshold voltage is small and mobility is high. Therefore, even when the same power supply voltage as an IC is supplied, the inverter 906 can be operated. Accordingly, a small thin display device with low power consumption can be formed. Furthermore, since the amplitude of a signal which is output from the inverter 905 and is input to the inverter 906 through a wiring 907 is equal to that of the power supply voltage, the circuit is operated adequately and a waveform is not distorted.

The case in which the circuit of the TFT side 902 is the inverter 906 is described with reference to FIG. 10, and the same can be said for the case in which the circuit of the TFT side 902 is a clocked inverter. FIGS. 11 and 12 each show an example in which a circuit of a TFT side is a clocked inverter. In FIG. 11, as a circuit of a controller side 1001, an inverter 1005 is provided, for example. The inverter 1005 includes a first P-channel transistor 1008 and a first N-channel transistor 1009. As a circuit of a TFT side 1002, a clocked inverter 1006 is provided, for example. The clocked inverter 1006 includes a second P-channel transistor 1010, a third P-channel transistor 1011, a second N-channel transistor 1012, and a third N-channel transistor 1013. In addition, by a high-potential side power supply line 1003 and a low-potential side power supply line 1004, power supply voltage used in the inverter 1005 is also supplied to the clocked inverter 1006 which is formed over a glass substrate by using a crystalline TFT. That is, the same power supply voltage is used in the controller side 1001 and the TFT side 1002. Therefore, the high-potential side power supply line 1003 is connected to the first P-channel transistor 1008 of the inverter 1005 and the second P-channel transistor 1010 of the clocked inverter 1006. Further, the low-potential side power supply line 1004 is connected to the first N-channel transistor 1009 of the inverter 1005 and the third N-channel transistor 1013 of the clocked inverter 1006. Thus, a level shifter is not necessary. The clocked inverter 1006 has excellent current characteristics because an active layer is almost in a single-crystal state. Further, the absolute value of the threshold voltage is small and mobility is high. Therefore, even when the same power supply voltage as an IC is supplied, the clocked inverter 1006 can be operated. Accordingly, a small thin display device with low power consumption can be formed. Furthermore, since the amplitude of a signal which is output from the inverter 1005 and is input to the clocked inverter 1006 through a wiring 1007 is equal to that of the power supply voltage, the circuit is operated adequately and a waveform is not distorted.

FIG. 12 show's clocked inverters 1106a and 1106b in the case where a signal is input to a portion which is controlled with a clock from a controller. In FIG. 12, as circuits of a controller side 1101, inverters 1105a and 1105b are provided. The inverter 1105a includes a first P-channel transistor 1111 and a first N-channel transistor 1112. The inverter 1105b includes a second P-channel transistor 1113 and a second N-channel transistor 1114. As circuits of a TFT side 1102, clocked inverters 1106a and 1106b are provided. The clocked inverter 1106a includes a third P-channel transistor 1115, a fourth P-channel transistor 1116, a third N-channel transistor 1117, and a fourth N-channel transistor 1118. The clocked inverter 1106b includes a fifth P-channel transistor 1119, a sixth P-channel transistor 1120, a fifth N-channel transistor 1121, and a sixth N-channel transistor 1122.

Signals are supplied from the inverter 1105a of the controller side 1101 to the third P-channel transistor 1115 and the sixth N-channel transistor 1122 which are TFTs for clock synchronization of the clocked inverters 1106a and 1106b of the TFT side 1102 through wirings 1107 and 1108. Signals are supplied from the inverter 1105b of the controller side 1101 to the fourth N-channel transistor 1118 and the fifth P-channel transistor 1119 which are TFTs for clock synchronization of the clocked inverters 1106a and 1106b of the TFT side 1102 through wirings 1109 and 1110. In addition, by a high-potential side power supply line 1103 and a low-potential side power supply line 1104, power supply voltage used in the inverters 1105a and 1105b is also supplied to each of the clocked inverters 1106a and 1106b formed over a glass substrate by using a crystalline TFT. That is, the same power supply voltage is used in the controller side 1101 and the TFT side 1102. Therefore, the high-potential side power supply line 1103 is connected to the P-channel transistors of the inverters 1105a and 1105b and the clocked inverters 1106a and 1106b. Further, the low-potential side power supply line 1104 is connected to the N-channel transistors of the inverters 1105a and 1105b and the clocked inverters 1106a and 1106b. Thus, a level shifter is not necessary. Each off the clocked inverters 1106a and 1106b has excellent current characteristics because an active layer is almost in a single-crystal state. Further, the absolute value of the threshold voltage is small and mobility is high. Therefore, even when the same power supply voltage as an IC is supplied, each of the clocked inverters 1106a and 1106b can be operated. Accordingly, a small thin display device with low power consumption can be formed. Furthermore, since the amplitude of signals which are output from the inverters 1105a and 1105b and are input to the clocked inverters 1106a and 1106b is equal to that of the power supply voltage, the circuit is operated adequately and a waveform is not distorted.

Figure 13A:
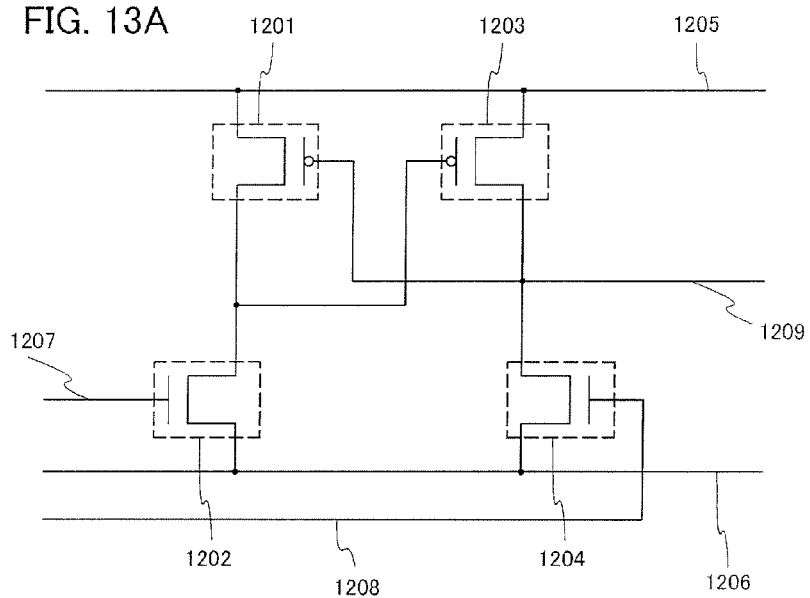
FIGS. 13A and 13B each illustrate a structure of a semiconductor device in accordance with an embodiment mode of the present invention.
Figure 13B:
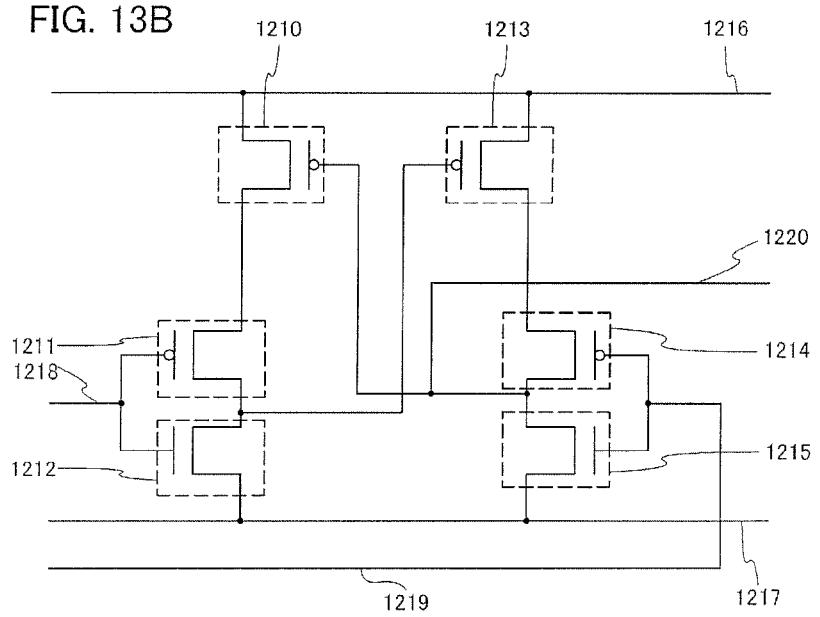

Next, structural examples of the level shifter 502 shown in FIG. 2 and the level shifter 702 shown in FIG. 5 are described FIGS. 13A and 13B are circuit diagrams. A level shifter in FIG. 13A includes a first P-channel transistor 1201, a first N-channel transistor 1202, a second P-channel transistor 1203, and a second N-channel transistor 1204. The first P-channel transistor 1201 and the second P-channel transistor 1203 are connected by a high-potential side power supply line 1205. The first N-channel transistor 1202 and the second N-channel transistor 1204 are connected by a low-potential side power supply line 1206. A signal is input from a wiring 1207, an inverted signal is input from a wiring 1208; and an amplified signal is output from a wiring 1209. A level shifter in FIG. 13B includes a first P-channel transistor 1210, a second P-channel transistor 1211, a first N-channel transistor 1212, a third P-channel transistor 1213, a fourth P-channel transistor 1214, and a second N-channel transistor 1215. The first P-channel transistor 1210 and the third P-channel transistor 1213 are connected by a high-potential side power supply line 1216. The first N-channel transistor 1212 and the second N-channel transistor 1215 are connected by a low-potential side power supply line 1217. A signal is input from a wiring 1218; an inverted signal is input from a wiring 1219; and an amplified signal is output from a wiring 1220. Note that in each of the level shifters in FIGS. 13A and 13B, there is a case in which a waveform of an output signal takes long time to be uniform and the level shifter cannot be operated adequately. In the case of a circuit using a crystalline TFT, operations are performed at low voltage for a long time and the voltage is level shifted to high voltage right before a pixel. Therefore, the amount of level shift is extremely large and a waveform of an output signal takes long time to be uniform.

Figure 14:
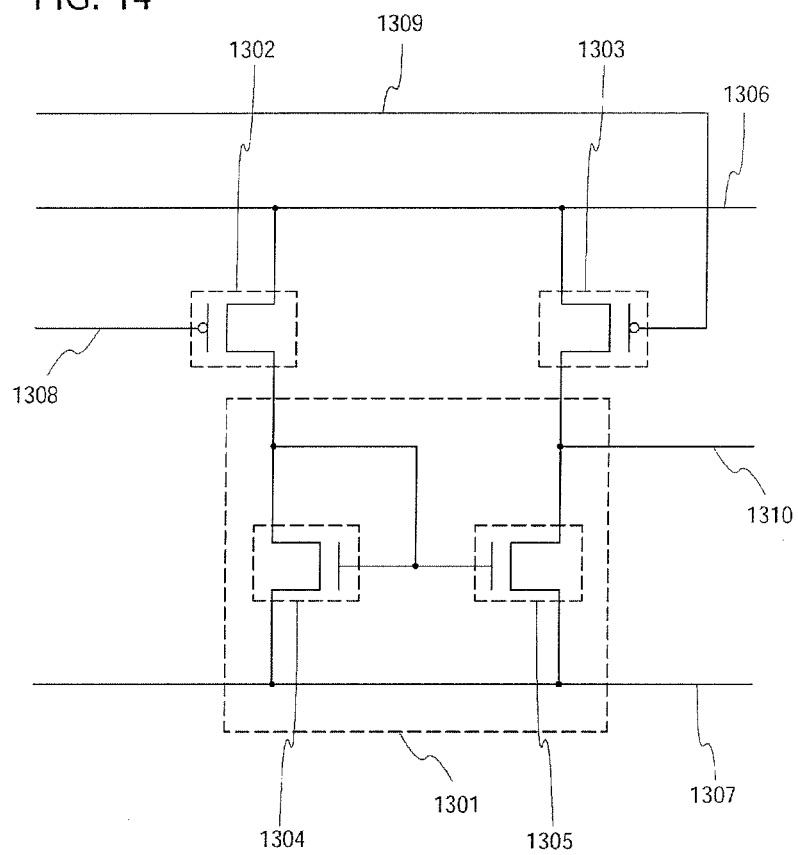
FIG. 14 illustrates a structure of a semiconductor device in accordance with an embodiment mode of the present invention.
Figure 15:
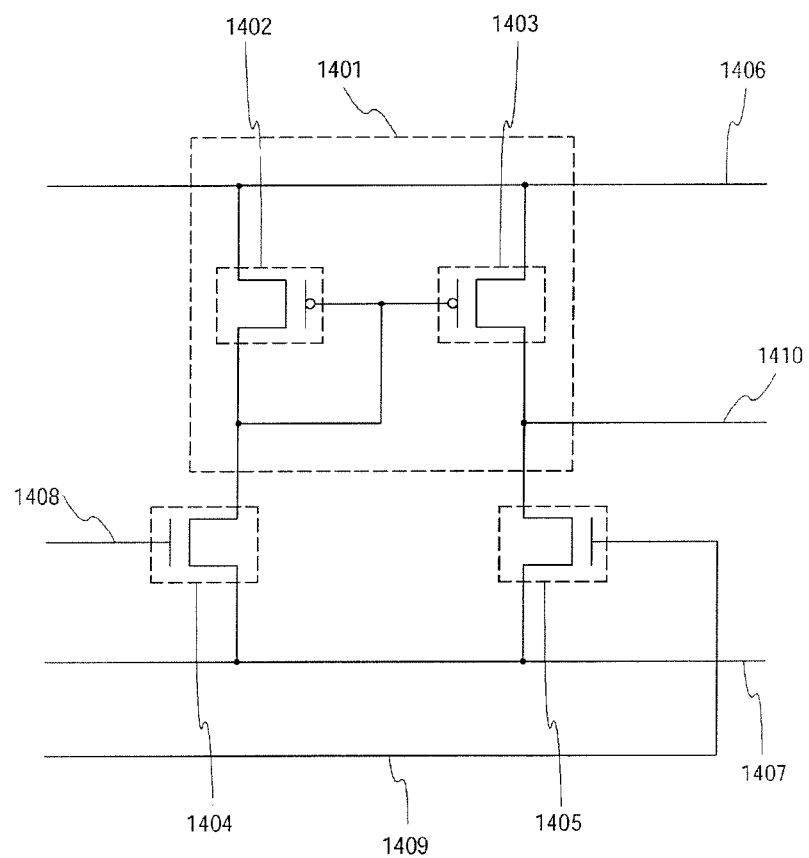
FIG. 15 illustrates a structure of a semiconductor device in accordance with an embodiment mode of the present invention.
Figure 16:
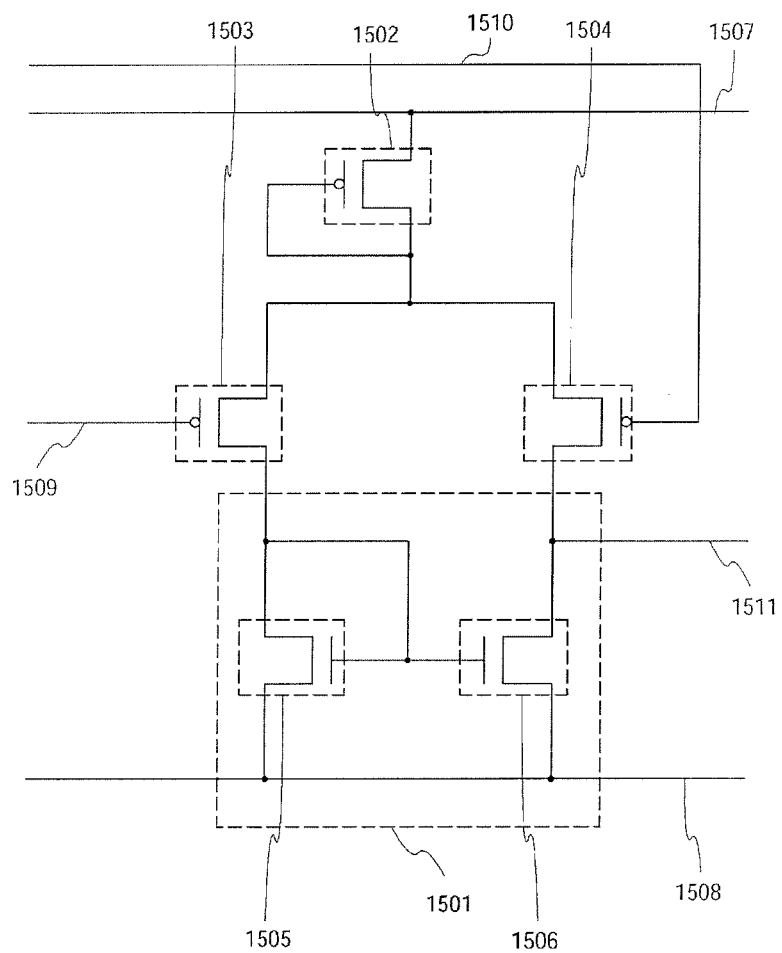
FIG. 16 illustrates a structure of a semiconductor device in accordance with an embodiment mode of the present invention.

Thus, as shown in FIGS. 14 to 16, a level shifter circuit provided with an active load circuit (also referred to as an active load, a current mirror circuit, or the like) may be used FIG. 14 shows a level shifter in which an active load circuit 1301 formed using N-channel transistors is used. The level shifter in FIG. 14 includes a first P-channel transistor 1302, a second P-channel transistor 1303, a first N-channel transistor 1304, and a second N-channel transistor 1305. The first P-channel transistor 1302 and the second P-channel transistor 1303 are connected by a high-potential side power supply line 1306. The first N-channel transistor 1304 and the second N-channel transistor 1305 are connected by a low-potential side power supply line 1307. A signal is input from a wiring 1308; an inverted signal is input from a wiring 1309; and an amplified signal is output from a wiring 1310. The active load circuit 1301 includes the first N-channel transistor 1304 and the second N-channel transistor 1305. Gate electrodes of the two transistors are connected to each other, and the gate electrode and a drain electrode of the first N-channel transistor 1304 are connected.

FIG. 15 shows a level shifter in which an active load circuit 1401 formed using P-channel transistors is used. The level shifter in FIG. 15 includes a first P-channel transistor 1402, a second P-channel transistor 1403, a first N-channel transistor 1404, and a second N-channel transistor 1405. The first P-channel transistor 1402 and the second P-channel transistor 1403 are connected by a high-potential side power supply line 1406. The first N-channel transistor 1404 and the second N-channel transistor 1405 are connected by a low-potential side power supply line 1407. A signal is input from a wiring 1408, an inverted signal is input from a wiring 1409; and an amplified signal is output from a wiring 1410. The active load circuit 1401 includes the first P-channel transistor 1402 and the second P-channel transistor 1403. Gate electrodes of the two transistors are connected to each other, and the gate electrode and a drain electrode of the first P-channel transistor 1402 are connected.

FIG. 16 shows a level shifter which is similar to a differential amplifier circuit, in which an active load circuit 1501 is used. The level shifter in FIG. 16 includes a first P-channel transistor 1502, a second P-channel transistor 1503, a third P-channel transistor 1504, a first N-channel transistor 1505, and a second N-channel transistor 1506. The first P-channel transistor 1502 is connected by a high-potential side power supply line 1507. The first N-channel transistor 1505 and the second N-channel transistor 1506 are connected by a low-potential side power supply line 1508. A signal is input from a wiring 1509; an inverted signal is input from a wiring 1510; and an amplified signal is output from a wiring 1511. The active load circuit 1501 includes the first N-channel transistor 1505 and the second N-channel transistor 1506. Gate electrodes of the two transistors are connected to each other, and the gate electrode and a drain electrode of the first N-channel transistor 1505 are connected.

When such a level shifter circuit provided with an active load circuit is used, output signals can be switched quickly. Therefore, even if the amount of level shift is extremely large, level shift can be performed adequately.

Figure 17:
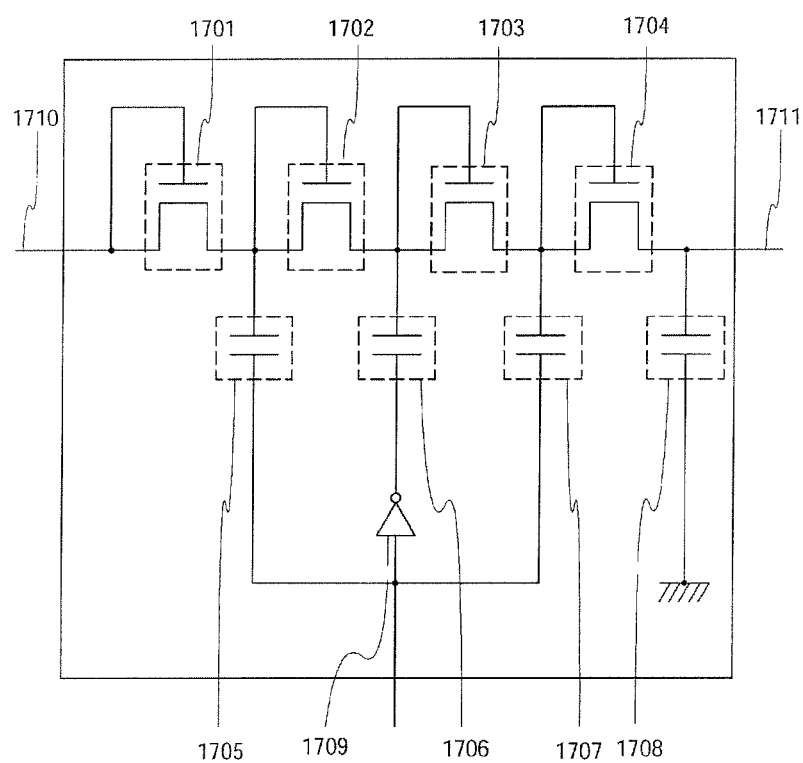
FIG. 17 illustrates a structure of a semiconductor device in accordance with an embodiment mode of the present invention.

Next, FIG. 17 shows a specific example of the dc-dc converter 301. The dc-dc converter 301 in FIG. 17 includes first to fourth transistors 1701 to 1704, first to fourth capacitors 1705 to 1708, and an inverter 1709. Voltage input from a wiring 1710 is boosted and is output from a wiring 1711. When a charge pump circuit is used, the dc-dc converter can be formed. When the number of transistors and capacitors is changed, output voltage can be adjusted.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof an example of detailed description thereof, an application example thereof, an example of related part thereof, or the like. Therefore, the contents described in other embodiment modes can be freely applied to, combined with, or replaced with this embodiment mode.

Embodiment Mode 3

Next, a method for manufacturing a single-crystal TFT is described.

Figure 18A:
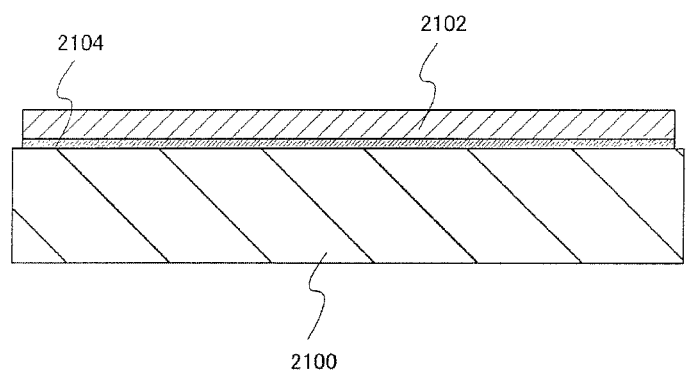
FIGS. 18A and 18B illustrate manufacturing steps of a semiconductor device in accordance with an embodiment mode of the present invention.
Figure 18B:
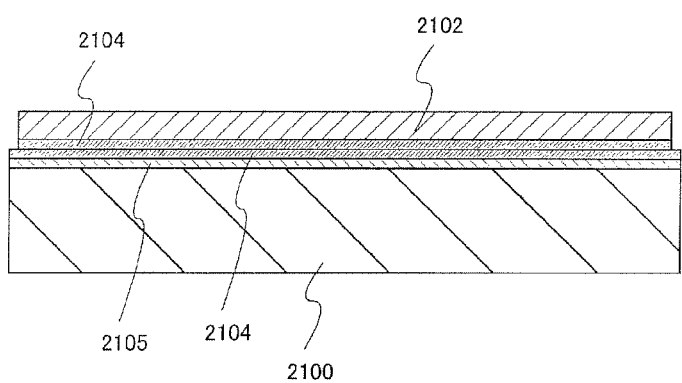

FIGS. 18A and 18B each show an SOI substrate. In FIG. 18A, a base substrate 2100 is a substrate having an insulating surface or an insulating substrate, and any of various glass substrates which are used in the electronics industry, such as aluminosilicate glass substrates, aluminoborosilicate glass substrates, and barium borosilicate glass substrates can be used. Alternatively, a quartz glass substrate or a semiconductor substrate such as a silicon wafer can be used. An SOI layer 2102 is a single-crystal semiconductor, and single-crystal silicon is typically used. Alternatively, a single-crystal semiconductor layer formed of silicon, germanium, or a compound semiconductor such as gallium arsenide or indium phosphide which can be separated from a single-crystal semiconductor substrate by a separation method of hydrogen ion implantation can be used.

Between the base substrate 2100 and the SOI layer 2102 described above, a bonding layer 2104 which has a smooth surface and forms a hydrophilic surface is provided. A silicon oxide layer is suitable as the bonding layer 2104. In particular, a silicon oxide film formed by a chemical vapor deposition method using an organic silane gas is preferable. As an organic silane gas, a silicon-containing compound such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), or trisdimethylaminosilane (chemical formula: $SiH(N(CH_3)_2)_3$) can be used.

The bonding layer 2104 which has a smooth surface and forms a hydrophilic surface is provided with a thickness of 5 to 500 nm. With such a thickness, roughness of a surface on which the bonding layer 2104 is formed can be smoothed and smoothness of a growth surface of the film can be ensured. In addition, distortion between a substrate and the SOI layer which are bonded to each other can be reduced. The base substrate 2100 may be provided with a similar silicon oxide layer. That is, when the SOI layer 2102 is bonded to the base substrate 2100 which is a substrate having an insulating surface or an insulating substrate, the base substrate 2100 and the SOI layer 2102 can be firmly bonded to each other when the bonding layer 2104 formed of a silicon oxide layer which is preferably formed using organic silane as a material is provided on either one or both surfaces of the base substrate 2100 and the SOI layer 2102 which are to be bonded.

FIG. 18B shows a structure in which the base substrate 2100 is provided with a barrier layer 2105 and the bonding layers 2104. In the case of bonding the SOI layer 2102 to the base substrate 2100, the SOI layer 2102 can be prevented from being contaminated by diffusion of impurities such as mobile ions like alkali metal or alkaline earth metal from a glass substrate which is used as the base substrate 2100. A bonding layer 2104 on the base substrate 2100 side may be provided as appropriate.

Figure 19A:
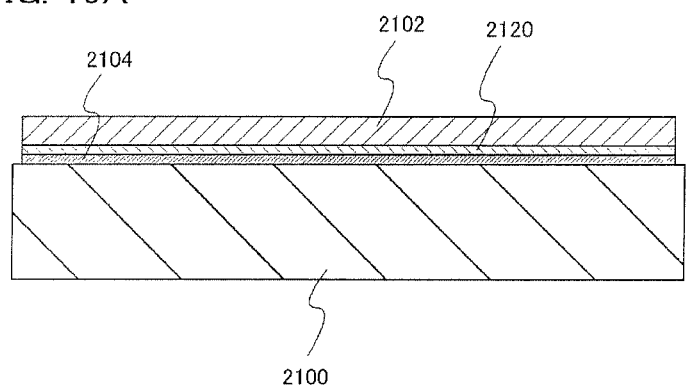
FIGS. 19A and 19B illustrate manufacturing steps of a semiconductor device in accordance with an embodiment mode of the present invention.

FIG. 19A shows a structure in which a nitrogen-containing insulating layer 2120 is provided between the SOI layer 2102 and the bonding layer 2104. The nitrogen-containing insulating layer 2120 is formed by stacking one or a plurality of films selected from a silicon nitride layer, a silicon nitride oxide layer, and a silicon oxynitride layer. For example, the nitrogen-containing insulating layer 2120 can be formed by stacking a silicon oxynitride layer and a silicon nitride oxide layer from the SOI layer 2102 side. The bonding layer 2104 is provided in order to form a bond with the base substrate 2100, whereas the nitrogen-containing insulating layer 2120 is preferably provided in order to prevent the SOI layer 2102 from being contaminated by diffusion of impurities such as mobile ions or moisture.

Note that here, a silicon oxynitride film corresponds to a film which contains much oxygen man nitrogen, and in the case where measurement is performed using Rutherford backscattering spectrometry (RBS) and hydrogen forward scattering (HFS), includes oxygen, nitrogen, silicon, and hydrogen at concentrations ranging from 50 to 70 at. %, 0.5 to 15 at. %, 25 to 35 at. %, and 0.1 to 10 at. %, respectively. Further, a silicon nitride oxide film corresponds to a film which contains much nitrogen than oxygen and includes oxygen, nitrogen, silicon, and hydrogen at concentrations ranging from 5 to 30 at. %, 20 to 55 at. %, 25 to 35 at. %, and 10 to 30 at. %, respectively, in the case where measurement is performed using RBS and HFS. Note that percentages of nitrogen, oxygen, silicon, and hydrogen fall within the ranges given above if the total number of atoms contained in the silicon oxynitride film or the silicon nitride oxide film is defined as 100 at. %.

Figure 19B:
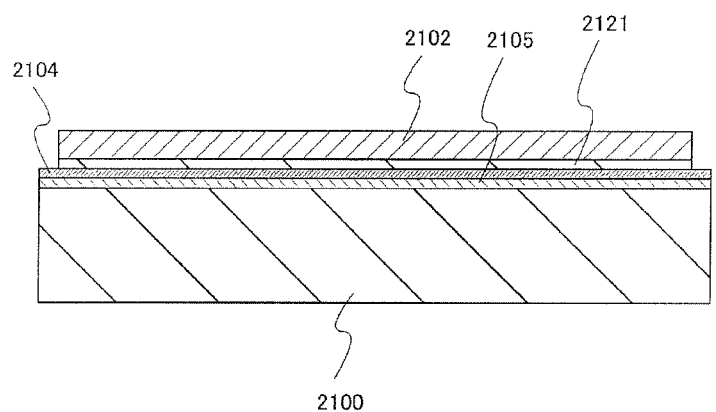

FIG. 19B shows a structure in which the base substrate 2100 is provided with the bonding layer 2104. Between the base substrate 2100 and the bonding layer 2104, the barrier layer 2105 is preferably provided. The barrier layer 2105 is provided in order to prevent the SOI layer 2102 from being contaminated by diffusion of impurities such as mobile ions like alkali metal or alkaline earth metal from a glass substrate which is used as the base substrate 2100. In addition, the SOI layer 2102 is provided with a silicon oxide layer 2121. This silicon oxide layer 2121 forms a bond with the bonding layer 2104 to fix the SOI layer 2102 over the base substrate 2100. The silicon oxide layer 2121 is preferably formed by thermal oxidation. Alternatively, similarly to the bonding layer 2104, the silicon oxide layer 2121 may be formed by a chemical vapor deposition method using TEOS. Further alternatively, as the silicon oxide layer 2121, chemical oxide can be used. Chemical oxide can be formed by, for example, performing treatment on a surface of a semiconductor substrate by using ozone-containing water. Chemical oxide is preferable because it reflects flatness of the surface of the semiconductor substrate.

A method for manufacturing such an SOI substrate is described with reference to FIGS. 20A to 20C and FIG. 21.

Figure 20A:
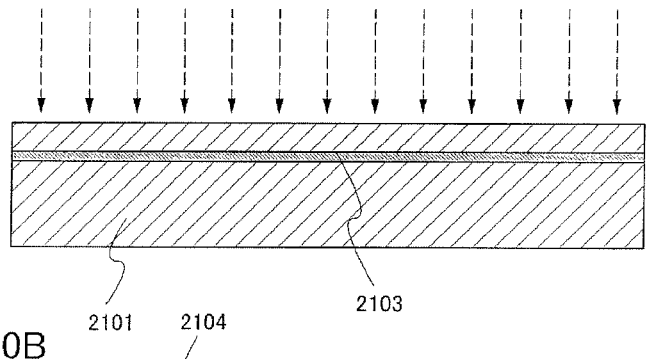
FIGS. 20A to 20C illustrate manufacturing steps of a semiconductor device in accordance with an embodiment mode of the present invention.

A semiconductor substrate 2101 shown in FIG. 20A is cleaned, and ions which are accelerated by an electric field are added to reach a predetermined depth from the surface of the semiconductor substrate 2101 to form a weakened layer 2103. Ions are added in consideration of the thickness of an SOI layer which is to be transferred to a base substrate. The thickness of the SOI layer is 5 to 500 nm, preferably 10 to 200 nm. Accelerating voltage for adding ions to the semiconductor substrate 2101 is set in consideration of such a thickness. The weakened layer 2103 is formed by adding ions of hydrogen, helium, or halogen typified by fluorine. In this case, it is preferable to add one kind of ions or plural kinds of ions of different mass numbers consisting of a single kind of atoms. In the case of adding hydrogen ions, the hydrogen ions preferably include $H^-$, $H_2^+$, and $H_3^+$ ions with a high proportion of $H_3^+$ ions. With a high proportion of $H_3^+$ ions, addition efficiency can be increased and addition time can be shortened. With such a structure, separation can be easily performed.

Since it is necessary to add ions at a high dose, the surface of the semiconductor substrate 2101 is roughened in some cases. Therefore, a protective film against addition of ions may be provided on a surface to which ions are added by using a silicon nitride layer, a silicon nitride oxide layer, or the like with a thickness of 50 to 200 nm.

Figure 20B:
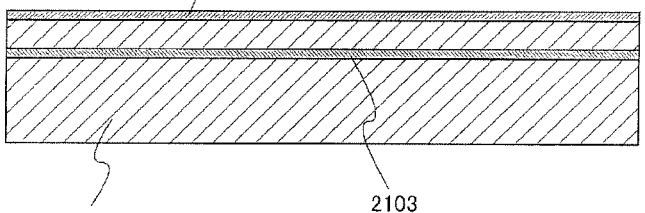

Next, as shown in FIG. 20B, a silicon oxide layer is formed over a surface to which the base substrate is bonded as a bonding layer 2104. As the silicon oxide layer, a silicon oxide layer formed by a chemical vapor deposition method using an organic silane gas as described above is preferably used. Alternatively, a silicon oxide layer formed by a chemical vapor deposition method using a silane gas can be used. In film formation by a chemical vapor deposition method, film formation temperature at, for example, 350° C. or lower, at which degassing of the weakened layer 2103 formed in a single-crystal semiconductor substrate does not occur, is used. Heat treatment for separating an SOI layer from a single-crystal or polycrystalline semiconductor substrate is performed at a higher temperature than the film formation temperature.

Figure 20C:
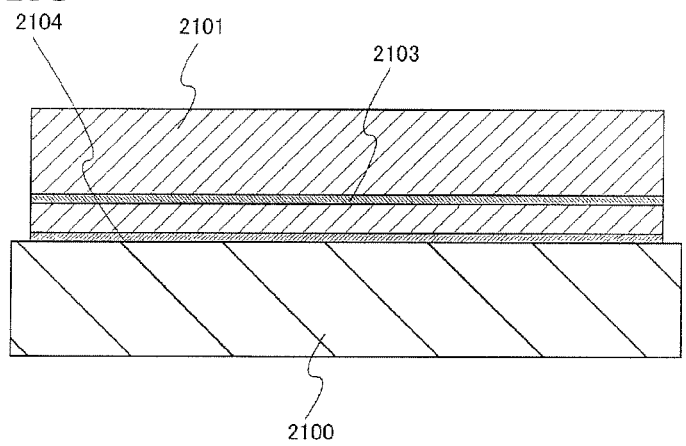

FIG. 20C shows a mode in which a surface of the base substrate 2100 and a surface of the semiconductor substrate 2101, on which the bonding layer 2104 is formed are disposed in contact to be bonded to each other. The surfaces which are to be bonded are cleaned sufficiently. Then, when the base substrate 2100 and the bonding layer 2104 are disposed in contact, a bond is formed. This bond is formed by Van der Waals forces. When the base substrate 2100 and the semiconductor substrate 2101 are pressed against each other, a stronger bond can be formed by hydrogen bonding.

In order to form a favorable bond, the surfaces which are to form a bond may be activated. For example, the surfaces which are to form a bond are irradiated with an atomic beam or an ion beam. When an atomic beam or an ion beam is used, an inert gas neutral atom beam or inert gas ion beam of argon or the like can be used. Alternatively, plasma irradiation or radical treatment is performed. With such a surface treatment, a bond between different kinds of materials can be easily formed even at a temperature of 200 to 400° C.

After the base substrate 2100 and the semiconductor substrate 2101 are bonded to each other with the bonding layer 2104 interposed therebetween, heat treatment or pressure treatment is preferably performed. When heat treatment or pressure treatment is performed, bonding strength can be increased. Temperature of heat treatment is preferably lower than or equal to the upper temperature limit of the base substrate 2100. Pressure treatment is performed so that pressure is applied in a perpendicular direction to the bonded surface, in consideration of pressure resistance of the base substrate 2100 and the semiconductor substrate 2101.

Figure 21:
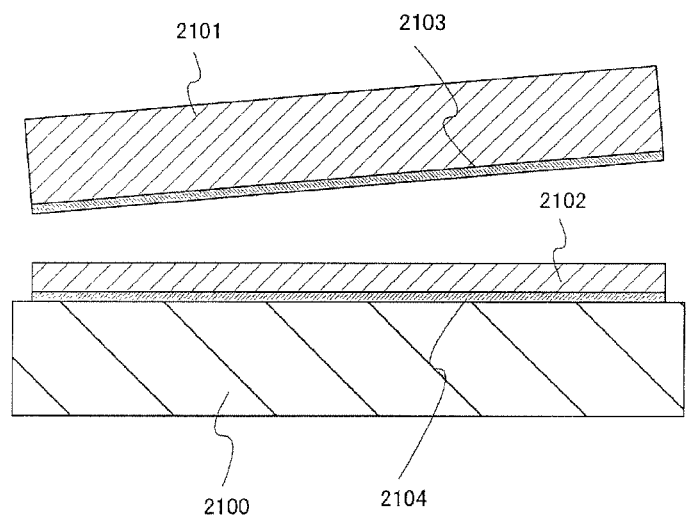
FIG. 21 illustrates a manufacturing step of a semiconductor device in accordance with an embodiment mode of the present invention.

In FIG. 21, after the base substrate 2100 and the semiconductor substrate 2101 are bonded to each other, heat treatment is performed to separate the semiconductor substrate 2101 from the base substrate 2100 with the weakened layer 2103 used as a cleavage plane. The heat treatment is preferably performed at a temperature ranging from the film formation temperature of the bonding layer 2104 to the upper temperature limit of the base substrate 2100. When the heat treatment is performed at, for example, 400 to 600° C., the volume of fine voids formed in the weakened layer 2103 is changed, so that cleavage can be performed along the weakened layer 2103. Since the bonding layer 2104 is bonded to the base substrate 2100, the SOI layer 2102 having the same crystallinity as the semiconductor substrate 2101 remains over the base substrate 2100.

Figure 22A:
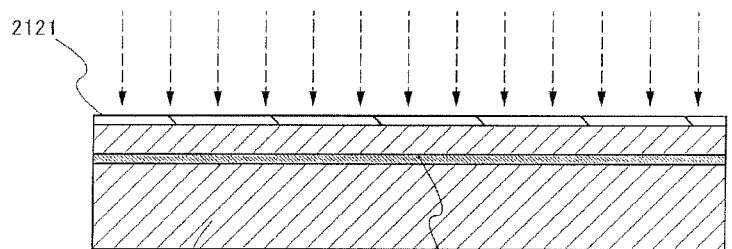
FIGS. 22A to 22C illustrate manufacturing steps of a semiconductor device in accordance with an embodiment mode of the present invention.
Figure 22B:
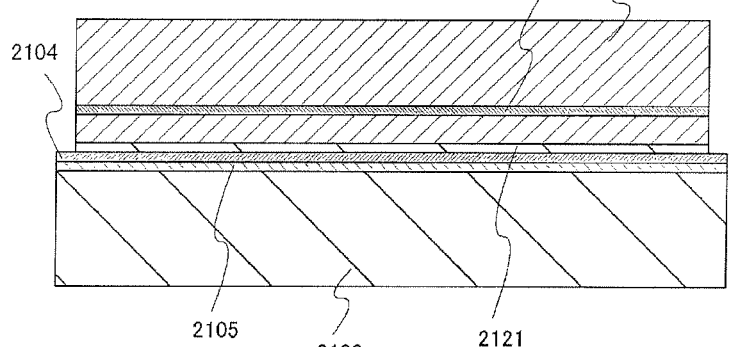
Figure 22C:
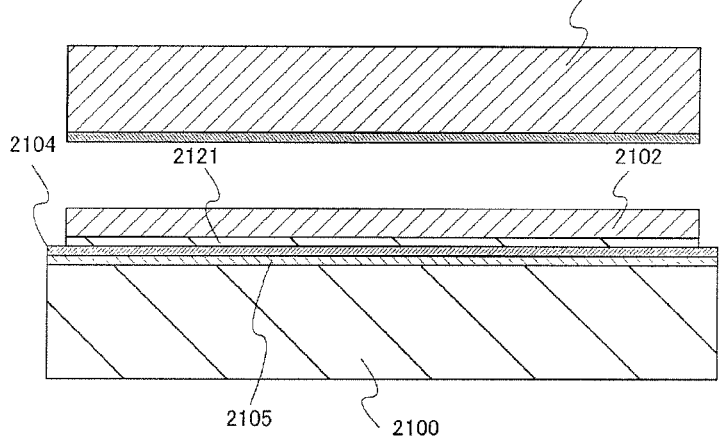

FIGS. 22A to 22C show steps of forming an SOI layer with a bonding layer provided on the base substrate 2100 side. FIG. 22A shows a step in which ions which are accelerated by an electric field are added to the semiconductor substrate 2101 which is provided with the silicon oxide layer 2121 to reach a predetermined depth to form the weakened layer 2103. Addition of ions of hydrogen, helium, or a halogen typified by fluorine is performed similarly to the case shown in FIG. 20A. When the silicon oxide layer 2121 is formed on the surface of the semiconductor substrate 2101, the surface of the semiconductor substrate 2101 can be prevented from being damaged by ion doping and from losing its flatness.

FIG. 22B shows a step in which a surface of the base substrate 2100 provided with the barrier layer 2105 and the bonding layer 2104 and the surface of the semiconductor substrate 2101, on which the silicon oxide layer 2121 is formed are disposed in contact to be bonded. A bond is formed when the bonding layer 2104 over the base substrate 2100 is disposed in contact with the silicon oxide layer 2121 formed on the semiconductor substrate 2101.

After that, as shown in FIG. 22C, the semiconductor substrate 2101 is separated. Heat treatment for separating the semiconductor substrate 2101 is performed similarly to the case shown in FIG. 21. In this manner, the SOI substrate shown in FIG. 19B can be obtained.

In this manner, in accordance with this mode, even if a substrate with an upper temperature limit of 700° C. or lower, such as a glass substrate, is used as the base substrate 2100, the SOI layer 2102 having strong adhesiveness of a bonded portion can be obtained. As the base substrate 2100, any of various glass substrates which are used in the electronics industry and are referred to as non-alkali glass substrates, such as aluminosilicate glass substrates, aluminoborosilicate glass substrates, and barium borosilicate glass substrates can be used. That is, a single-crystal semiconductor layer can be formed over a substrate which is longer than one meter on a side. When such a large-area substrate is used, not only a display device such as a liquid crystal display but also a semiconductor integrated circuit can be manufactured.

Figure 27A:
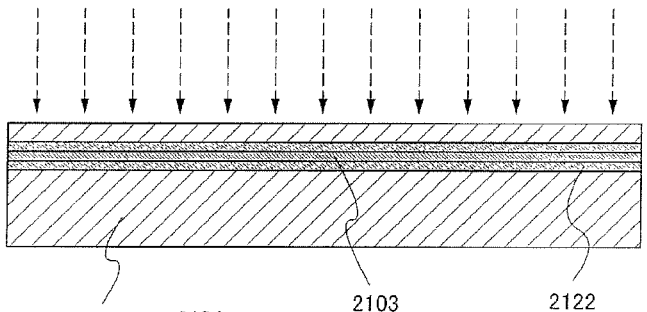
FIGS. 27A to 27C illustrate manufacturing steps of a semiconductor device in accordance with an embodiment mode of the present invention.

FIGS. 27A to 28B show steps of forming an SOI layer with a BOX layer 2122 provided in the semiconductor substrate 2101. Here, a BOX layer corresponds to a buried oxide layer formed using a silicon oxide. FIG. 27A shows a step in which ions which are accelerated by an electric field are added to the semiconductor substrate 2101 which is provided with the BOX layer 2122 to reach a predetermined depth to form the weakened layer 2103. Addition of ions of hydrogen, helium, or a halogen typified by fluorine is performed similarly to the case shown in FIG. 20A. Here, a peak position in ion distribution is set to be in the BOX layer 2122. That is, the weakened layer 2103 is provided in the BOX layer 2122.

Figure 27B:
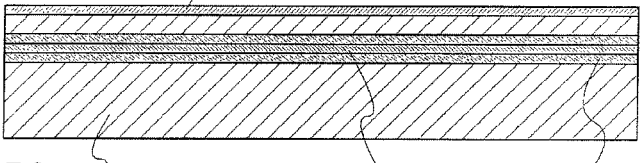

FIG. 27B shows a step of forming a silicon oxide layer over a surface to which the base substrate is bonded as a bonding layer 2104. As the silicon oxide layer, a silicon oxide layer formed by a chemical vapor deposition method using an organic silane gas as described above is preferably used. Alternatively, a silicon oxide layer formed by a chemical vapor deposition method using a silane gas can be used. In film formation by a chemical vapor deposition method, film formation temperature at, for example, 350° C. or lower, at which degassing of the weakened layer 2103 formed in a single-crystal semiconductor substrate does not occur, is used. Heat treatment for separating an SOI layer from a single-crystal or polycrystalline semiconductor substrate is performed at a higher temperature than the film formation temperature.

Figure 27C:
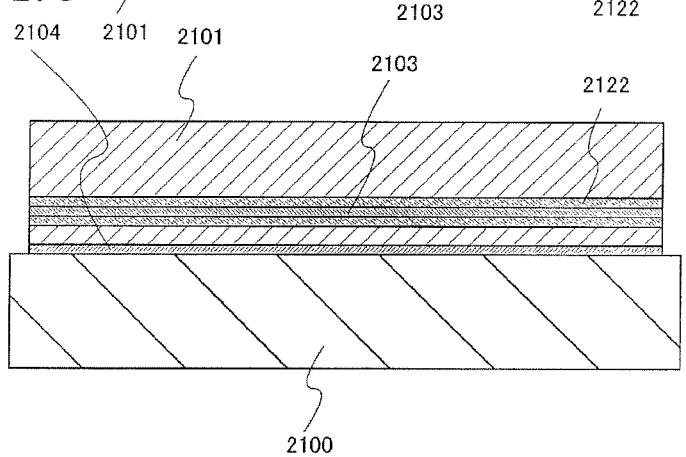

FIG. 27C shows a step in which a surface of the base substrate 2100 and a surface of the semiconductor substrate 2101, on which the bonding layer 2104 is formed are disposed in contact to be bonded to each other. The surfaces which are to be bonded are cleaned sufficiently. Then, when the base substrate 2100 and the bonding layer 2104 are disposed in contact, a bond is formed. This bond is formed by Van der Waals forces. When the base substrate 2100 and the semiconductor substrate 2101 are pressed against each other, a stronger bond can be formed by hydrogen bonding.

In order to form a favorable bond, the surfaces which are to form a bond may be activated. For example, the surfaces which are to form a bond are irradiated with an atomic beam or an ion beam. When an atomic beam or an ion beam is used, an inert gas neutral atom beam or inert gas ion beam of argon or the like can be used. Alternatively, plasma irradiation or radical treatment is performed. With such a surface treatment, a bond between different kinds of materials can be easily formed even at a temperature of 200 to 400° C.

After the base substrate 2100 and the semiconductor substrate 2101 are bonded to each other with the bonding layer 2104 interposed therebetween, heat treatment or pressure treatment is preferably performed. When heat treatment or pressure treatment is performed, bonding strength can be increased. Temperature of heat treatment is preferably lower than or equal to the upper temperature limit of the base substrate 2100. Pressure treatment is performed so that pressure is applied in a perpendicular direction to the bonded surface, in consideration of pressure resistance of the base substrate 2100 and the semiconductor substrate 2101.

Figure 28A:
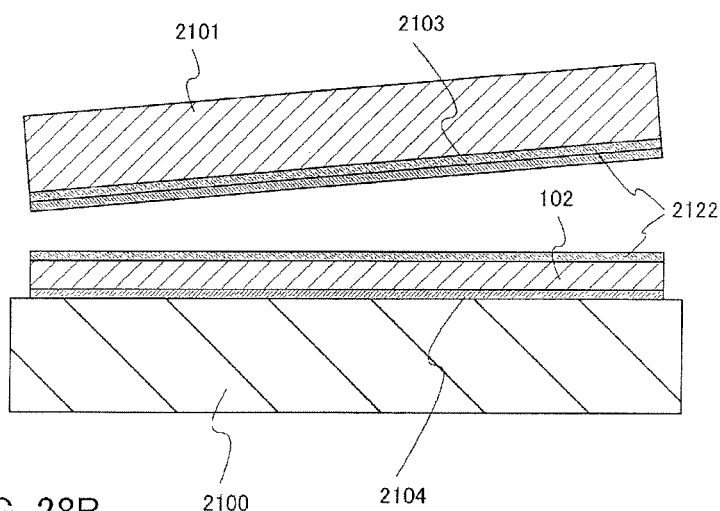
FIGS. 28A and 28B illustrate manufacturing steps of a semiconductor device in accordance with an embodiment mode of the present invention.

In FIG. 28A, after the base substrate 2100 and the semiconductor substrate 2101 are bonded to each other, heat treatment is performed to separate the semiconductor substrate 2101 from the base substrate 2100 with the weakened layer 2103 used as a cleavage plane. The heat treatment is preferably performed at a temperature ranging from the film formation temperature of the bonding layer 2104 to the upper temperature limit of the base substrate 2100. When the heat treatment is performed at, for example, 400 to 600° C., the volume of fine voids formed in the weakened layer 2103 is changed, so that cleavage can be performed along the weakened layer 2103. Since the bonding layer 2104 is bonded to the base substrate 2100, the SOI layer 2102 having the same crystallinity as the semiconductor substrate 2101 remains over the base substrate 2100.

Figure 28B:
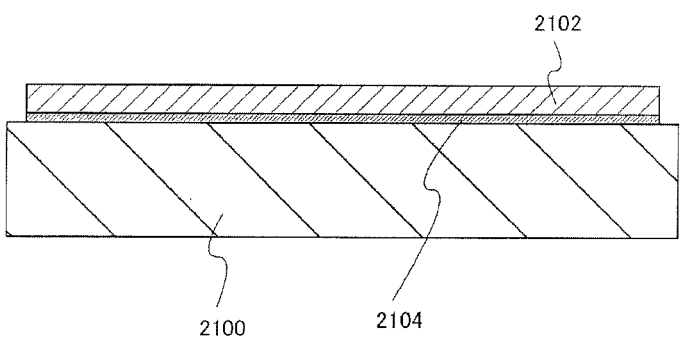

FIG. 28B shows a step of removing the BOX layer 2122 which remains over the base substrate 2100 by wet etching using dilute hydrofluoric acid.

In the steps shown in FIGS. 27A to 28B, a dangling bond, a crystal defect, or the like of a separated surface are generated in the BOX layer 2122. That is, a dangling bond, a crystal defect, or the like are not generated in a semiconductor layer included m the base substrate 2100. In addition, when the BOX layer 2122 is removed, the semiconductor layer can be prevented from losing uniformity of the film thickness.

Figure 23A:
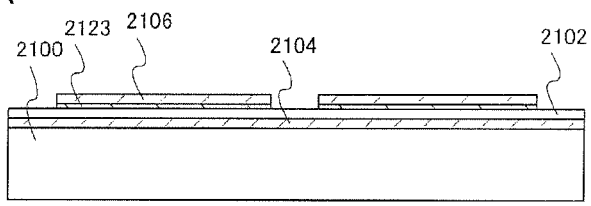
FIGS. 23A to 23E illustrate manufacturing steps of a semiconductor device in accordance with an embodiment mode of the present invention.

Subsequently, a semiconductor device using an SOI substrate is described with reference to FIGS. 23A to 23E and FIGS. 24A and 24B. In FIG. 23A, the SOI layer is provided over the base substrate 2100 with the bonding layer 2104 interposed therebetween. Over the SOI layer 2102, a silicon nitride layer 2123 and a silicon oxide layer 2106 are formed in accordance with an element formation region. The silicon oxide layer 2106 is used as a hard mask when the SOI layer 2102 is etched for element isolation. The silicon nitride layer 2123 functions as an etching stopper.

The thickness of the SOI layer 2102 is 5 to 500 nm, preferably 10 to 200 nm. The thickness of the SOI layer 2102 can be set as appropriate by controlling the depth of the weakened layer 2103 shown in FIGS. 20A to 20C. In order to control die threshold voltage, a p-type impurity such as boron, aluminum, or gallium is added to the SOI layer 2102. For example, boron may be added as a p-type impurity at a concentration of $5 \times 10^{17}$ to $1 \times 10^{18}$ cm$^{-3}$.

Figure 23B:
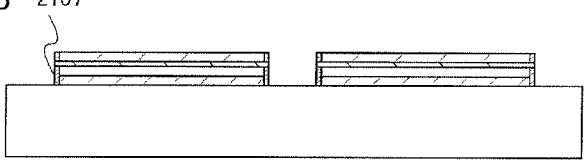

FIG. 23B shows a step of etching the SOI layer 2102 and the bonding layer 2104 by using the silicon oxide layer 2106 as a mask. Exposed end surfaces of the SOI layer 2102 and the bonding layer 2104 are nitrided by plasma treatment. By this nitridation treatment, a silicon nitride layer 2107 is formed at least at a peripheral end portion of the SOI layer 2102. The silicon nitride layer 2107 has insulating properties and has an effect of preventing leakage current from flowing through an end surface of the SOI layer 2102. In addition, since the silicon nitride layer 2107 has resistance to oxidation, it can prevent an oxide film from growing from the end surface into a bird's beak between the SOI layer 2102 and the bonding layer 2104.

Figure 23C:
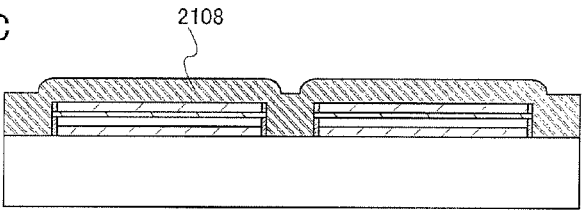

FIG. 23C shows a step of depositing an element isolation insulating layer 2108. As the element isolation insulating layer 2108, a silicon oxide film is deposited by a chemical vapor deposition method by using TEOS. The element isolation insulating layer 2108 is deposited thickly so that the SOI layer 2102 is buried.

Figure 23D:
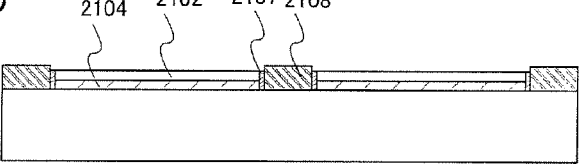

FIG. 23D shows a step of removing the element isolation insulating layer 2108 to expose the silicon nitride layer 2123. This removing step can be performed by dry etching, or may be performed by chemical mechanical polishing. The silicon nitride layer 2123 functions as an etching stopper. The element isolation insulating layer 2108 remains so as to be embedded between the SOI layers 2102. After that, the silicon nitride layer 2123 is removed.

Figure 23E:
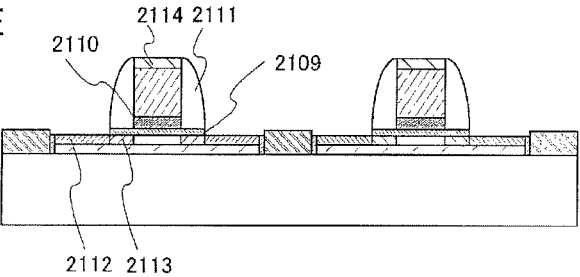

In FIG. 23E, after the SOI layer 2102 is exposed, a gate insulating layer 2109, a gate electrode 2110, and a sidewall insulating layer 2111 are formed, and a first impurity region 2112 and a second impurity region 2113 are formed. An insulating layer 2114 is formed using silicon nitride and is used as a hard mask when the gate electrode 2110 is etched.

Figure 24A:
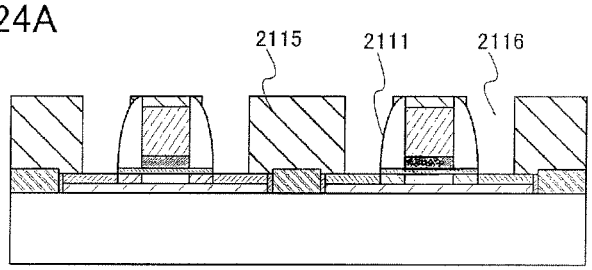
FIGS. 24A and 24B illustrate manufacturing steps of a semiconductor device in accordance with an embodiment mode of the present invention.

In FIG. 24A, an interlayer insulating layer 2115 is formed. As the interlayer insulating layer 2115, a borophosphosilicate glass (BPSG) film is formed and then planarized by reflow. Alternatively, a silicon oxide layer may be formed using TEOS and then planarized by chemical mechanical polishing. In planarization treatment, the insulating layer 2114 over the gate electrode 2110 functions as an etching stopper. A contact hole 2116 is formed in the interlayer insulating layer 2115. The contact hole 2116 is formed in a self-aligned manner by utilizing the sidewall insulating layer 2111.

Figure 24B:
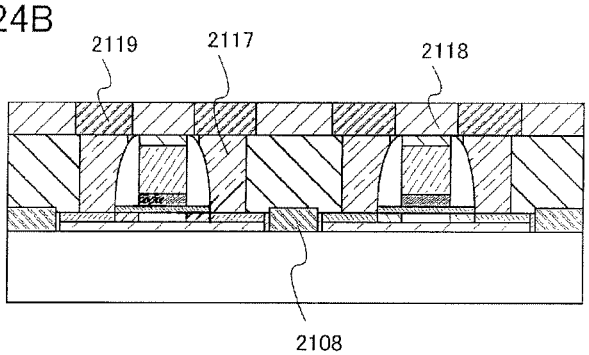

After that, as shown in FIG. 24B, a contact plug 2117 is formed by CVD by using tungsten hexafluoride. Further, an insulating layer 2118 is formed; an opening is formed in accordance with the contact plug 2117; and a wiring 2119 is provided. The wiring 2119 is formed using aluminum or an aluminum alloy and is provided with upper and lower metal films of molybdenum, chromium, titanium, or the like as barrier metal films.

In this manner, a field effect transistor can be manufactured using the SOI layer 2102 which is bonded to the base substrate 2100. Since the SOI layer 2102 in accordance with this mode is a single-crystal semiconductor with uniform crystal orientation, high-performance field-effect transistors which are uniform can be obtained. That is, variation in values of important transistor characteristics, such as the threshold voltage and mobility can be suppressed, so that high performance such as high mobility can be achieved.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 4

Figure 25A:
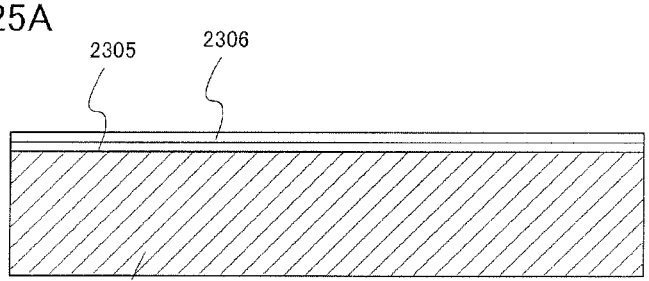
FIGS. 25A to 25C illustrate manufacturing steps of a semiconductor device in accordance with an embodiment mode of the present invention.

A method for manufacturing an SOI substrate is described with reference to FIGS. 25A to 25C and FIGS. 26A and 26B. In FIG. 25A, a silicon oxynitride layer 2305 is formed over a single-crystal silicon substrate 2301 from which a natural oxide film has been removed with a thickness of 100 nm by plasma CVD by using an SiH$_4$ gas and an N$_2$O gas. In addition, a silicon nitride oxide layer 2306 is formed with a thickness of 50 nm by using an SiH$_4$ gas and an N$_2$O gas.

Figure 25B:
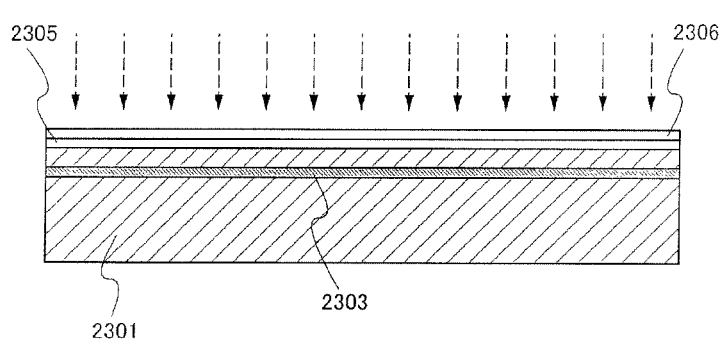

Then, as shown in FIG. 25B, hydrogen ions are added from the surface of the silicon nitride oxide layer 2306 by using an ion doping apparatus. The ion doping apparatus is an apparatus used to add an ionized gas which is accelerated by an electric field to a substrate without mass separation. When this apparatus is used, ion doping can be performed with high efficiency and at high dose even in the case of a large-area substrate. In this example, hydrogen is ionized to form a weakened layer 2303 in the single-crystal silicon substrate 2301. Ion doping is performed with accelerated voltage of 80 kV and dose of $2 \times 10^{16}$/cm$^2$.

In this case, it is preferable to add one kind of ions or plural kinds of ions of different mass numbers consisting of a single kind of atoms. In the case of adding hydrogen ions, the hydrogen ions preferably include H$^+$, H$_2^+$, and H$_3^+$ ions with a high proportion of $H_3^+$ ions of about 80%. When a large number of higher-order ions with small mass numbers as described above are contained in the single-crystal silicon substrate 2301, cleavage of the weakened layer 2303 can be easily performed in a heat treatment step. In this case, when the silicon nitride oxide layer 2306 and the silicon oxynitride layer 2305 are provided on the ion-doping surface of the single-crystal silicon substrate 2301, the surface of the single-crystal silicon substrate 2301 can be prevented from being roughened by ion doping.

Figure 25C:
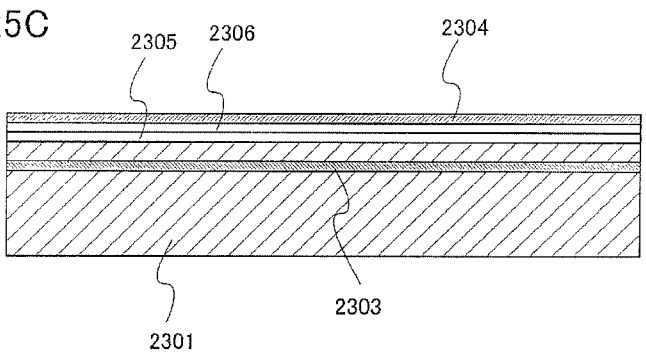

Next, as shown in FIG. 25C, a silicon oxide layer 2304 is formed over the silicon nitride oxide layer 2306. The silicon oxide layer 2304 is formed with a thickness of 50 nm by plasma CVD by using tetraethoxysilane (TEOS) (chemical formula: $Si(OC_2H_3)_4$) and an oxygen gas. The film formation temperature is set to be 350° C. or lower so that hydrogen is not removed from the weakened layer 2303.

Figure 26A:
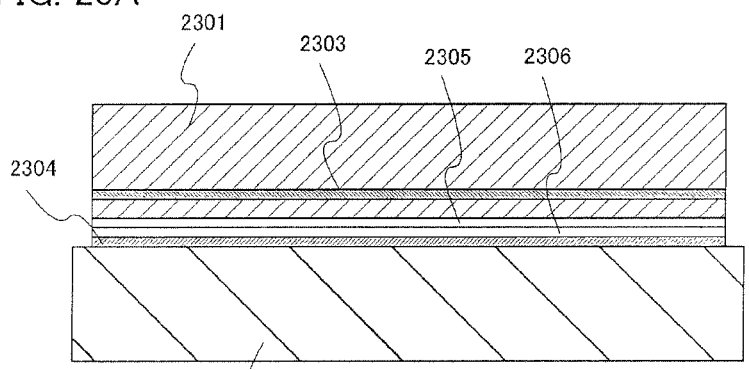
FIGS. 26A and 26B illustrate manufacturing steps of a semiconductor device in accordance with an embodiment mode of the present invention.
Figure 26B:
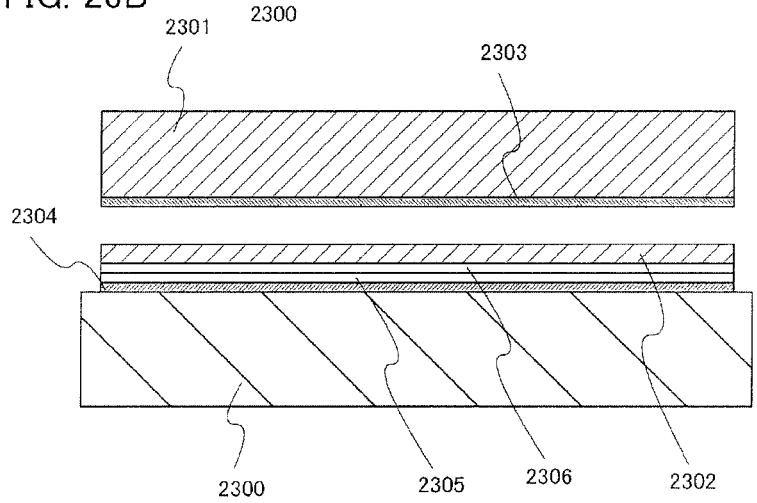

FIG. 26A shows a step of superposing a glass substrate 2300 which is subjected to ultrasonic cleaning by using ozone-containing water and the single-crystal silicon substrate 2301 on each other with the silicon oxide layer 2304 interposed therebetween, and pressing the substrates against each other to bond the substrates. After that, heat treatment is performed at 400° C. for 10 minutes in a nitrogen atmosphere and then at 500° C. for two hours, and the temperature is held constant at 400° C. for several hours and then gradually lowered to room temperature. Accordingly, as shown in FIG. 26B, a crack can be formed in the weakened layer 2303 to separate the single-crystal silicon substrate 2301, and the silicon oxide layer 2304 and the glass substrate 2300 can be bonded firmly.

In this manner, a single-crystal silicon layer 2302 can be formed over the glass substrate 2300 at a temperature at which the glass substrate 2300 is not distorted. The single-crystal silicon layer 2302 manufactured in this example is firmly bonded to the glass substrate 2300, so that there is no separation of the silicon layer even when a tape peel test is performed. That is, a single-crystal silicon layer can be provided over any of various glass substrates which are used in the electronics industry and are referred to as non-alkali glass substrates, such as aluminosilicate glass substrates, aluminoborosilicate glass substrates, and barium borosilicate glass substrates, and various integrated circuits and display devices can be manufactured by using a substrate which is longer than one meter on a side.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with tills embodiment mode.

Embodiment Mode 5

In this embodiment mode, a pixel structure of the display device shown in Embodiment Mode 1 is described. In particular, a pixel structure of a display device using an organic EL element is described.

Figure 45A:
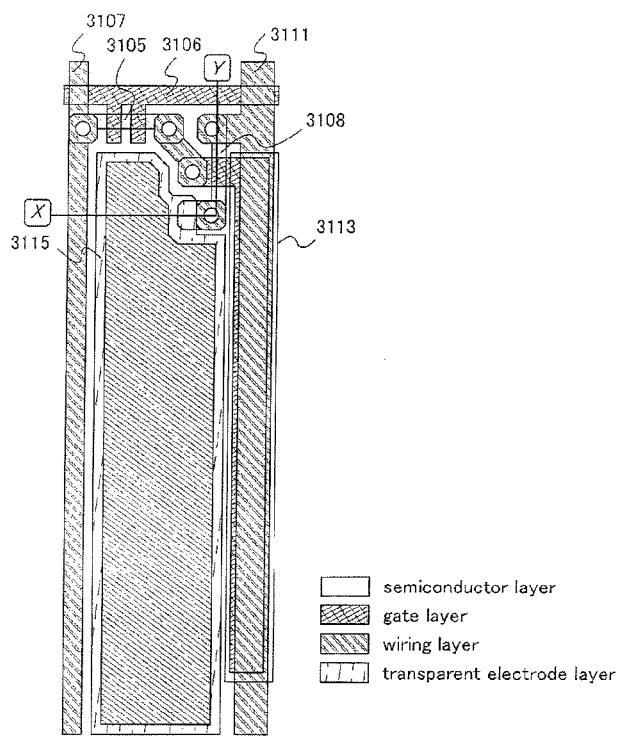
FIG. 45A is a top view of a semiconductor device in accordance with an embodiment mode of the present invention.
Figure 45B:
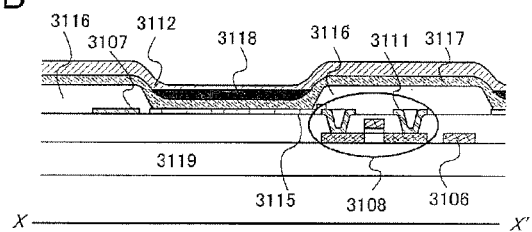
FIG. 45B is a cross-sectional view of the semiconductor device in accordance with the Embodiment Mode of the present invention.

FIG. 45A is an example of a top view (a layout diagram) of a pixel which includes two transistors. FIG. 45B is an example of a cross-sectional view taken along X-X' in FIG. 45A.

FIGS. 45A and 45B show a first transistor 3105, a first wiring 3106, a second wiring 3107, a second transistor 3108, a third wiring 3111, a counter electrode 3112, a capacitor 3113, a pixel electrode 3115, a partition wall 3116, an organic conductive film 3117, an organic thin film 3118, and a substrate 3119. Note that it is preferable that the first transistor 3105, the first wiring 3106, the second wiring 3107, the second transistor 3108, and the third wiring 3111 are used as a switching transistor, a gate signal line, a source signal line, a driving transistor, and a current supply line, respectively.

A gate electrode of the first transistor 3105 is electrically connected to the first wiring 3106. One of a source electrode and a drain electrode of the first transistor 3105 is electrically connected to the second wiring 3107. The other of the source electrode and the drain electrode of the first transistor 3105 is electrically connected to a gate electrode of the second transistor 3108 and one of electrodes of the capacitor 3113. Note that the gate electrode of the first transistor 3105 includes a plurality of gate electrodes. Thus, leakage current in an off state of the first transistor 3105 can be reduced.

One of a source electrode and a drain electrode of the second transistor 3108 is electrically connected to the third wiring 3111. The other of the source electrode and the drain electrode of the second transistor 3108 is electrically connected to the pixel electrode 3115. Thus, current flowing through the pixel electrode 3115 can be controlled by the second transistor 3108.

The organic conductive film 3117 is provided over the pixel electrode 3115, and the organic thin film 3118 (an organic compound layer) is provided thereover. The counter electrode 3112 is provided over the organic thin film 3118 (the organic compound layer). Note that the counter electrode 3112 may be formed over the entire surface so as to be connected to all the pixels in common, or may be patterned using a shadow mask or the like.

Light emitted from the organic thin film 3118 (the organic compound layer) is transmitted through either the pixel electrode 3115 or the counter electrode 3112.

In FIG. 45B, the case where light is emitted on the pixel electrode side, i.e., a side over which the transistor and the like are formed is referred to as bottom emission, and the case where light is emitted on the counter electrode side is referred to as top emission.

In the case of bottom emission, it is preferable to form the pixel electrode 3115 using a light-transmitting conductive film. On the other hand, in the case of top emission, it is preferable to form the counter electrode 3112 using a light-transmitting conductive film.

In a light-emitting device for color display, EL elements having respective light emission colors of R, G, and B may be separately formed, or an EL element having a single color may be formed over the entire surface and light emission of R, G, and B is obtained by using a color filter.

Note that the structures shown in FIGS. 45A and 45B are just examples, and various structures can be employed for a pixel layout, a cross-sectional structure, a stacking order of electrodes of an EL element, and the like, as well as the structures shown in FIGS. 45A and 45B. Further, as a light-emitting layer, various elements such as a crystalline element like an LED, and an element formed using an inorganic thin film can be used as well as the element formed using the organic thin film shown in the drawing.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

Embodiment Mode 6

In this embodiment mode, examples of electronic devices are described.

Figure 29:
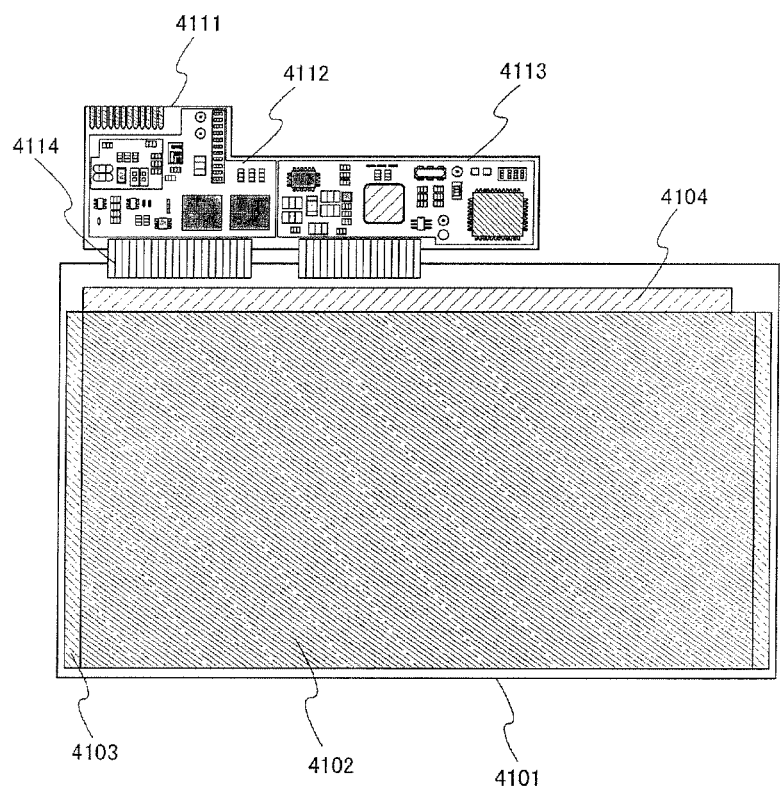
FIG. 29 illustrates a structure of a semiconductor device in accordance with an embodiment mode of the present invention.

FIG. 29 shows a display panel module in which a display panel 4101 and a circuit board 4111 are combined. The display panel 4101 includes a pixel portion 4102, a scan line driver circuit 4103, and a signal line driver circuit 4104. The circuit board 4111 is provided with a control circuit 4112, a signal dividing circuit 4113, and the like, for example. The display panel 4101 and the circuit board 4111 are connected by a connection wiring 4114. As the connection wiring 4114, an FPC or the like can be used.

When a single-crystal TFT which is formed by separating a single-crystal semiconductor layer from a single-crystal semiconductor substrate and fixing the single-crystal semiconductor layer to a glass substrate is used for each of shift registers of the scan line driver circuit 4103 and the signal line driver circuit 4104 over the display panel 4101 as in Embodiment Mode 1, a small thin display panel module with low power consumption can be formed.

Figure 30:
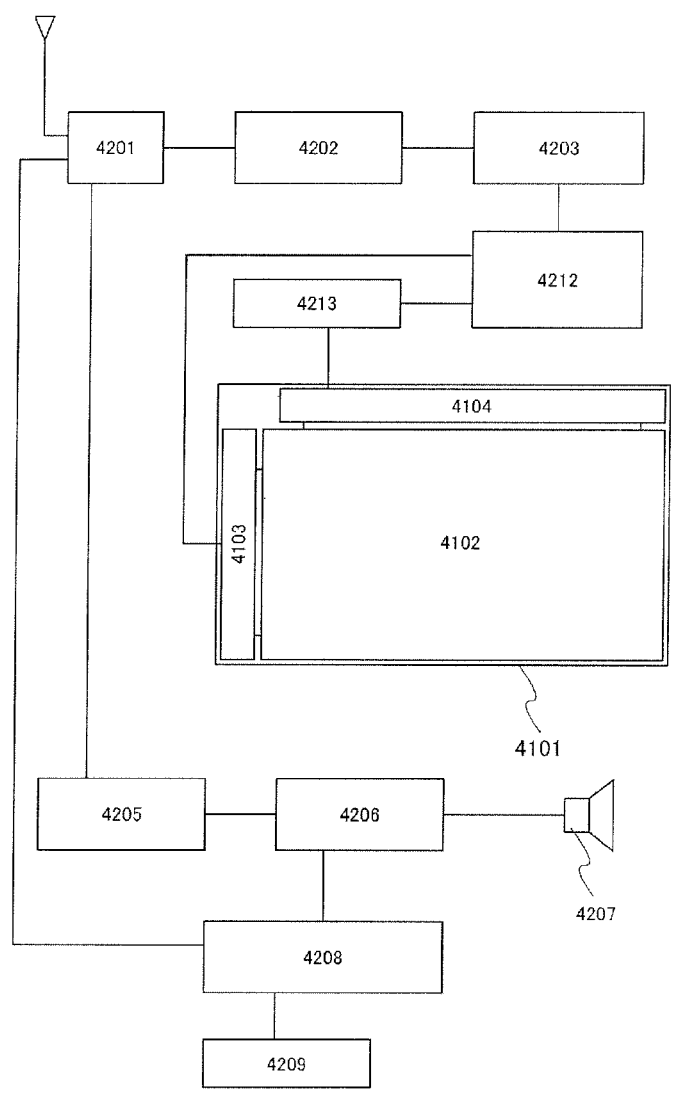
FIG. 30 illustrates a structure of a semiconductor device in accordance with an embodiment mode of the present invention.

A television receiver can be completed with the display panel module shown in FIG. 29. FIG. 30 is a block diagram showing a main structure of a television receiver. A tuner 4201 receives a video signal and an audio signal. The video signal is processed by a video signal amplifier circuit 4202, a video signal processing circuit 4203 for converting a signal output from the video signal amplifier circuit 4202 into a color signal corresponding to each color of red, green, and blue, and a control circuit 4212 for converting the video signal into a signal which meets input specifications of a driver circuit. The control circuit 4212 outputs signals to a scan line side and a signal line side. In the case of digital driving, a structure may be used in which a signal dividing circuit 4213 is provided on the signal line side and an input digital signal is divided into m (m is a positive integer) pieces to be supplied.

Among the signals received by the tuner 4201, the audio signal is transmitted to an audio signal amplifier circuit 4205, and output thereof is supplied to a speaker 4207 through an audio signal processing circuit 4206. A control circuit 4208 receives control information on a receiving station (reception frequency) and sound volume from an input portion 4209, and transmits a signal to the tuner 4201 or the audio signal processing circuit 4206.

Figure 31A:
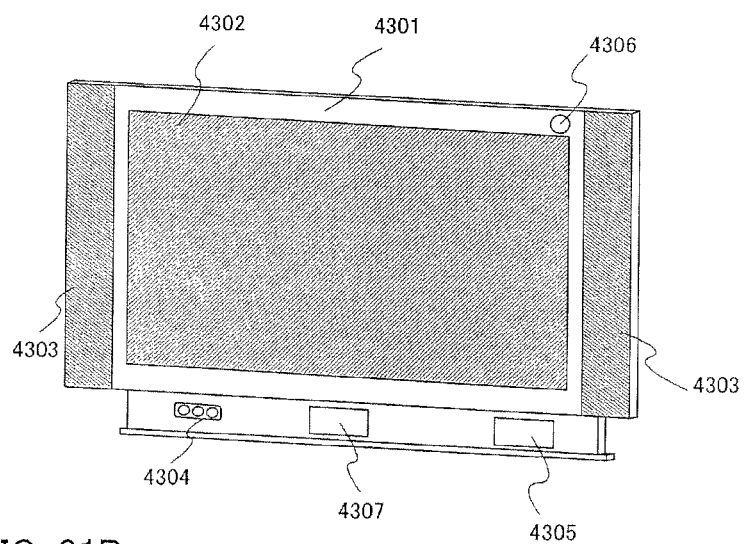
FIGS. 31A and 31B each illustrate a structure of an electronic device in accordance with an embodiment mode of the present invention.

FIG. 31A shows a television receiver incorporated with a display panel module which is different from that of FIG. 30. In FIG. 31A, a display screen 4302 stored in a housing 4301 is formed by using the display panel module. Note that speakers 4303, operation switches 4304, an input means 4305, a sensor 4306 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 4307, or the like may be provided as appropriate.

Figure 31B:
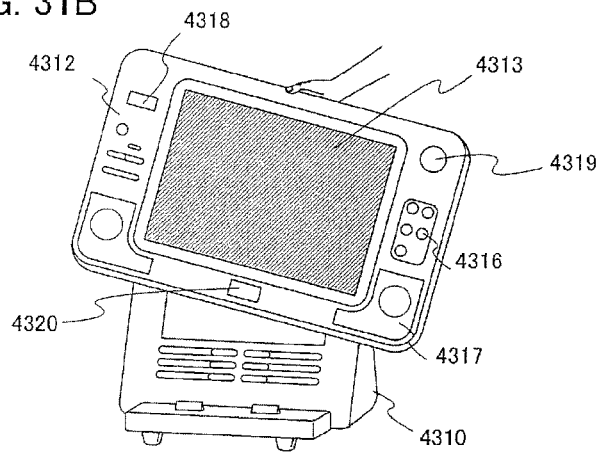

FIG. 31B shows a television receiver, only a display of which can be carried wirelessly. A battery and a signal receiver are incorporated in a housing 4312. The battery drives a display portion 4313, speaker portions 4317, a sensor 4319 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), and a microphone 4320. Electricity can be repeatedly stored in the battery by a charger 4310. The charger 4310 can transmit and receive a video signal and can transmit the video signal to the signal receiver of the display. The device shown in FIG. 31B is controlled by operation keys 4316. Alternatively, the device shown in FIG. 31B can transmit a signal to the charger 4310 by operating the operation keys 4316. That is, the device may be an image audio two-way communication device. Further alternatively, the device shown in FIG. 31B can transmit a signal to the charger 4310 by operating the operation keys 4316, and can control communication of another electronic device when the electronic device is made to receive a signal which can be transmitted from the charger 4310. That is, the device may be a general-purpose remote control device. Note that an input means 4318 or the like may be provided as appropriate. Note that the contents (or may be part of the contents) described in each drawing of this embodiment mode can be applied to the display portion 4313.

Figure 32A:
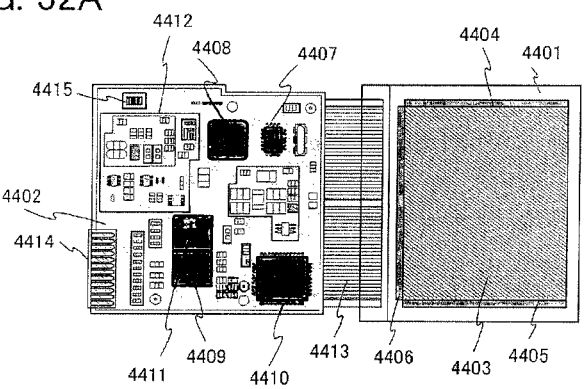
FIGS. 32A and 32B each illustrate a structure of an electronic device in accordance with an embodiment mode of the present invention.

FIG. 32A shows a module in which a display panel 4401 and a printed wiring board 4402 are combined. The display panel 4401 may be provided with a pixel portion 4403 including a plurality of pixels, a first scan line driver circuit 4404, a second scan line driver circuit 4405, and a signal line driver circuit 4406 which supplies a video signal to a selected pixel. When a single-crystal TFT which is formed by separating a single-crystal semiconductor layer from a single-crystal semiconductor substrate and fixing the single-crystal semiconductor layer to a glass substrate is used for each of shift registers of the first scan line driver circuit 4404, the second scan line driver circuit 4405, and the signal line driver circuit 4406 over the display panel 4401 as in Embodiment Mode 1, a small thin display panel module with low power consumption can be formed.

The printed wiring board 4402 is provided with a controller 4407, a central processing unit (CPU) 4408, a memory 4409, a power supply circuit 4410, an audio processing circuit 4411, a transmitting/receiving circuit 4412, and the like. The printed wiring board 4402 and the display panel 4401 are connected by a flexible printed circuit (FPC) 4413. The flexible printed circuit (FPC) 4413 may be provided with a storage capacitor, a buffer circuit, or the like so as to prevent noise on power supply voltage or a signal, and increase in rise time of a signal. Note that the controller 4407, the audio processing circuit 4411, the memory 4409, the central processing unit (CPU) 4408, the power supply circuit 4410, and the like can be mounted on the display panel 4401 by using a COG (chip on glass) method. When a COG method is used, the size of the printed wiring board 4402 can be reduced.

Various control signals are input and output through an interface (I/F) portion 4414 provided for the printed wiring board 4402. In addition, an antenna port 4415 for transmitting and receiving a signal to/from an antenna is provided for the printed wiring board 4402.

Figure 32B:
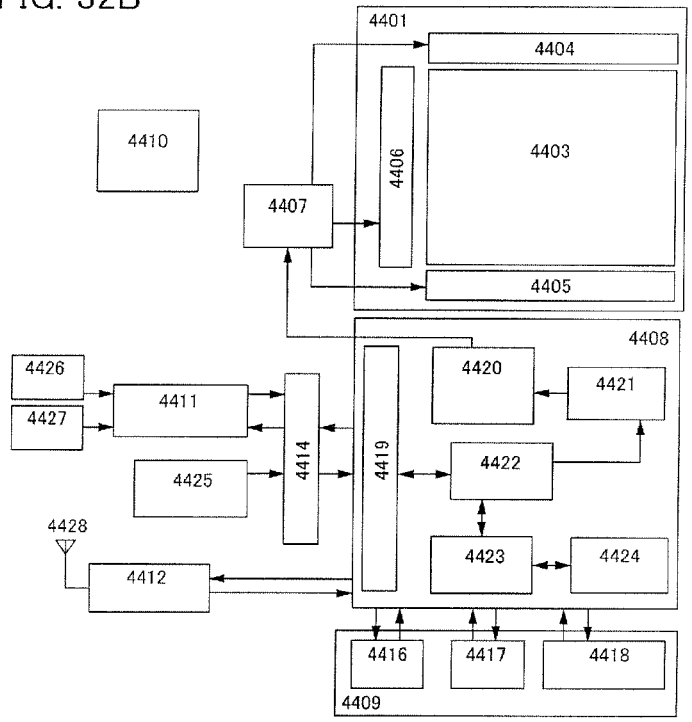

FIG. 32B is a block diagram of the module shown in FIG. 32A. The module includes a VRAM 4416, a DRAM 4417, a flash memory 4418, and the like as the memory 4409. The VRAM 4416 stores data on an image displayed on the panel. The DRAM 4417 stores video data or audio data. The flash memory 4418 stores various programs.

The power supply circuit 4410 supplies electric power for operating the display panel 4401, the controller 4407, the central processing unit (CPU) 4408, the audio processing circuit 4411, the memory 4409, and the transmitting/receiving circuit 4412. Note that depending on panel specifications, the power supply circuit 4410 is provided with a current source in some cases.

The central processing unit (CPU) 4408 includes a control signal generation circuit 4420, a decoder 4421, a register 4422, an arithmetic circuit 4423, a RAM 4424, an interface (I/F) portion 4419 for the central processing unit (CPU) 4408, and the like. Various signals which are input to the central processing unit (CPU) 4408 through the interface (I/F) portion 4414 are once stored in the register 4422, and then input to the arithmetic circuit 4423, the decoder 4421, and the like. The arithmetic circuit 4423 performs operation based on the input signal so as to designate a location to which various instructions are sent. On the other hand, the signal input to the decoder 4421 is decoded and input to the control signal generation circuit 4420. The control signal generation circuit 4420 generates a signal including various instructions based on the input signal, and transmits the signal to locations designated by the arithmetic circuit 4423, specifically the memory 4409, the transmitting/receiving circuit 4412, the audio processing circuit 4411, the controller 4407, and the like.

The memory 4409, the transmitting/receiving circuit 4412, the audio processing circuit 4411, and the controller 4407 operate in accordance with respective instructions. Operations thereof are briefly described below.

A signal input from an input means 4425 is transmitted to the central processing unit (CPU) 4408 mounted on the printed wiring board 4402 through the interface (I/F) portion 4414. The control signal generation circuit 4420 converts image data stored in the VRAM 4416 into a predetermined format based on the signal transmitted from the input means 4425 such as a pointing device or a keyboard, and transmits the converted data to the controller 4407.

The controller 4407 performs data processing of the signal including the image data transmitted from the central processing unit (CPU) 4408 in accordance with die panel specifications, and supplies the signal to the display panel 4401. The controller 4407 generates an Hsync signal, a Vsync signal, a clock signal (CLK), alternating voltage (AC Cont), and a switching signal L/R based on power supply voltage input from the power supply circuit 4410 or various signals input from the central processing unit (CPU) 4408, and supplies the signals to the display panel 4401.

The transmitting/receiving circuit 4412 processes a signal which is transmitted and received as an radio wave by an antenna 4428. Specifically, the transmitting/receiving circuit 4412 may include a high-frequency circuit such as an isolator, a band pass filter, a VCO (voltage controlled oscillator), an LPF (low pass filter), a coupler, or a balun. Among signals transmitted and received by die transmitting/receiving circuit 4412, a signal including audio information is transmitted to the audio processing circuit 4411 in accordance with an instruction from the central processing unit (CPU) 4408.

The signal including the audio information, which is transmitted in accordance with the instruction from the central processing unit (CPU) 4408, is demodulated into an audio signal by the audio processing circuit 4411 and is transmitted to a speaker 4427. An audio signal transmitted from a microphone 4426 is modulated by the audio processing circuit 4411 and is transmitted to the transmitting/receiving circuit 4412 in accordance with an instruction from the central processing unit (CPU) 4408.

The controller 4407, the central processing unit (CPU) 4408, the power supply circuit 4410, the audio processing circuit 4411, and the memory 4409 can be mounted as a package of this embodiment mode.

Needless to say, the present invention is not limited to the television receiver, and can be applied to various uses particularly as a large display medium such as an information display board at a train station, an airport, or the like, or an advertisement display board on the street, as well as a monitor of a personal computer.

Next, a structural example of a mobile phone is described with reference to FIG. 33.

A display panel 4501 is incorporated in a housing 4530 so as to be detachable. The shape and the size of the housing 4530 can be changed as appropriate in accordance with the size of the display panel 4501. The housing 4530 to which the display panel 4501 is fixed is fitted into a printed circuit board 4531 and is assembled as a module.

The display panel 4501 is connected to the printed wiring board 4531 through an FPC 4513. The printed wiring board 4531 is provided with a speaker 4532, a microphone 4533, a transmitting/receiving circuit 4534, a signal processing circuit 4535 including a CPU, a controller, and the like, and a sensor 4541 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray). Such a module, an input means 4536, and a battery 4537 are combined and stored in a housing 4539 with an antenna 4540. A pixel portion of the display panel 4501 is provided so as to be seen from an opening window formed in the housing 4539.

Figure 33:
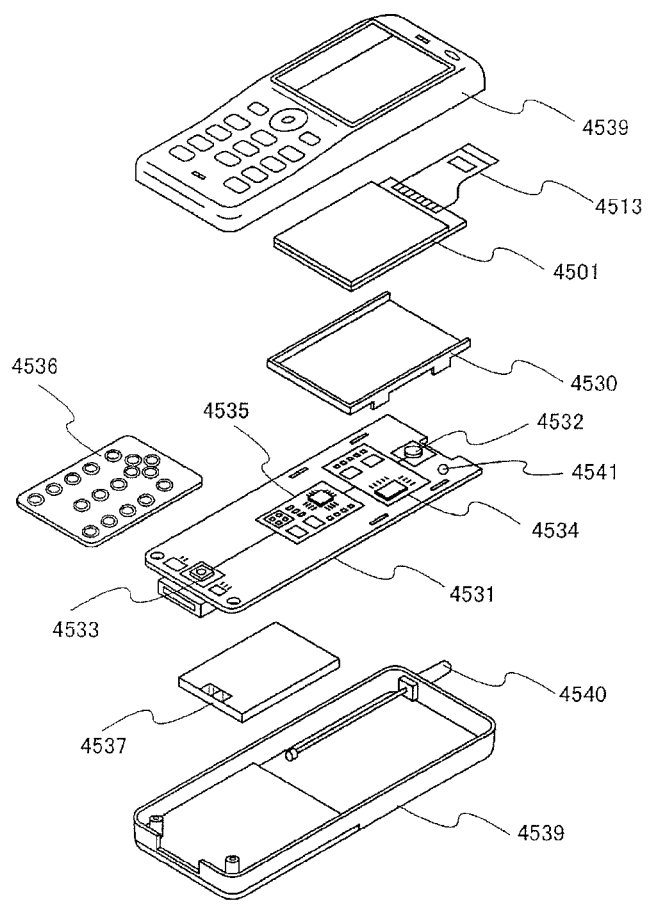
FIG. 33 illustrates a structure of an electronic device in accordance with an embodiment mode of the present invention.

The mobile phone shown in FIG. 33 has various functions such as a function of displaying a variety of information (e.g., a still image, a moving image, and a text image): a function of displaying a calendar, a date, time, or the like on a display portion; a function of operating or editing the information displayed on the display portion; a function of controlling processing by a variety of software (programs); a wireless communication function; a function of communicating with another mobile phone, a fixed phone, or an audio communication device by using the wireless communication function; a function of connecting with a variety of computer networks by using the wireless communication function; a function of transmitting or receiving a variety of data by using the wireless communication function; a function of operating a vibrator in accordance with incoming call, reception of data, or an alarm; and a function of generating a sound in accordance with incoming call, reception of data, or an alarm. Note that functions of the mobile phone shown in FIG. 33 are not limited to them, and the mobile phone can have various functions.

Figure 34:
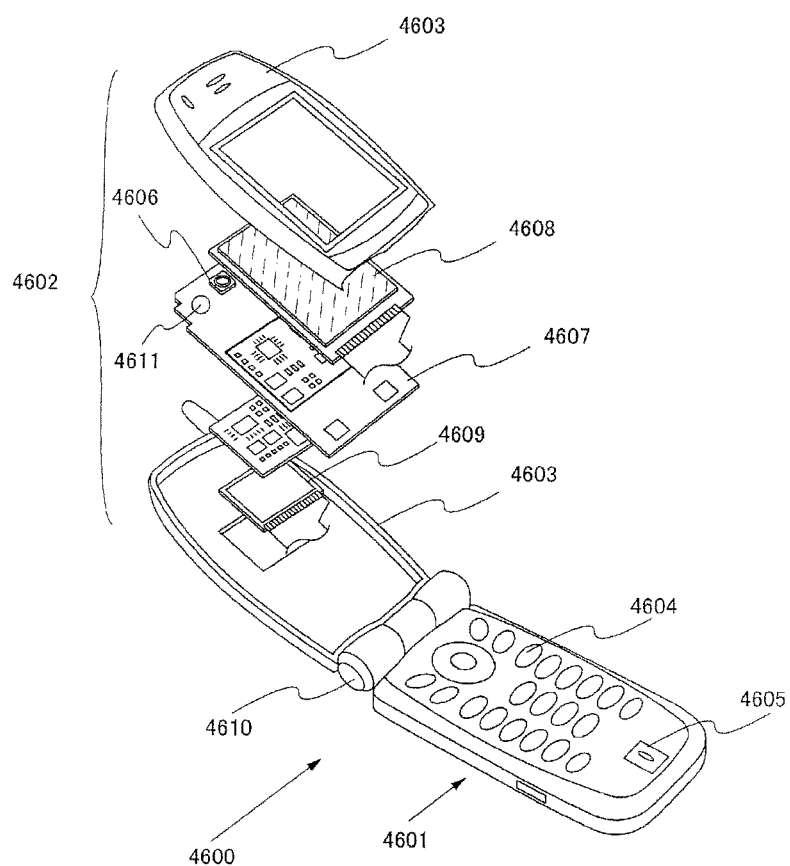
FIG. 34 illustrates a structure of an electronic device in accordance with an embodiment mode of the present invention.

In a mobile phone shown in FIG. 34, a main body (A) 4601 which is provided with operation switches 4604, a microphone 4605, and the like is connected to a main body (B) 4602 which is provided with a display panel (A) 4608, a display panel (B) 4609, a speaker 4606, a sensor 4611 (having a function of measuring force, displacement, position, speed, acceleration, angular velocity, rotation number, distance, light, liquid, magnetism, temperature, chemical reaction, sound, tune, hardness, electric Field, current, voltage, electric power, radial ray, flow rate, humidity, gradient, vibration, smell, or infrared ray), and the like by using a hinge 4610 so that the mobile phone can be opened and closed. The display panel (A) 4608 and the display panel (B) 4609 are stored in a housing 4603 of the main body (B) 4602 together with a circuit board 4607. Each of pixel portions of the display panel (A) 4608 and the display panel (B) 4609 is provided so as to be seen from an opening window formed in the housing 4603.

Specifications of the display panel (A) 4608 and the display panel (B) 4609, such as the number of pixels, can be set as appropriate in accordance with functions of a mobile phone 4600. For example, the display panel (A) 4608 can be used as a main screen and the display panel (B) 4609 can be used as a sub-screen.

Each of the mobile phones of this embodiment mode can be changed in various modes depending on functions or applications thereof. For example, it may be a camera-equipped mobile phone by incorporating an imaging element in a portion of the hinge 4610. When the operation switches 4604, the display panel (A) 4608, and the display panel (B) 4609 are stored in one housing, the above-described advantageous effects can be obtained. Further, similar advantageous effects can be obtained when the structure of this embodiment mode is applied to an information display terminal provided with a plurality of display portions.

The mobile phone shown in FIG. 34 has various functions such as a function of displaying a variety of information (e.g., a still image, a moving image, and a text image); a function of displaying a calendar, a date, time, or the like on a display portion; a function of operating or editing the information displayed on the display portion; a function of controlling processing by a variety of software (programs); a wireless communication function; a function of communicating with another mobile phone, a fixed phone, or an audio communication device by using the wireless communication function: a function of connecting with a variety of computer networks by using the wireless communication function; a function of transmitting or receiving a variety of data by using the wireless communication function; a function of operating a vibrator in accordance with incoming call, reception of data, or an alarm; and a function of generating a sound in accordance with incoming call, reception of data, or an alarm. Note that functions of the mobile phone shown in FIG. 34 are not limited to them, and the mobile phone can have various functions.

In each of the mobile phones of this embodiment mode, when a single-crystal TFT which is formed by separating a single-crystal semiconductor layer from a single-crystal semiconductor substrate and fixing the single-crystal semiconductor layer to a glass substrate is used for each of shift registers of a scan line driver circuit and a signal line driver circuit over the display panel as in Embodiment Mode 1, power consumption of the mobile phone can be reduced, so that operation time of the mobile phone per charge can be extended. In addition, cost of the mobile phone can be reduced. Further, a small thin mobile phone can be formed.

The contents (or may be part of the contents) described in each drawing of this embodiment mode can be applied to various electronic devices. Specifically, the contents (or may be part of the contents) described in each drawing of this embodiment mode can be applied to display portions of electronic devices. Examples of such electronic devices are cameras such as a video camera and a digital camera, a goggle-type display, a navigation system, an audio reproducing device (e.g., a car audio component or an audio component), a computer, a game machine, a portable information terminal (e.g., a mobile computer, a mobile phone, a mobile game machine, or an electronic book), an image reproducing device provided with a recording medium (specifically, a device which reproduces a recording medium such as a digital versatile disc (DVD) and has a display for displaying a reproduced image), and the like.

Figure 35A:
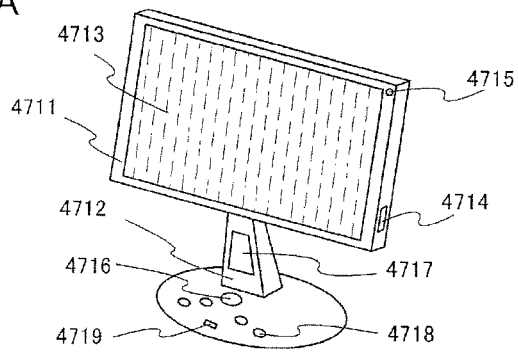
FIGS. 35A to 35C each illustrate a structure of an electronic device in accordance with an embodiment mode of the present invention.

FIG. 35A shows a display, which includes a housing 4711, a support base 4712, a display portion 4713, an input means 4714, a sensor 4715 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 4716, a speaker 4717, operation keys 4718, an LED lamp 4719, and the like. The display shown in FIG. 35A has a function of displaying a variety of information (e.g., a still image, a moving image, and a text image) on the display portion. Note that the display shown in FIG. 35A is not limited to having this function, and can have various functions.

Figure 35B:
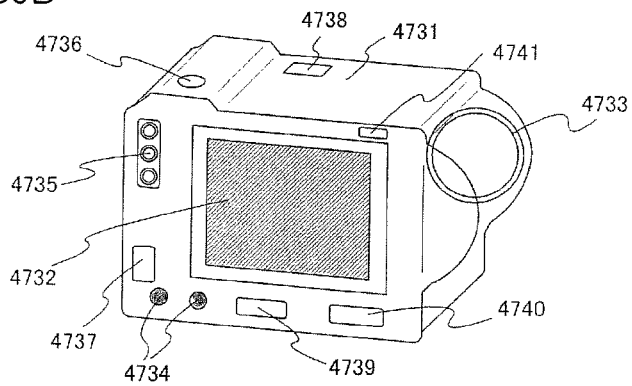

FIG. 35B shows a camera, which includes a main body 4731, a display portion 4732, an image receiving portion 4733, operation keys 4734, an external connection port 4735, a shutter button 4736, an input means 4737, a sensor 4738 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 4739, a speaker 4740, an LED lamp 4741, and the like. The camera shown in FIG. 35B has a function of photographing a still image and a moving image; a function of automatically correcting the photographed image (the still image or the moving image); a function of storing the photographed image in a recording medium (provided outside or incorporated in the camera); and a function of displaying the photographed image on the display portion. Note that the camera shown in FIG. 35B is not limited to having these functions, and can have various functions.

Figure 35C:
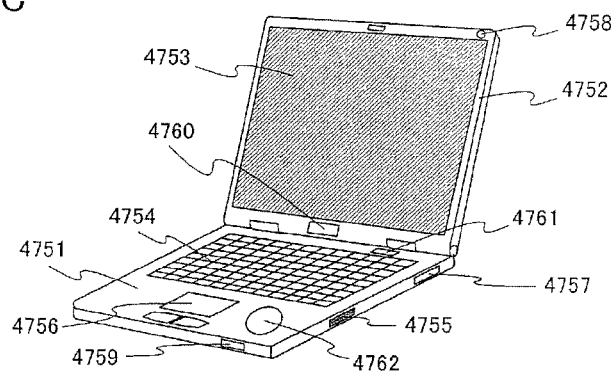

FIG. 35C shows a computer, which includes a main body 4751, a housing 4752, a display portion 4753, a keyboard 4754, an external connection port 4755, a pointing device 4756, an input means 4757, a sensor 4758 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 4759, a speaker 4760, an LED lamp 4761, a reader/writer 4762, and the like. The computer shown in FIG. 35C has a function of displaying a variety of information (e.g., a still image, a moving image, and a text image) on the display portion; a function of controlling processing by a variety of software (programs); a communication function such as wireless communication or wire communication; a function of connecting to various computer networks by using the communication function; and a function of transmitting or receiving a variety of data by using the communication function. Note that the computer shown in FIG. 35C is not limited to having these functions, and can have various functions.

Figure 42A:
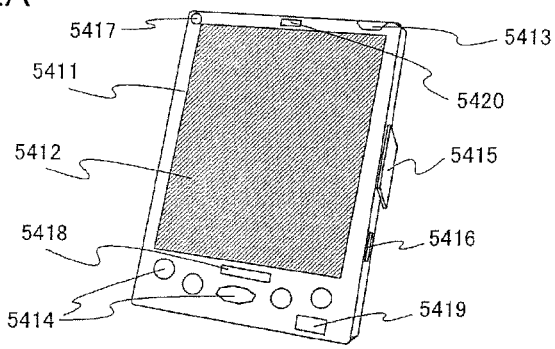
FIGS. 42A to 42C each illustrate a structure of an electronic device in accordance with an embodiment mode of the present invention.

FIG. 42A shows a mobile computer, which includes a main body 5411, a display portion 5412, a switch 5413, operation keys, 5414, an infrared port 5415, an input means 5416, a sensor 5417 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 5418, a speaker 5419, an LED lamp 5420, and the like. The mobile computer shown in FIG. 42A has a function of displaying a variety of information (e.g., a still image, a moving image, and a text image) on the display portion; a touch panel function on the display portion; a function of displaying a calendar, a date, the time, and the like on the display portion; a function of controlling processing by a variety of software (programs), a wireless communication function; a function of connecting to various computer networks by using the wireless communication function; and a function of transmitting or receiving a variety of data by using the wireless communication function. Note that the mobile computer shown in FIG. 42A is not limited to having these functions, and can have various functions.

Figure 42B:
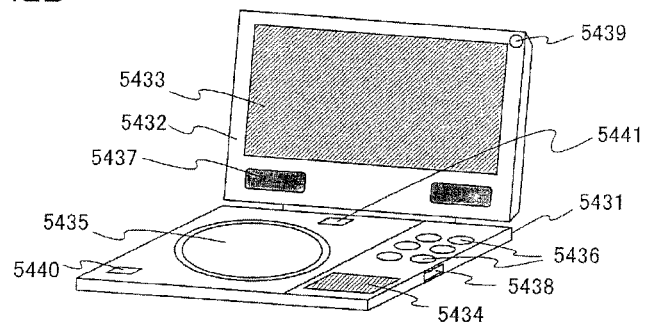

FIG. 42B shows a portable image reproducing device provided with a recording medium (e.g., a DVD reproducing device), which includes a main body 5431, a housing 5432, a display portion A 5433, a display portion B 5434, a recording medium (e.g., DVD) reading portion 5435, operation keys 5436, a speaker portion 5437, an input means 5438, a sensor 5439 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 5440, an LED lamp 5441, and the like. The display portion A 5433 can mainly display image information, and the display portion B 5434 can mainly display text information.

Figure 42C:
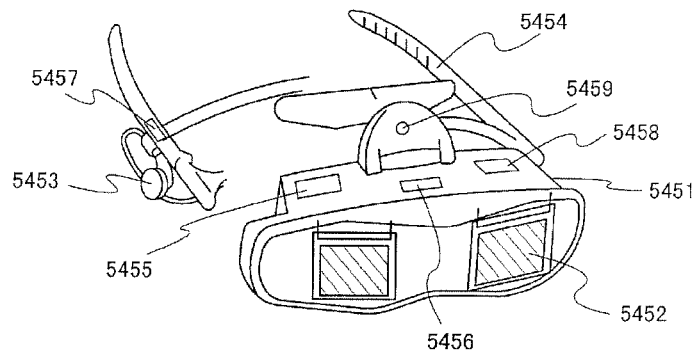

FIG. 42C shows a goggle-type display, which includes a main body 5451, a display portion 5452, an earphone 5453, a support portion 5454, an input means 5455, a sensor 5456 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 5457, a speaker 5458, an LED lamp 5459, and the like. The goggle-type display shown in FIG. 42C has a function of displaying an image (e.g., a still image, a moving image, or a text image) which is externally obtained on the display portion Note that the goggle-type display shown in FIG. 42C is not limited to having these functions, and can have various functions.

Figure 43A:
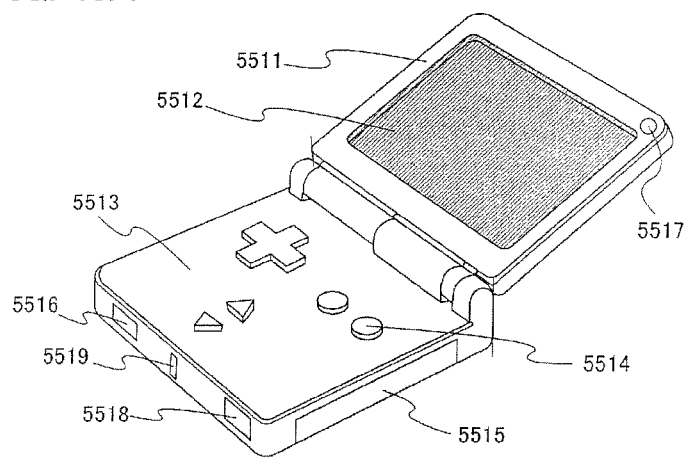
FIGS. 43A and 43B each illustrate a structure of an electronic device in accordance with an embodiment mode of the present invention.

FIG. 43A shows a portable game machine, which includes a housing 5511, a display portion 5512, speaker portions 5513, operation keys 5514, a recording medium insert portion 5515, an input means 5516, a sensor 5517 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 5518, an LED lamp 5519, and the like. The portable game machine shown in FIG. 43A has a function of reading a program or data stored in the recording medium to display on the display portion, and a function of sharing information with another portable game machine by wireless communication. Note that the portable game machine shown in FIG. 43A is not limited to having these functions, and can have various functions.

Figure 43B:
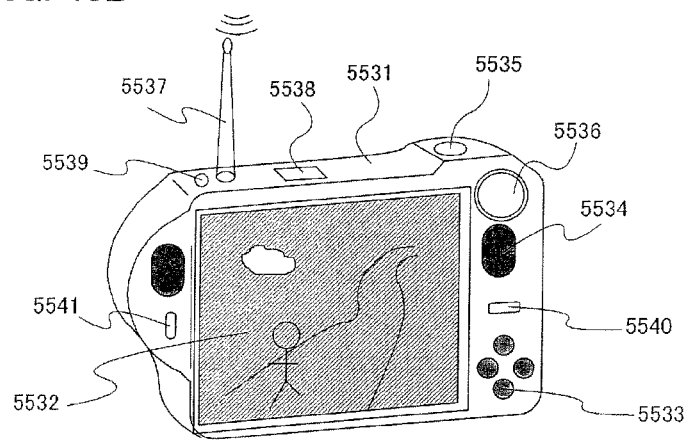

FIG. 43B shows a digital camera having a television reception function, which includes a main body 5531, a display portion 5532, operation keys 5533, a speaker 5534, a shutter button 5535, an image receiving portion 5536, an antenna 5537, an input means 5538, a sensor 5539 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 5540, an LED lamp 5541, and the like. The digital camera having the television reception function shown in FIG. 43B has a function of photographing a still image and a moving image; a function of automatically correcting the photographed image; a function of obtaining a variety of information from the antenna; a function of storing the photographed image or the information obtained from the antenna; and a function of displaying the photographed image or the information obtained from the antenna on the display portion. Note that the digital camera having the television reception function shown in FIG. 43B is not limited to having these functions, and can have various functions.

Figure 44:
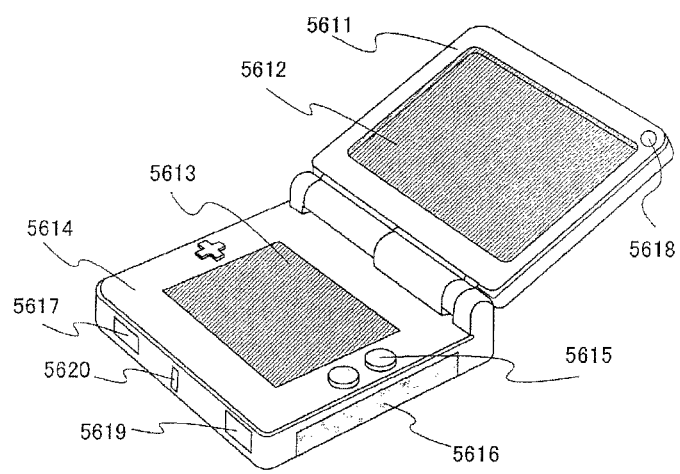
FIG. 44 illustrates a structure of an electronic device in accordance with an embodiment mode of the present invention.

FIG. 44 shows a portable game machine, which includes a housing 5611, a first display portion 5612, a second display portion 5613, speaker portions 5614, operation keys 5615, a recording medium insert portion 5616, an input means 5617, a sensor 5618 (having a function of measuring force, displacement, position, speed, acceleration, angular velocity, rotation number, distance, light, liquid, magnetism, temperature, chemical reaction, sound, time, hardness, electric field, current, voltage, electric power, radial ray, flow rate, humidity, gradient, vibration, smell, or infrared ray), a microphone 5619, an LED lamp 5620, and the like. The portable game machine shown in FIG. 44 has a function of reading a program or data stored in the recording medium to display on the display portion, and a function of sharing information with another portable game machine by wireless communication. Note that the portable game machine shown in FIG. 44 is not limited to having these functions, and can have various functions.

As shown in FIGS. 35A to 35C, FIGS. 42A to 42C, FIGS. 43A and 43B, and FIG. 44, the electronic device includes a display portion for displaying some kind of information. When a single-crystal TFT which is formed by separating a single-crystal semiconductor layer from a single-crystal semiconductor substrate and fixing the single-crystal semiconductor layer to a glass substrate is used for each of shift registers of a scan line driver circuit and a signal line driver circuit of a display panel as in Embodiment Mode 1, an electronic device with low power consumption, which can be driven for a long time by a battery, can be manufactured.

Next, an application of a semiconductor device is described.

Figure 36:
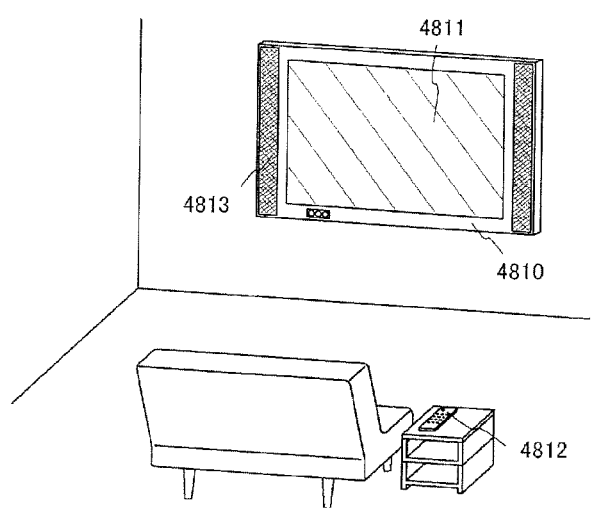
FIG. 36 illustrates a structure of an electronic device in accordance with an embodiment mode of the present invention.

FIG. 36 shows an example in which the semiconductor device is incorporated in a structure. FIG. 36 shows a housing 4810, a display panel 4811, a remote controller 4812 which is an operation portion, a speaker portion 4813, and the like. The semiconductor device is incorporated in the structure as a wall-hanging type, so that the semiconductor device can be provided without requiring a wide space.

Figure 37:
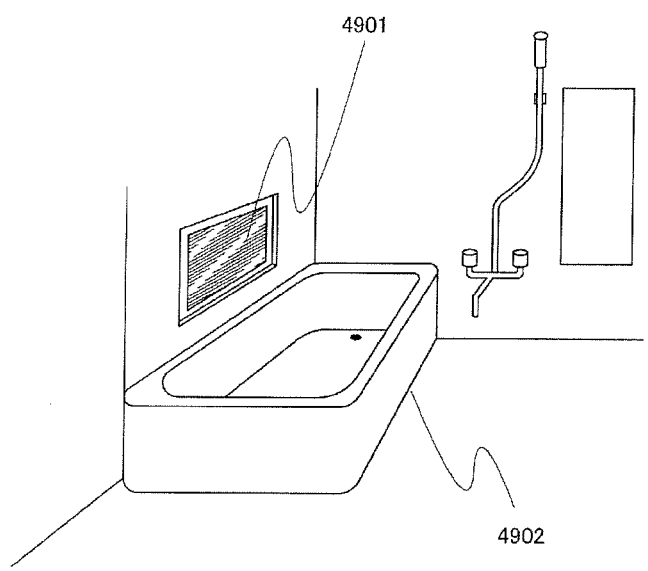
FIG. 37 illustrates a structure of an electronic device in accordance with an embodiment mode of the present invention.

FIG. 37 shows another example in which the semiconductor device is incorporated in a structure. A display panel 4901 is incorporated in a prefabricated bath unit 4902, so that a bather can view the display panel 4901. The display panel 4901 has a function of displaying information by an operation of the bather. The display panel 4901 can be utilized for advertisement or an amusement means.

Note that the semiconductor device can be provided in various places as well as on a sidewall of the prefabricated bath unit 4902 shown in FIG. 37. For example, the semiconductor device may be incorporated in part of a mirror or the bathtub itself. At this tune, the shape of the display panel 4901 may be a shape in accordance with the mirror or the bathtub.

Figure 38:
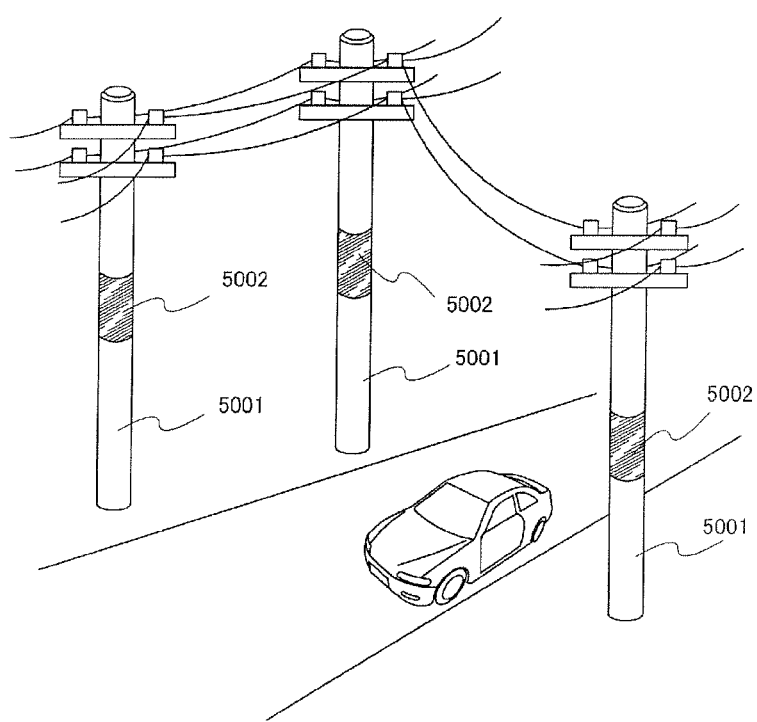
FIG. 38 illustrates a structure of an electronic device in accordance with an embodiment mode of the present invention.

FIG. 38 shows another example in which the semiconductor device is incorporated in a structure. Display panels 5002 are curved in accordance with curved surfaces of columnar objects 5001. Note that here, the columnar objects 5001 are described as telephone poles The display panels 5002 shown in FIG. 38 are provided at positions higher than a human eye level. When the display panels 5002 are provided for structures standing outside to each other in large numbers, such as telephone poles, advertisement can be performed to an unspecified number of viewers. Here, since the display panels 5002 can easily display the same images by control from outside and can easily switch images instantly, extremely effective information display and advertising effects can be obtained. When self-luminous display elements are provided in the display panels 5002, the display panels 5002 are effectively used as highly visible display media even at night. When the display panels 5002 are provided for the telephone poles, power supply means of the display panels 5002 can be easily secured. In an emergency such as a disaster, the display panels 5002 can be means for quickly transmitting precise information to victims.

Note that as each of the display panels 5002, a display panel can be used in which a display element is driven by providing a switching element such as an organic transistor over a film-shaped substrate so that an image is displayed.

When a single-crystal TFT which is formed by separating a single-crystal semiconductor layer from a single-crystal semiconductor substrate and fixing the single-crystal semiconductor layer to a glass substrate is used for each of shift registers of a scan line driver circuit and a signal line driver circuit of a display panel as in Embodiment Mode 1, a display panel with low power consumption can be manufactured. Note that although this embodiment describes the wall the prefabricated bath unit, and the columnar object as examples of the structure, the semiconductor device can be provided for various structures.

Next, an example is described in which the semiconductor device is incorporated in a moving object.

Figure 39:
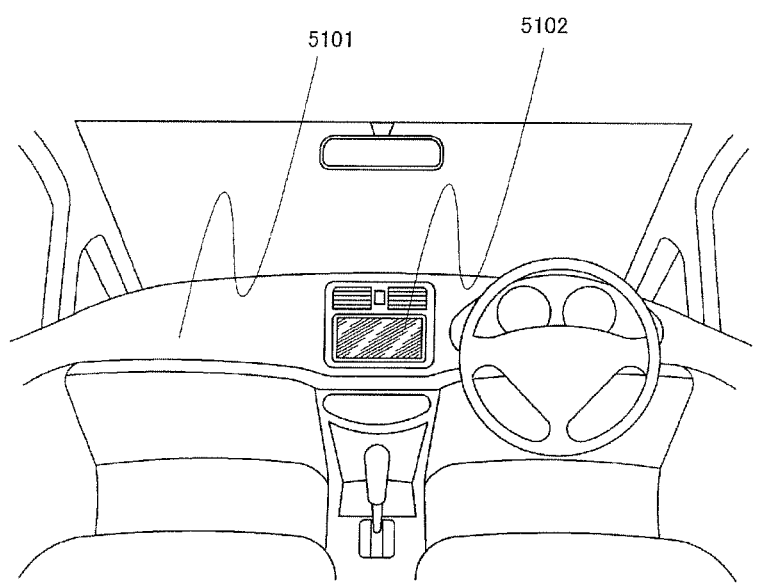
FIG. 39 illustrates a structure of an electronic device in accordance with an embodiment mode of the present invention.

FIG. 39 shows an example in which the semiconductor device is incorporated in a car. A display panel 5102 is incorporated in a car body 5101 of the car and can display information on an operation of the car or information input from inside or outside of the car on an on-demand basis. Note that the display panel 5102 may have a navigation function.

Note that the semiconductor device can be provided in various positions as well as the car body 5101 shown in FIG. 39. For example, the semiconductor device may be incorporated in a glass window, a door, a steering wheel, a shift lever, a seat, a room mirror, or the like. At this time, the shape of the display panel 5102 may be a shape in accordance with a shape of an object in which the display panel 5102 is provided.

Figure 40A:
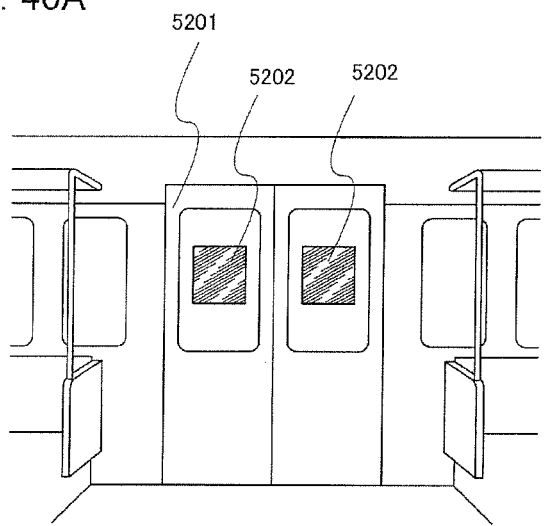
FIGS. 40A and 40B each illustrate a structure of an electronic device in accordance with an embodiment mode of the present invention.
Figure 40B:
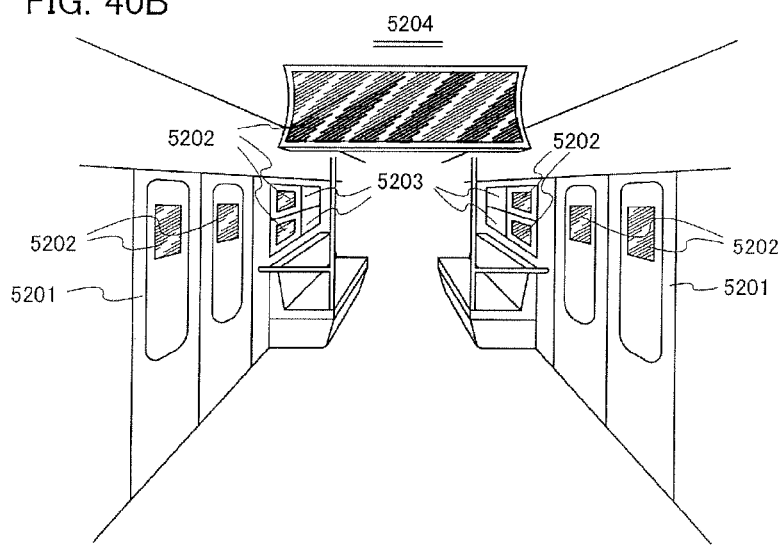

FIGS. 40A and 40B each show an example in which the semiconductor device is incorporated in a train car.

FIG. 40A shows an example in which display panels 5202 are provided for glasses of a door 5201 of the train car. The display panels 5202 have an advantage over conventional paper-based advertisement that labor cost which is necessary for switching advertisement is not needed. Since the display panels 5202 can instantly switch images displayed on display portions by external signals, images on the display panels can be switched as the type of train passenger changes in accordance with different time periods, for example, so that a more effective advertising effect can be obtained.

FIG. 40B shows an example in which display panels 5202 are provided for glass windows 5203 and a ceiling 5204 as well as the glasses of the doors 5201 of the tram car. Since the semiconductor device can be easily provided in a position in which the semiconductor device is conventionally difficult to be provided, an effective advertisement effect can be obtained. Since the semiconductor device can instantly switch images displayed on the display portion by external signals, cost and time generated in advertisement switching can be reduced, so that more flexible advertisement operation and information transmission can be performed.

Note that the semiconductor device can be provided in various positions as well as the doors 5201, the glass windows 5203, and the ceiling 5204 which are shown in FIGS. 40A and 40B. For example, the semiconductor device may be incorporated in a hand strap, a seat, a handrail, a floor, or the like. At this time, the shape of the display panel 5202 may be a shape in accordance with a shape of an object in which the display panel 5202 is provided.

Figure 41A:
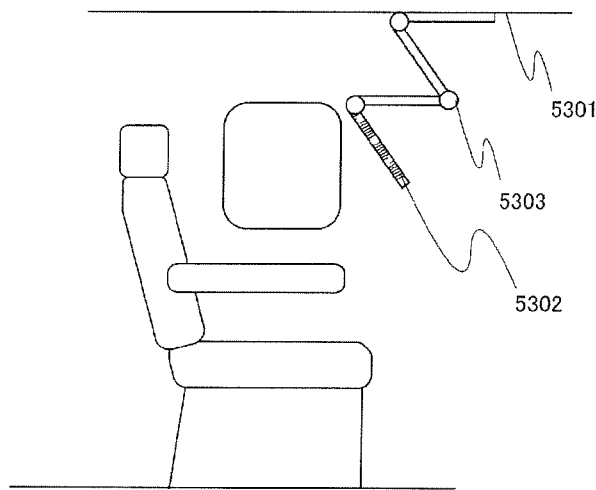
FIGS. 41A and 41B each illustrate a structure of an electronic device in accordance with an embodiment mode of the present invention.
Figure 41B:
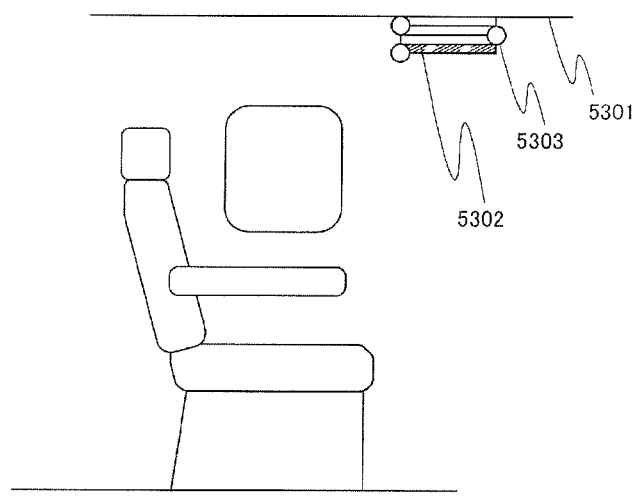

FIGS. 41A and 41B each show an example in which the semiconductor device is incorporated in a passenger airplane.

FIG. 41A shows a shape in use when a display panel 5302 is provided for a ceiling 5301 above a seat of the passenger airplane. The display panel 5302 is incorporated in the ceiling 5301 through a hinge portion 5303, and a passenger can view the display panel 5302 by telescopic motion of the hinge portion 5303. The display panel 5302 has a function of displaying information by an operation of the passenger. The display panel 5302 can be utilized for advertisement or an amusement means. When the display panel 5302 is stored on the ceiling 5301 by folding the hinge portion 5303 as shown in FIG. 41B, safety during takeoff and landing can be secured. Note that the display panel 5302 can also be utilized as a medium and a guide light by lighting display elements of the display panel 5302 in an emergency.

Note that the semiconductor device can be incorporated in various positions as well as the ceiling 5301 shown in FIGS. 41A and 41B. For example, the semiconductor device may be incorporated in a seat, a table, an armrest, a window, or the like. A large display panel which can be viewed simultaneously by a plurality of people may be provided on a wall of an airframe. At this time, the shape of the display panel 5302 may be a shape in accordance with a shape of an object in which the display panel 5302 is provided.

When a single-crystal TFT which is formed by separating a single-crystal semiconductor layer from a single-crystal semiconductor substrate and fixing the single-crystal semiconductor layer to a glass substrate is used for each of shift registers of a scan line driver circuit and a signal line driver circuit of a display panel as in Embodiment Mode 1, a display panel with low power consumption can be manufactured. Note that although this embodiment mode describes the tram car body, the car body, and the airplane body as examples of moving objects, the present invention is not limited to them, and the semiconductor device can be provided in various objects such as a motorbike, a four-wheeled vehicle (including a car, a bus, and the like), a train (including a monorail, a railroad, and the like), and a vessel. Since display on display panels in a moving object can be switched instantly by external signals, the semiconductor device can be used for an advertisement display board for an unspecified number of customers, an information display board in an emergency, or the like by providing the semiconductor device in the moving object.

Note that although this embodiment mode is described with reference to various drawings, the contents (or may be part of the contents) described in each drawing can be freely applied to, combined with, or replaced with the contents (or may be part of the contents) described in another drawing. Further, even more drawings can be formed by combining each part with another part in the above-described drawings.

Similarly, the contents (or may be part of the contents) described in each drawing of this embodiment mode can be freely applied to, combined with, or replaced with the contents (or may be part of the contents) described in a drawing in another embodiment mode. Further, even more drawings can be formed by combining each part with part of another embodiment mode in the drawings of this embodiment mode.

Note that this embodiment mode shows an example of an embodied case of the contents (or may be part of the contents) described in other embodiment modes, an example of slight transformation thereof, an example of partial modification thereof, an example of improvement thereof, an example of detailed description thereof, an application example thereof, an example of related part thereof, or the like. Therefore, the contents described in other embodiment modes can be freely applied to, combined with, or replaced with this embodiment mode.

This application is based on Japanese Patent Application serial no. 2007-133517 filed with Japan Patent Office on May 18, 2007, the entire contents of which are hereby incorporated by reference.

What is claimed is:

1. A semiconductor device comprising:
a first substrate comprising:
a controller circuit electrically connected to a power supply circuit which is configured to output a first potential, the entirety of the controller circuit being on the first substrate; and
a second substrate comprising:
a pixel portion comprising a first thin film transistor; and
a shift register circuit electrically connected to the power supply circuit and the controller circuit,
wherein the first potential is the highest potential in the controller circuit and in the shift register circuit,
wherein the controller circuit is configured to be supplied with the first potential and a ground potential,
wherein the controller circuit is configured to output a first signal to the shift register circuit,
wherein the shift register circuit is configured to be supplied with the first potential, the ground potential and the first signal, and
wherein the shift register circuit comprises a second thin film transistor.

2. The semiconductor device according to claim 1, wherein the first thin film transistor and the second thin film transistor are single-crystal thin film transistors.

3. The semiconductor device according to claim 1, wherein the difference between the first potential and the ground potential is 3V or less.

4. The semiconductor device according to claim 1, wherein the first substrate comprises the power supply circuit.

5. A semiconductor device comprising:
a first substrate comprising:
a controller circuit electrically connected to a power supply circuit which is configured to output a first potential, the entirety of the controller circuit being on the first substrate; and
a second substrate comprising:
a pixel portion comprising a first thin film transistor; and
a driver circuit electrically connected to the power supply circuit and the controller circuit,
wherein the controller circuit is configured to be supplied with the first potential and a ground potential,
wherein the controller circuit is configured to output a first signal to the driver circuit,
wherein the driver circuit is configured to supply a video signal to the pixel portion,
wherein the driver circuit comprises a shift register circuit configured to be supplied with the first potential, the ground potential and the first signal,
wherein the first potential is the highest potential in the controller circuit and in the shift register circuit, and
wherein the shift register circuit comprises a second thin film transistor.

6. The semiconductor device according to claim 5, wherein the driver circuit further comprises one selected from the group consisting of a level shifter circuit, a sampling circuit, a latch circuit, and a DA converter circuit.

7. The semiconductor device according to claim 5, wherein the first thin film transistor and the second thin film transistor are single-crystal thin film transistors.

8. The semiconductor device according to claim 5, wherein the difference between the first potential and the ground potential is 3V or less.

9. The semiconductor device according to claim 5, wherein the first substrate comprises the power supply circuit.

10. A semiconductor device comprising:
a first substrate comprising:
a controller circuit electrically connected to a power supply circuit which is configured to output a first potential, the entirety of the controller circuit being on the first substrate; and
a second substrate comprising:
a pixel portion comprising a first thin film transistor; and
a driver circuit electrically connected to the power supply circuit and the controller circuit,
wherein the controller circuit is configured to be supplied with the first potential and a ground potential,
wherein the controller circuit is configured to output a first signal to the driver circuit,
wherein the driver circuit is configured to supply a selection signal to the pixel portion,
wherein the driver circuit comprises a shift register circuit configured to be supplied with the first potential, the ground potential and the first signal, wherein the first potential is the highest potential in the controller circuit and in the shift register circuit, and wherein the shift register circuit comprises a second thin film transistor.

11. The semiconductor device according to claim 10, wherein the driver circuit further comprises one selected from the group consisting of a level shifter circuit and a buffer circuit.

12. The semiconductor device according to claim 10, wherein the first thin film transistor and the second thin film transistor are single-crystal thin film transistors.

13. The semiconductor device according to claim 10, wherein the difference between the first potential and the ground potential is 3V or less.

14. The semiconductor device according to claim 10, wherein the first substrate comprises the power supply circuit.

15. A semiconductor device comprising:
a first substrate comprising:
a controller circuit electrically connected to a power supply circuit which is configured to output a first potential, the entirety of the controller circuit being on the first substrate; and
a second substrate comprising:
a pixel portion comprising a first thin film transistor;
a driver circuit electrically connected to the power supply circuit and the controller circuit, and configured to supply a video signal to the pixel portion; and
a dc-dc converter circuit electrically connected to the power supply circuit, and configured to be supplied with the first potential and supply a second potential higher than the first potential to the driver circuit,
wherein the controller circuit is configured to be supplied with the first potential and a ground potential,
wherein the controller circuit is configured to output a first signal to the driver circuit,
wherein the driver circuit comprises a shift register circuit configured to be supplied with the first potential, the ground potential and the first signal,
wherein the first potential is the highest potential in the controller circuit and in the shift register circuit,
wherein the shift register circuit comprises a second thin film transistor, and
wherein the dc-dc converter circuit comprises a third thin film transistor.

16. The semiconductor device according to claim 15, wherein the driver circuit further comprises one selected from the group consisting of a level shifter circuit, a sampling circuit, a latch circuit, and a DA converter circuit.

17. The semiconductor device according to claim 15, wherein the first thin film transistor, the second thin film transistor and the third thin film transistor are single-crystal thin film transistors.

18. The semiconductor device according to claim 15, wherein the difference between the first potential and the ground potential is 3V or less.

19. The semiconductor device according to claim 15, wherein the first substrate comprises the power supply circuit.

20. A semiconductor device comprising:
a first substrate comprising:
a controller circuit electrically connected to a power supply circuit which is configured to output a first potential, the entirety of the controller circuit being on the first substrate; and
a second substrate comprising:
a pixel portion comprising a first thin film transistor;
a driver circuit electrically connected to the power supply circuit and the controller circuit, and configured to supply a selection signal to the pixel portion; and
a dc-dc converter circuit electrically connected to the power supply circuit, and configured to be supplied with the first potential and supply a second potential higher than the first potential to the driver circuit,
wherein the controller circuit is configured to be supplied with the first potential and a ground potential,
wherein the controller circuit is configured output a first signal,
wherein the driver circuit comprises a shift register circuit configured to be supplied with the first potential, the ground potential and the first signal,
wherein the first potential is the highest potential in the controller circuit and in the shift register circuit,
wherein the shift register circuit comprises a second thin film transistor, and
wherein the dc-dc converter circuit comprises a third thin film transistor.

21. The semiconductor device according to claim 20, wherein the driver circuit further comprises one selected from the group consisting of a level shifter circuit and a buffer circuit.

22. The semiconductor device according to claim 20, wherein the first thin film transistor, the second thin film transistor and the third thin film transistor are single-crystal thin film transistors.

23. The semiconductor device according to claim 20, wherein the difference between the first potential and the ground potential is 3V or less.

24. The semiconductor device according to claim 20, wherein the first substrate comprises the power supply circuit.

* * * * *

UNITED STATES PATENT AND TRADEMARK OFFICE
CERTIFICATE OF CORRECTION

| | |
|---|---|
| PATENT NO. | : 8,803,781 B2 |
| APPLICATION NO. | : 12/055055 |
| DATED | : August 12, 2014 |
| INVENTOR(S) | : Hajime Kimura and Atsushi Umezaki |

It is certified that error appears in the above-identified patent and that said Letters Patent is hereby corrected as shown below:

In the Specification

Column 1, line 60, after "substrate" insert --.--;

Column 2, line 19, after "aspect" delete ",";

Column 2, line 21, replace "trim" with --thin--;

Column 3, line 3, after "(DMD)" insert --.--;

Column 3, line 67, after "circuit" insert --,--;

Column 5, line 7, replace "election" with --electron--;

Column 5, line 37, after "crystal" insert --:--;

Column 6, line 49, replace "mat" with --that--;

Column 7, line 17, replace "perforating" with --performing--;

Column 7, line 20, after "substrate" insert --.--;

Column 7, line 37, after "light" insert --.--;

Column 7, line 60-61, after "temperature" insert --.--;

Column 8, line 27, after "flow" insert --.--;

Column 9, line 22, after "reliability" insert --.--;

Column 9, line 51, replace "winch" with --which--;

Column 10, line 20, after "substrate" insert --.--;

Column 10, line 40, replace "mat" with --that--;

Column 11, line 9, after "electrodes" insert --.--;

Column 11, line 19, replace "die" with --the--;

Column 11, line 29, replace "man" with --than--;

Column 11, line 59, replace "dram" with --drain--;

Column 12, line 8, replace "mat" with --that--;

Signed and Sealed this
Twenty-ninth Day of September, 2015

Michelle K. Lee
*Director of the United States Patent and Trademark Office*

CERTIFICATE OF CORRECTION (continued)
U.S. Pat. No. 8,803,781 B2

Column 12, line 21, replace "m" with --in--;

Column 12, line 35, replace both "agate" with --a gate--;

Column 12, line 43, after "electrode" insert --.--;

Column 12, line 50, replace "gale" with --gate--;

Column 12, line 61, replace "winch" with --which--;

Column 14, line 49, after "element" insert --,--;

Column 15, line 51, after "A" insert --.--;

Column 18, line 66, replace "winch" with --which--;

Column 19, line 51, replace "oilier" with --other--;

Column 20, line 15, after "5 V." replace "." with --,--;

Column 21, line 24, replace "tamed" with --turned--;

Column 21, line 43, replace "shiner" with --shifter--;

Column 21, line 50, after "Note" delete ",";

Column 23, line 14, after "used" insert --.--;

Column 23, line 25, after "reduced" insert --.--;

Column 24, line 3, replace "tins" with --this--;

Column 24, line 16, replace "tins" with --this--;

Column 24, line 55, after "example" insert --.--;

Column 25, line 50, replace "show's" with --shows--;

Column 26, line 20, replace "off" with --of--;

Column 26, line 34, after "described" insert --.--;

Column 26, line 67, after "used" insert --.--;

Column 28, line 15, after "thereof" insert --,--;

Column 29, line 29, replace "man" with --than--;

Column 33, line 3, replace "m" with --in--;

Column 33, line 20, replace "die" with --the--;

Column 35, line 15, replace "$H_3$" with --$H_5$--;

Column 36, line 2, replace "tills" with --this--;

Column 39, line 67, replace "die" with --the--;

Column 40, line 14, replace "die" with --the--;

Column 40, line 62, after ")" replace ":" with --;--;

Column 41, line 22, replace "tune" with --time--;

Column 41, line 22, replace "Field" with --field--;

Column 41, line 57, after "function" replace ":" with --;--;

Column 44, line 1, after "portion" insert --.--;

Column 45, line 25, replace "tune" with --time--;

In the Claims

Column 47, line 62, in claim 1, after "is" insert --configured to be--;

Column 48, line 33, in claim 5, after "is" insert --configured to be--;

Column 49, line 1, in claim 10, after "is" insert --configured to be--;

Column 49, line 41, in claim 15, after "is" insert --configured to be--; and

Column 50, line 31, in claim 20, after "is" insert --configured to be--.